United States Patent
Vetury et al.

(10) Patent No.: US 11,165,404 B2
(45) Date of Patent: *Nov. 2, 2021

(54) METHOD FOR FABRICATING AN ACOUSTIC RESONATOR DEVICE WITH PERIMETER STRUCTURES

(71) Applicant: Akoustis, Inc., Huntersville, NC (US)

(72) Inventors: Ramakrishna Vetury, Charlotte, NC (US); Alexander Y. Feldman, Huntersville, NC (US); Michael D. Hodge, Belmont, NC (US); Art Geiss, Greensboro, NC (US); Shawn R. Gibb, Huntersville, NC (US); Mark D. Boomgarden, Huntersville, NC (US); Michael P. Lewis, Charlotte, NC (US); Pinal Patel, Charlotte, NC (US); Jeffrey B. Shealy, Cornelius, NC (US)

(73) Assignee: Akoustis, Inc., Huntersville, NC (US)

( * ) Notice: Subject to any disclaimer, the term of this patent is extended or adjusted under 35 U.S.C. 154(b) by 247 days.

This patent is subject to a terminal disclaimer.

(21) Appl. No.: 16/136,158

(22) Filed: Sep. 19, 2018

(65) Prior Publication Data

US 2019/0020325 A1    Jan. 17, 2019

Related U.S. Application Data

(63) Continuation of application No. 15/342,061, filed on Nov. 2, 2016, now Pat. No. 10,110,189, which is a (Continued)

(51) Int. Cl.
*H04R 17/00*    (2006.01)
*H03H 3/02*    (2006.01)
(Continued)

(52) U.S. Cl.
CPC ........... *H03H 3/02* (2013.01); *H03H 3/04* (2013.01); *H03H 9/02118* (2013.01);
(Continued)

(58) Field of Classification Search
CPC ........ H03H 3/02; H03H 3/04; H03H 9/02118; H03H 9/0514; H03H 9/131; H03H 9/132;
(Continued)

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| JP | 2009100197 A | 5/2009 |
| JP | 2010-068109 A | 3/2010 |

(Continued)

OTHER PUBLICATIONS

International Search Report and Written Opinion for PCT/US2018/050521 dated Jan. 28, 2019.
(Continued)

*Primary Examiner* — Paul D Kim
(74) *Attorney, Agent, or Firm* — Richard T. Ogawa; Ogawa P.C.

(57) ABSTRACT

A method of manufacture for an acoustic resonator or filter device. In an example, the present method can include forming metal electrodes with different geometric areas and profile shapes coupled to a piezoelectric layer overlying a substrate. These metal electrodes can also be formed within cavities of the piezoelectric layer or the substrate with varying geometric areas. Combined with specific dimensional ratios and ion implantations, such techniques can increase device performance metrics. In an example, the present method can include forming various types of perim-
(Continued)

eter structures surrounding the metal electrodes, which can be on top or bottom of the piezoelectric layer. These perimeter structures can use various combinations of modifications to shape, material, and continuity. These perimeter structures can also be combined with sandbar structures, piezoelectric layer cavities, the geometric variations previously discussed to improve device performance metrics.

11 Claims, 57 Drawing Sheets

Related U.S. Application Data continuation of application No. 15/341,218, filed on Nov. 2, 2016, now Pat. No. 10,110,190.

(51) Int. Cl.
| | |
|---|---|
| *H03H 9/02* | (2006.01) |
| *H03H 9/05* | (2006.01) |
| *H03H 9/10* | (2006.01) |
| *H03H 9/13* | (2006.01) |
| *H03H 9/56* | (2006.01) |
| *H03H 3/04* | (2006.01) |
| *H03H 9/17* | (2006.01) |

(52) U.S. Cl.
CPC ........ *H03H 9/0514* (2013.01); *H03H 9/1035* (2013.01); *H03H 9/131* (2013.01); *H03H 9/132* (2013.01); *H03H 9/133* (2013.01); *H03H 9/171* (2013.01); *H03H 9/174* (2013.01); *H03H 9/564* (2013.01); *H03H 9/568* (2013.01); H03H 2003/0414 (2013.01); H03H 2003/0428 (2013.01)

(58) Field of Classification Search
CPC ........ H03H 9/133; H03H 9/171; H03H 9/174; H03H 9/564; H03H 9/568; H03H 9/1035; H03H 2003/0414; H03H 2003/0428
See application file for complete search history.

(56) References Cited

U.S. PATENT DOCUMENTS

| | | |
|---|---|---|
| 6,051,907 A | 4/2000 | Ylilammi |
| 6,114,635 A | 9/2000 | Lakin et al. |
| 6,262,637 B1 | 7/2001 | Bradley et al. |
| 6,377,137 B1 | 4/2002 | Ruby |
| 6,384,697 B1 | 5/2002 | Ruby |
| 6,472,954 B1 | 10/2002 | Ruby et al. |
| 6,617,060 B2 | 9/2003 | Weeks, Jr. et al. |
| 6,812,619 B1 | 11/2004 | Kaitila et al. |
| 6,841,922 B2 | 1/2005 | Aigner et al. |
| 6,864,619 B2 | 3/2005 | Aigner et al. |
| 6,879,224 B2 | 4/2005 | Frank |
| 6,909,340 B2 | 6/2005 | Aigner et al. |
| 6,933,807 B2 | 8/2005 | Marksteiner et al. |
| 7,112,860 B2 | 9/2006 | Saxler |
| 7,250,360 B2 | 7/2007 | Shealy et al. |
| 7,268,436 B2 | 9/2007 | Aigner et al. |
| 7,365,619 B2 | 4/2008 | Aigner et al. |
| 7,514,759 B1 | 4/2009 | Mehta et al. |
| 7,875,910 B2 | 1/2011 | Sheppard et al. |
| 7,982,363 B2 | 7/2011 | Chitnis |
| 8,304,271 B2 | 11/2012 | Huang et al. |
| 10,110,188 B2 * | 10/2018 | Vetury .................... H03H 3/02 |
| 2005/0255234 A1 | 11/2005 | Kanda et al. |
| 2008/0284541 A1 | 11/2008 | Chitnis |
| 2009/0033177 A1 | 2/2009 | Itaya et al. |
| 2011/0114968 A1 | 5/2011 | Sheppard et al. |
| 2012/0287575 A1 | 11/2012 | Nelson |
| 2016/0028367 A1 | 1/2016 | Shealy |
| 2016/0036580 A1 | 2/2016 | Shealy |
| 2018/0123540 A1 * | 5/2018 | Vetury ................... H03H 9/171 |
| 2019/0020324 A1 * | 1/2019 | Vetury ................... H03H 9/568 |
| 2019/0036504 A1 * | 1/2019 | Vetury ............... H03H 9/02118 |
| 2019/0190479 A1 * | 6/2019 | Vetury ................. H03H 9/1035 |

FOREIGN PATENT DOCUMENTS

| | | |
|---|---|---|
| WO | 2005034349 A1 | 4/2005 |
| WO | 2016122877 A1 | 8/2016 |

OTHER PUBLICATIONS

International Search Report for PCT/US2015/034560, dated Sep. 18, 2015.

* cited by examiner

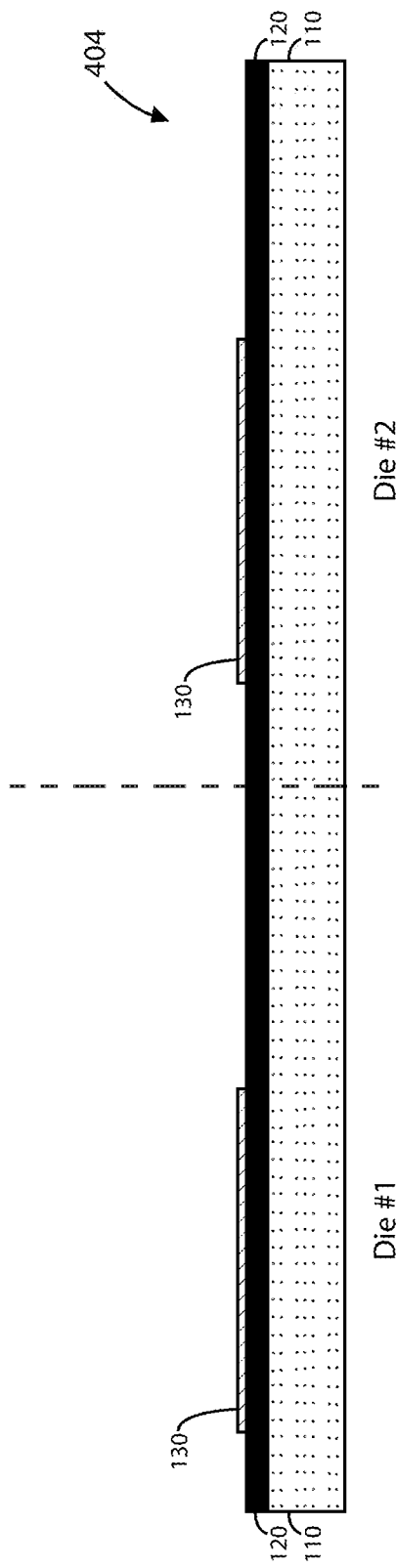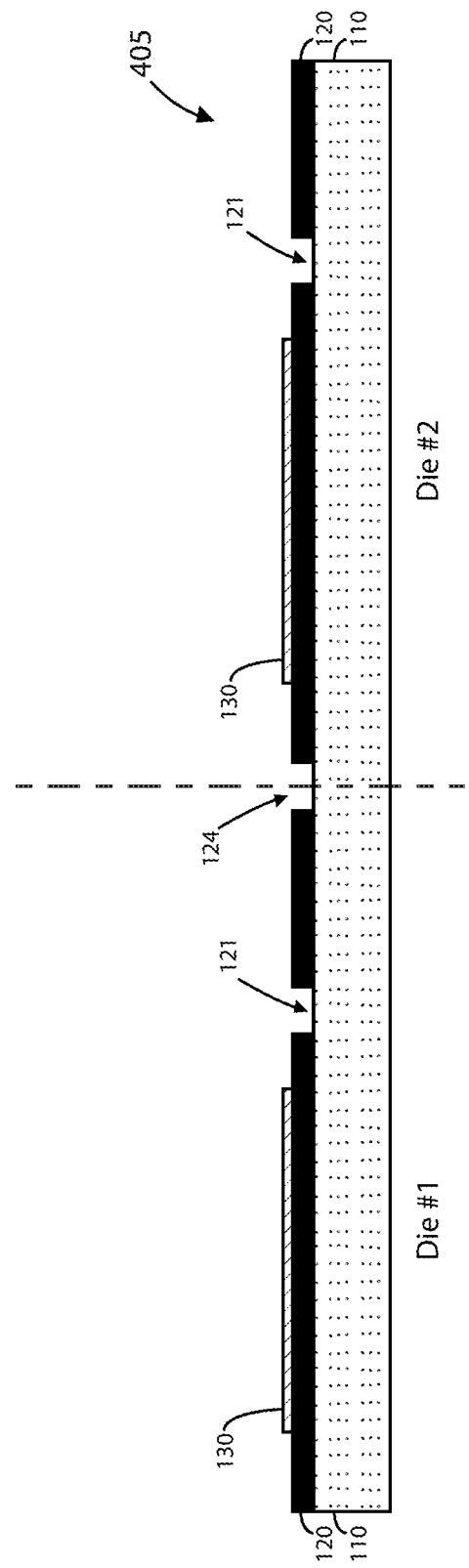

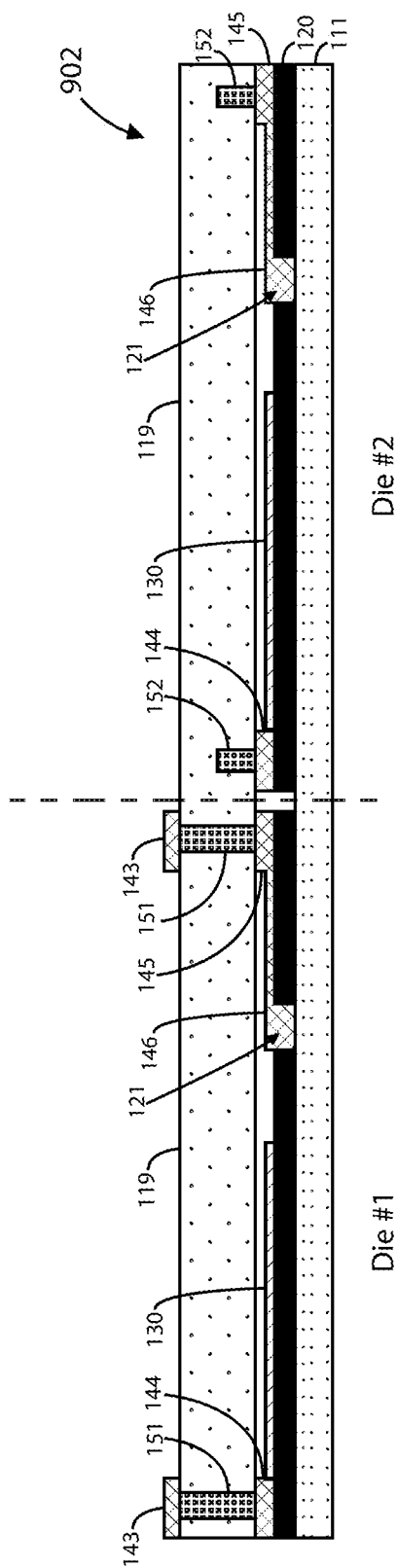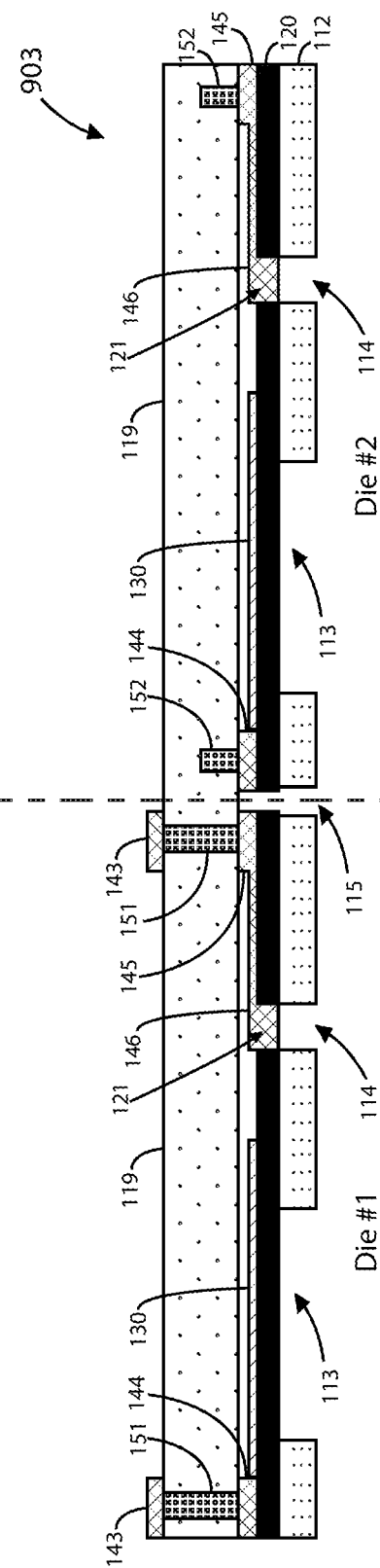

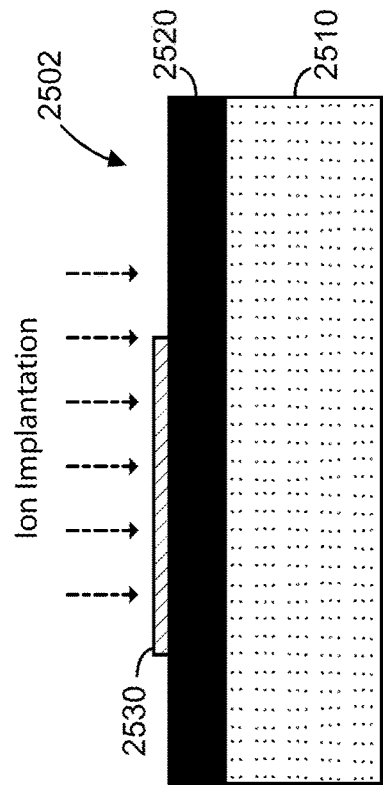
FIG.25A
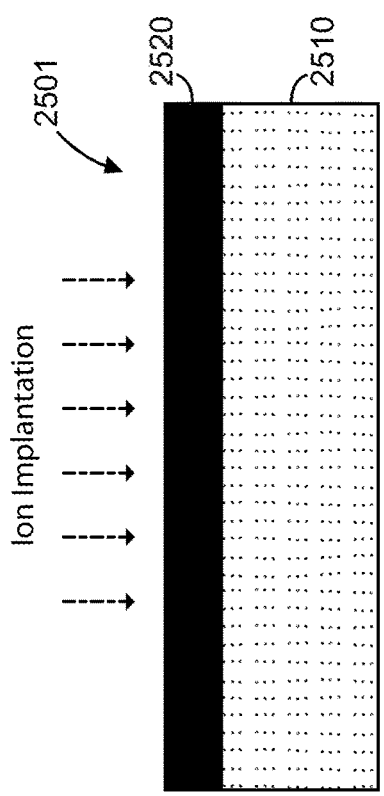
FIG.25B
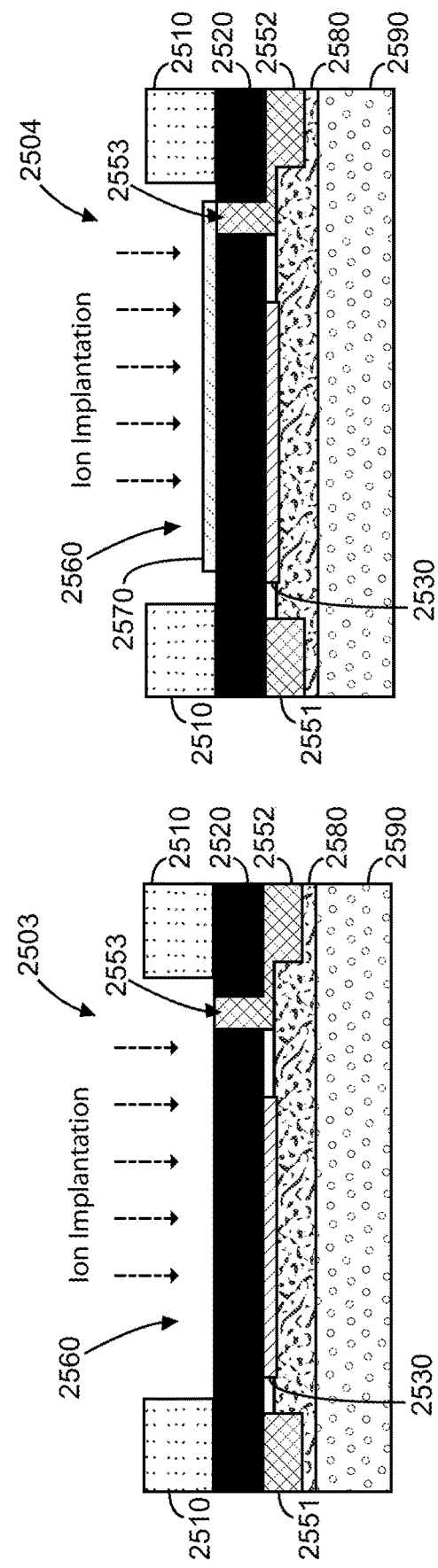
FIG.25C
FIG.25D

METHOD FOR FABRICATING AN ACOUSTIC RESONATOR DEVICE WITH PERIMETER STRUCTURES

CROSS-REFERENCES TO RELATED APPLICATIONS

The present application claims priority to and is a continuation of U.S. patent application Ser. No. 15/342,061 filed Nov. 2, 2016, now U.S. Pat. No. 10,110,189, which is a continuation application of U.S. patent application Ser. No. 15/341,218 filed Nov. 2, 2016, now U.S. Pat. No. 10,110,190. The present application also incorporates by reference, for all purposes, the following concurrently filed patent applications, all commonly owned: U.S. patent application Ser. No. 14/298,057 filed Jun. 2, 2014, U.S. patent application Ser. No. 14/298,076 filed Jun. 2, 2014, U.S. patent application Ser. No. 14/298,100 filed Jun. 2, 2014, U.S. patent application Ser. No. 14/341,314 filed Jul. 25, 2014, U.S. patent application Ser. No. 14/449,001 filed Jul. 31, 2014, U.S. patent application Ser. No. 14/469,503 filed Aug. 26, 2014, and U.S. patent application Ser. No. 15/068,510 filed Mar. 11, 2016.

BACKGROUND OF THE INVENTION

The present invention relates generally to electronic devices. More particularly, the present invention provides techniques related to a method of manufacture for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to a single crystal acoustic resonator or filter using wafer level technologies. Merely by way of example, the invention has been applied to a resonator device for a communication device, mobile device, computing device, among others.

In an example, the present method provides a method of manufacture for an acoustic resonator or filter device using device layers and cavities with varying geometric areas. Specifically, the present method can include forming metal electrodes with different geometric areas and profile shapes coupled to a piezoelectric layer overlying a substrate. These metal electrodes can also be formed within cavities of the piezoelectric layer or the substrate with varying geometric areas. Combined with specific dimensional ratios and ion implantations, such techniques can increase device performance metrics.

In an example, the present method provides a method of manufacture for an acoustic resonator or filter device using perimeter structures configured near electrodes. In an example, the present method can include forming various types of perimeter structures surrounding one or more metal electrodes, which can be formed on top or bottom of the piezoelectric layer. These perimeter structures can use various combinations of modifications to shape, material, and continuity. These perimeter structures can also be combined with sandbar structures, piezoelectric layer cavities, the geometric variations previously discussed to improve device performance metrics.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an example of the present invention.

FIGS. 25A through 25D are simplified diagrams illustrating cross-sectional views of a an acoustic resonator device subjected to an ion implantation process according to an example of the present invention.

DETAILED DESCRIPTION OF THE INVENTION

According to the present invention, techniques generally related to electronic devices are provided. More particularly, the present invention provides techniques related to a single crystal acoustic resonator using wafer level technologies. Merely by way of example, the invention has been applied to a resonator device for a communication device, mobile device, computing device, among others.

Figure 1A:
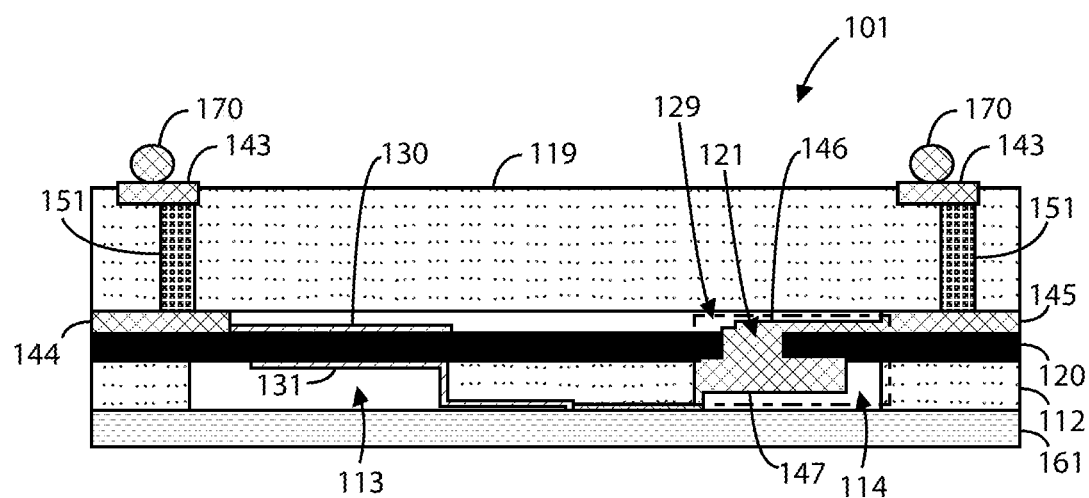
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
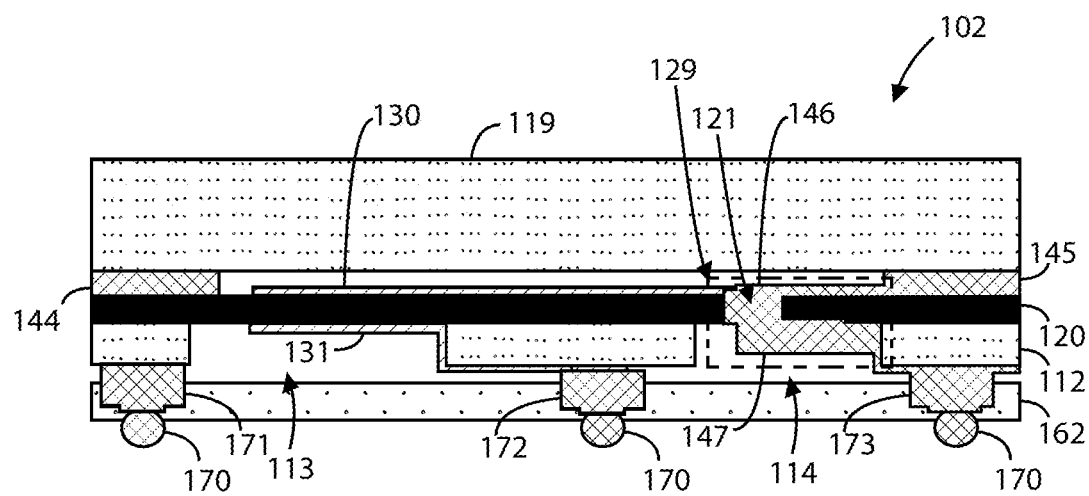
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
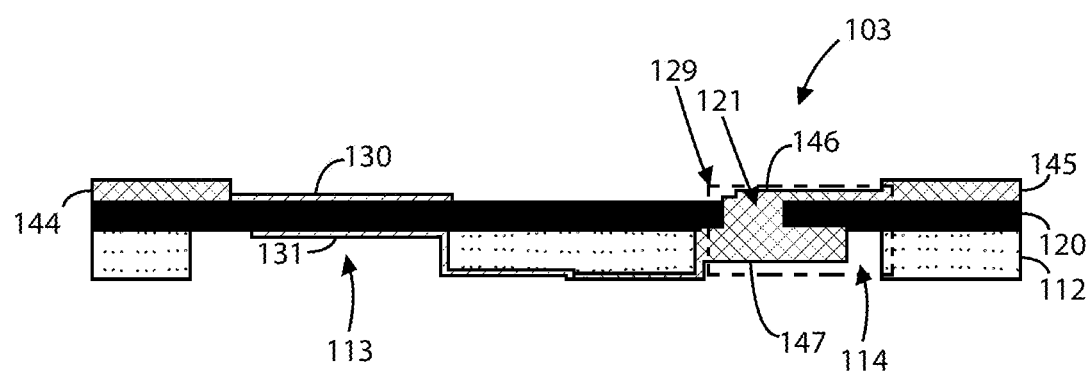
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
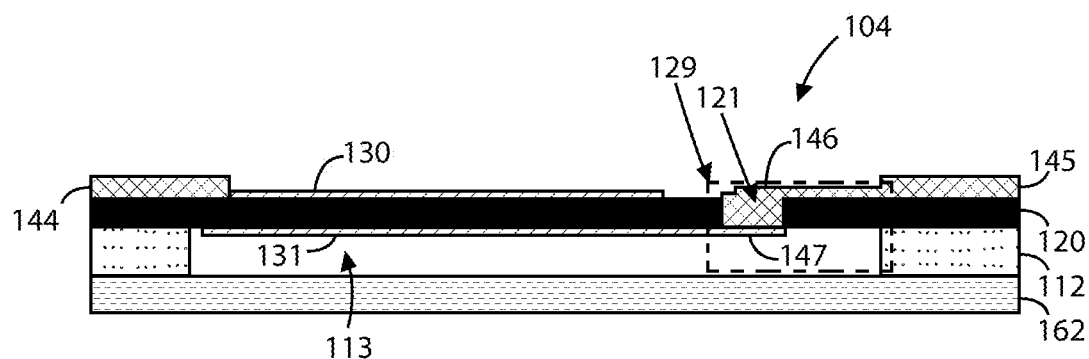
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
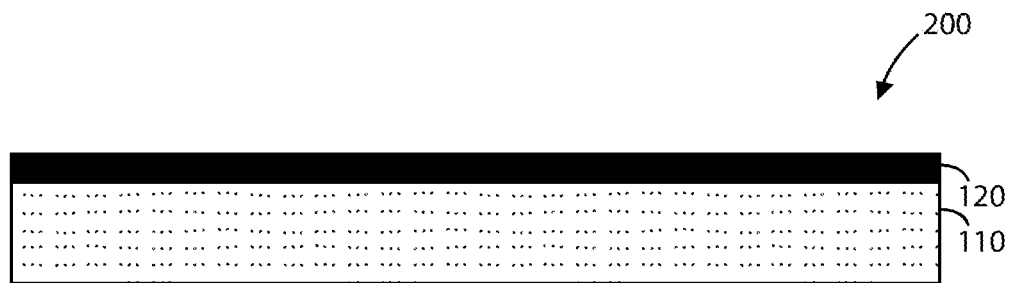
FIGS. 2 and 3 are simplified diagrams illustrating steps for a method of manufacture for an acoustic resonator device according to an example of the present invention.
Figure 3:
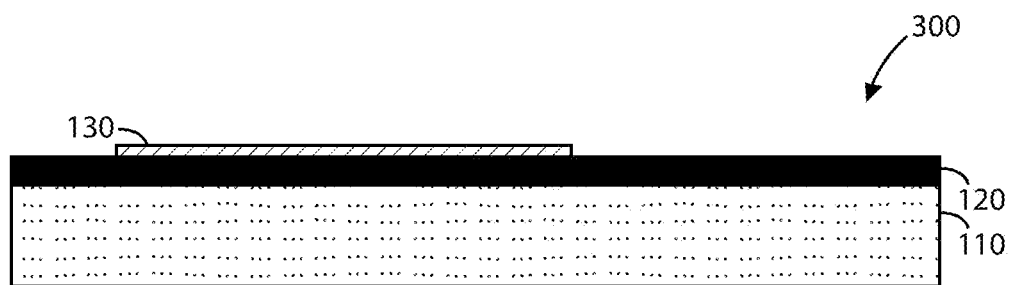

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
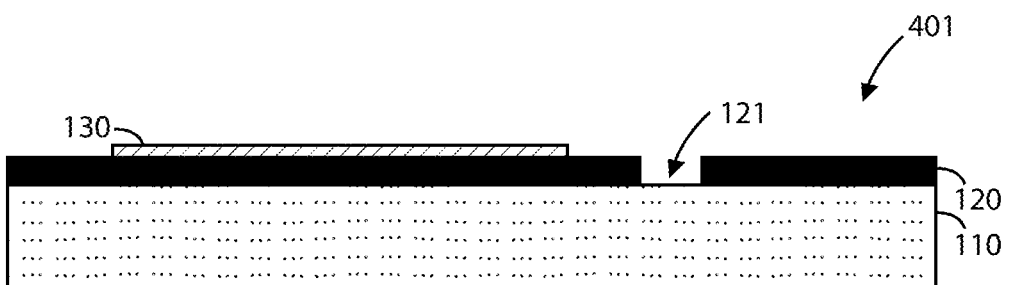
FIG. 4A is a simplified diagram illustrating a step for a method creating a topside micro-trench according to an example of the present invention.
Figure 4B:
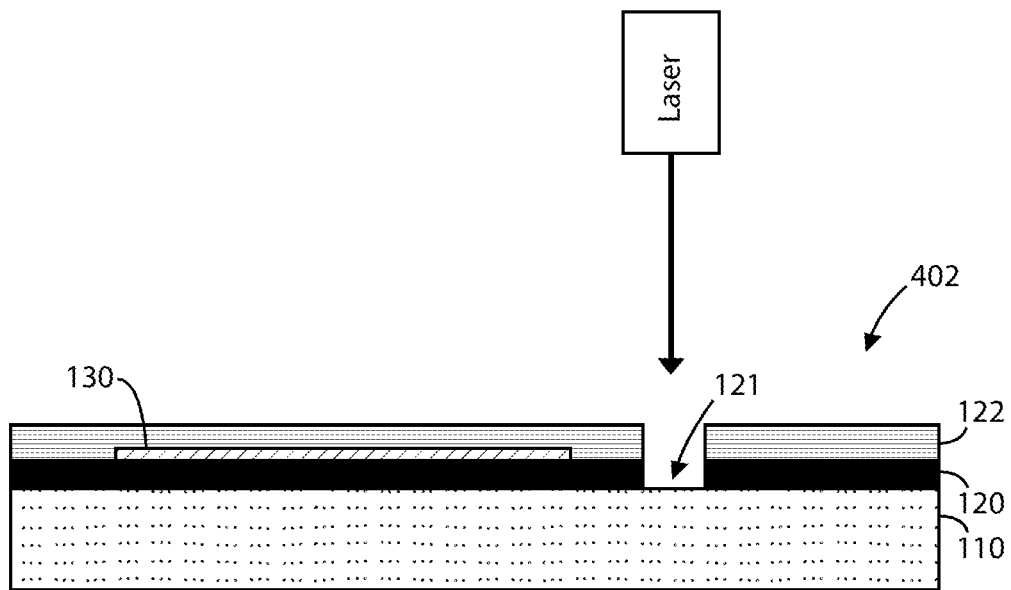
FIGS. 4B and 4C are simplified diagrams illustrating alternative methods for conducting the method step of forming a topside micro-trench as described in FIG. 4A.
Figure 4C:
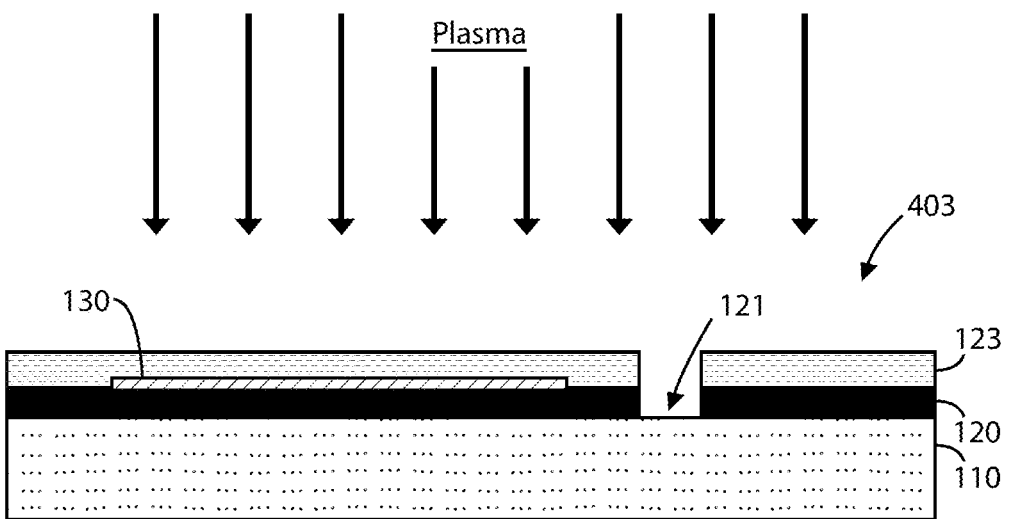

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
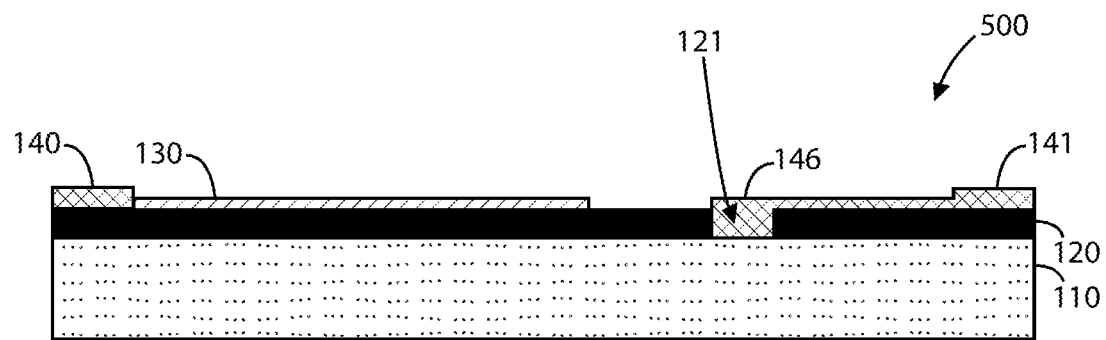
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
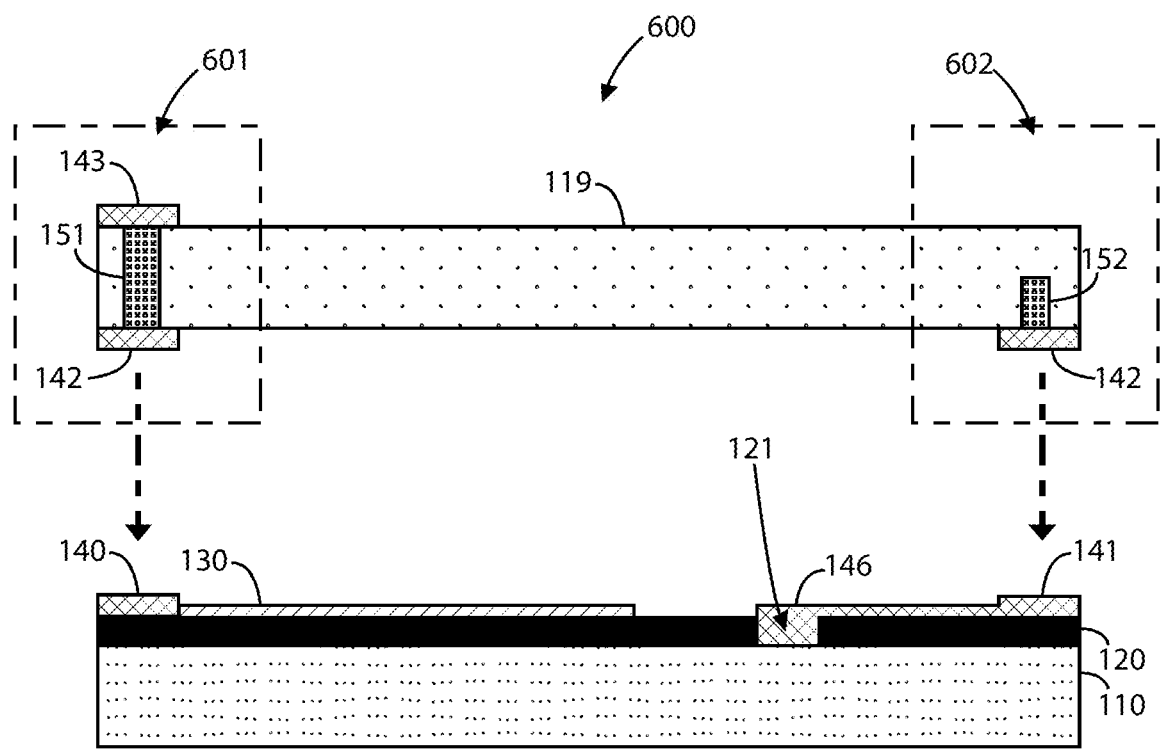

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
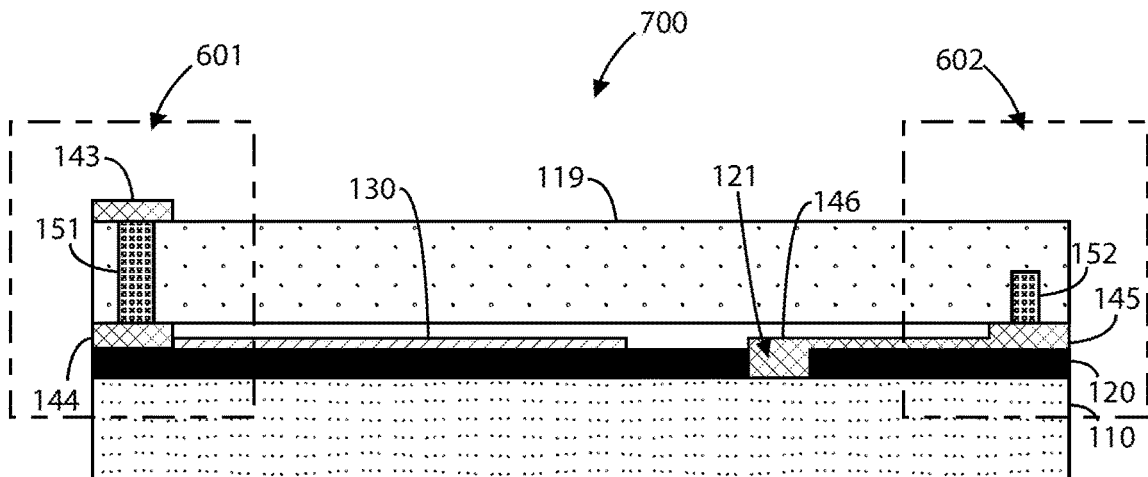
Figure 8:
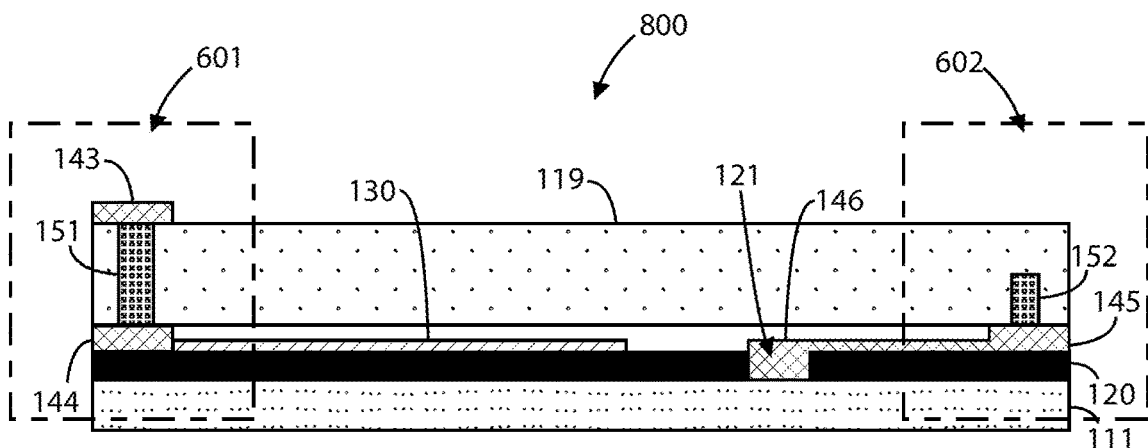

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
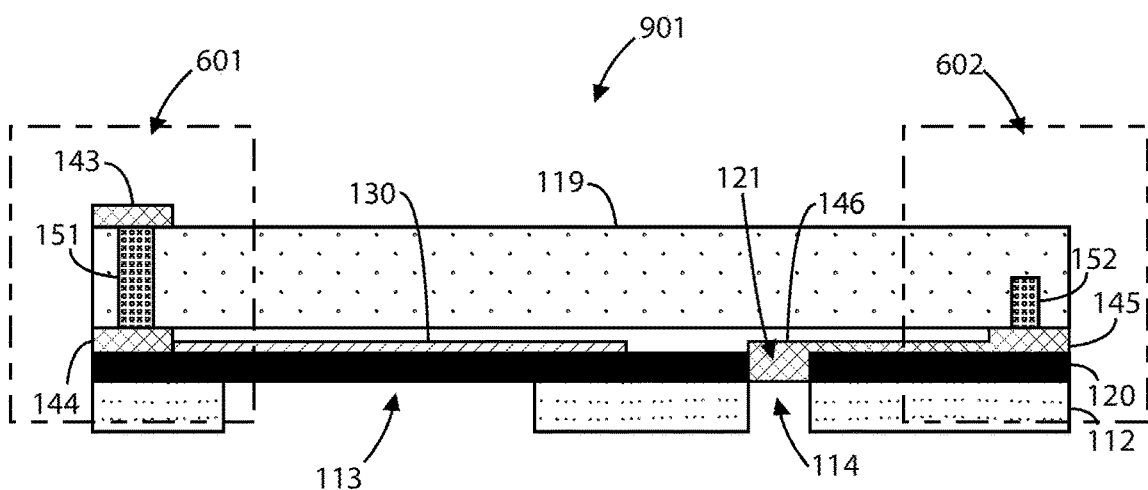
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
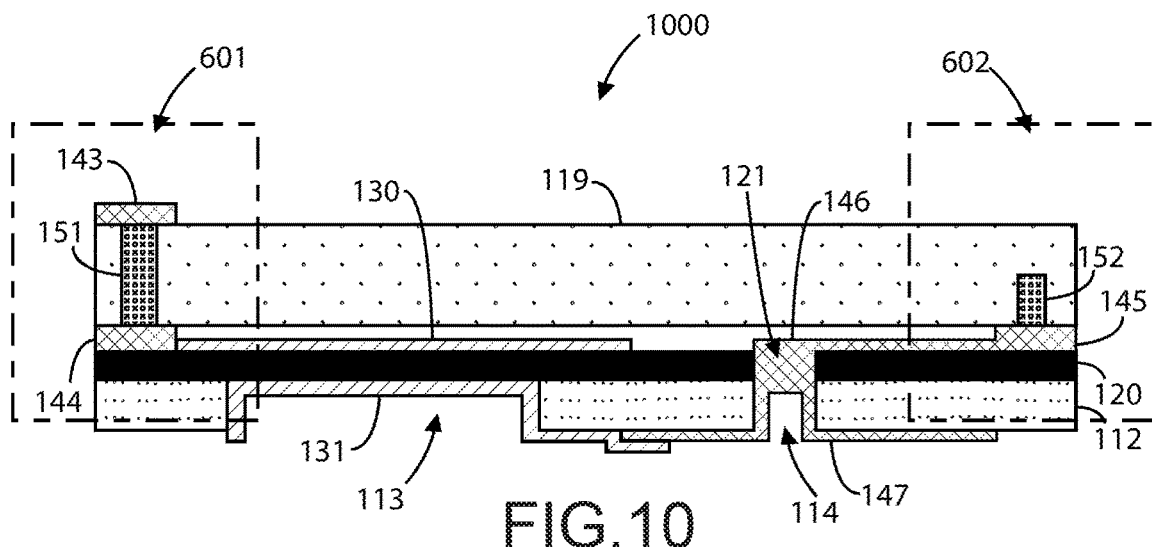
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
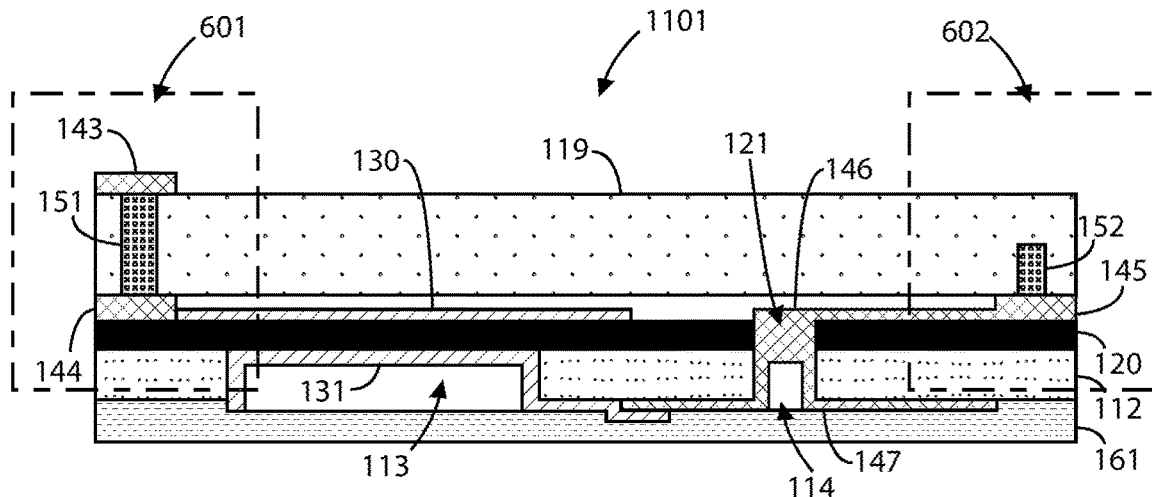
FIGS. 11A and 11B are simplified diagrams illustrating alternative steps for a method of manufacture for an acoustic resonator device according to an example of the present invention.
Figure 11B:
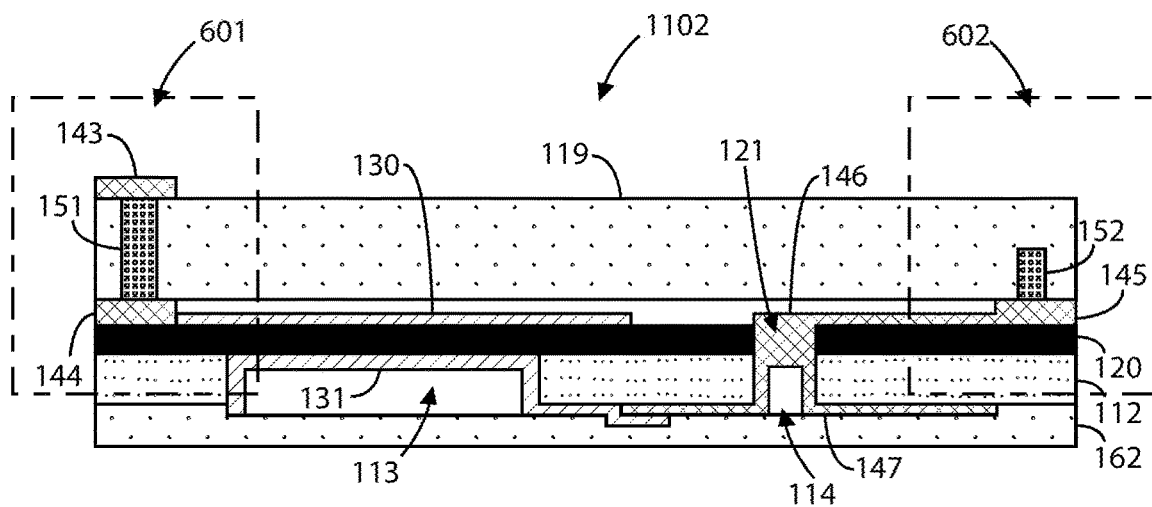

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
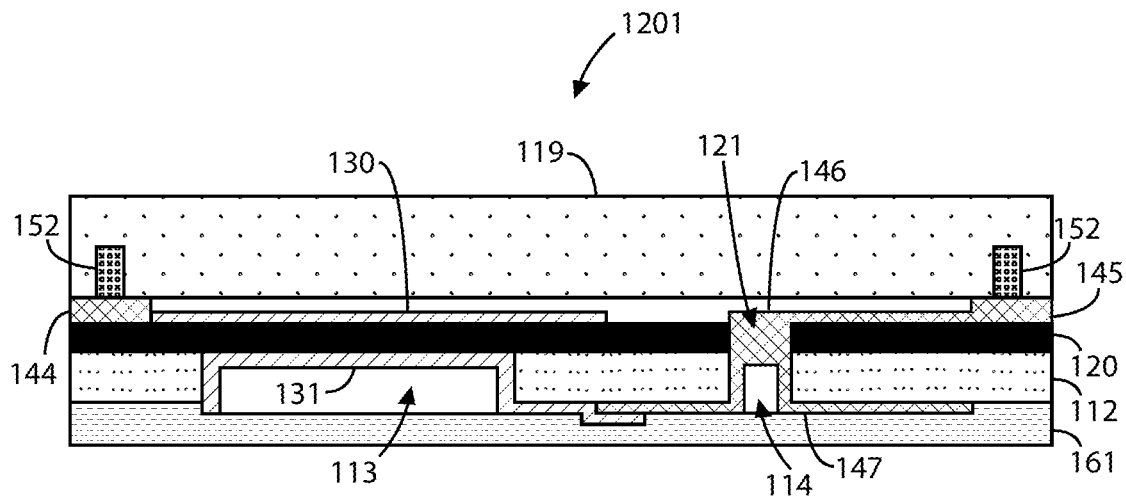
FIGS. 12A to 12E are simplified diagrams illustrating steps for a method of manufacture for an acoustic resonator device using a blind via interposer according to an example of the present invention.
Figure 12B:
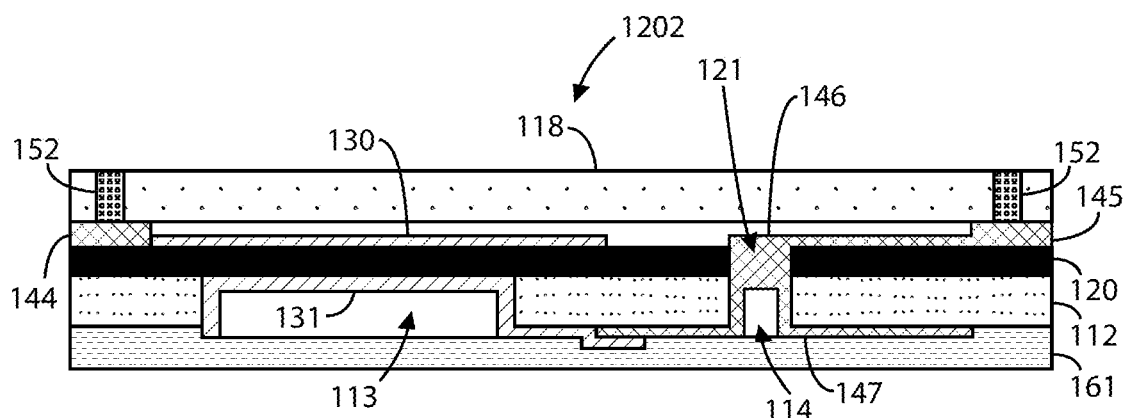
Figure 12C:
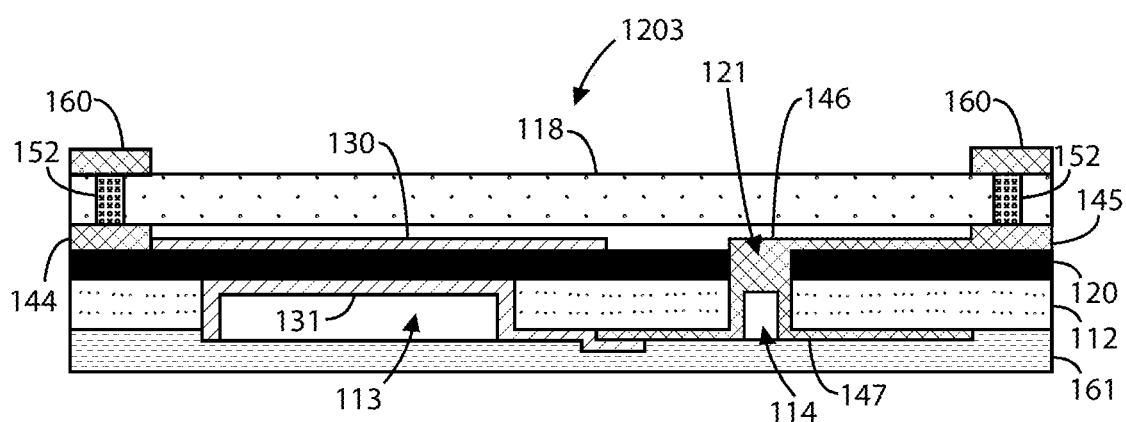
Figure 12D:
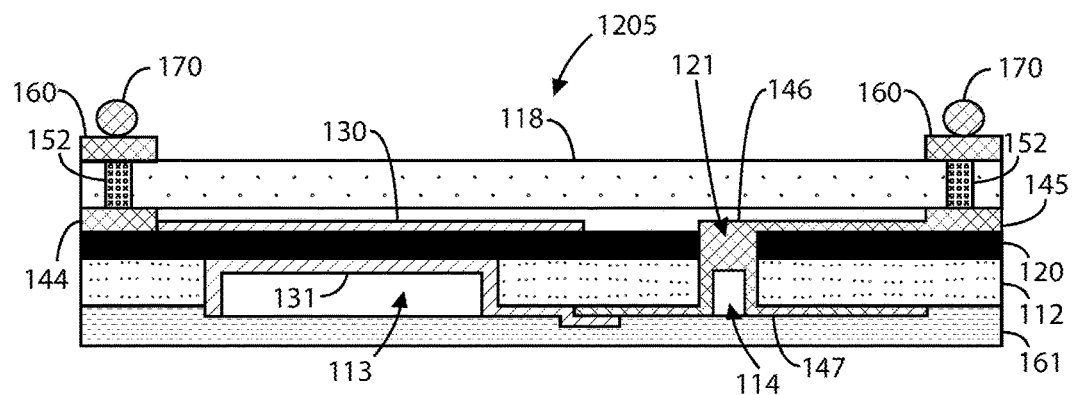
Figure 12E:
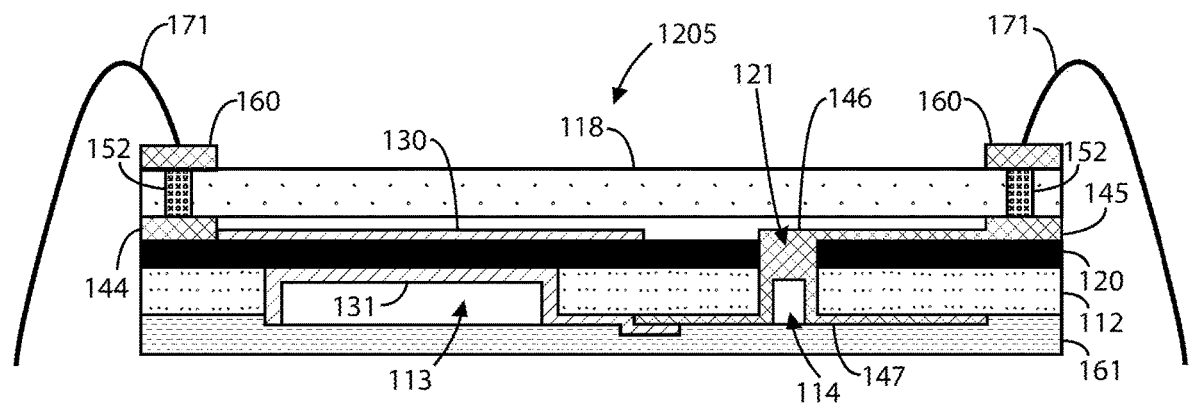

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
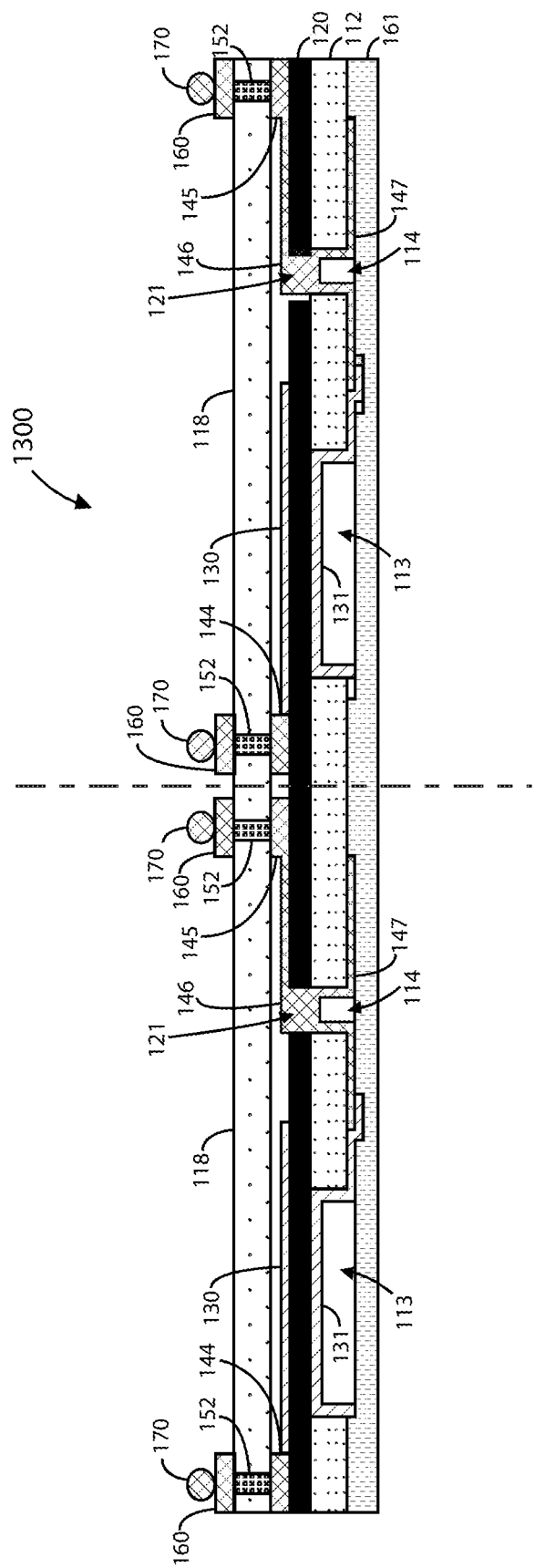
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
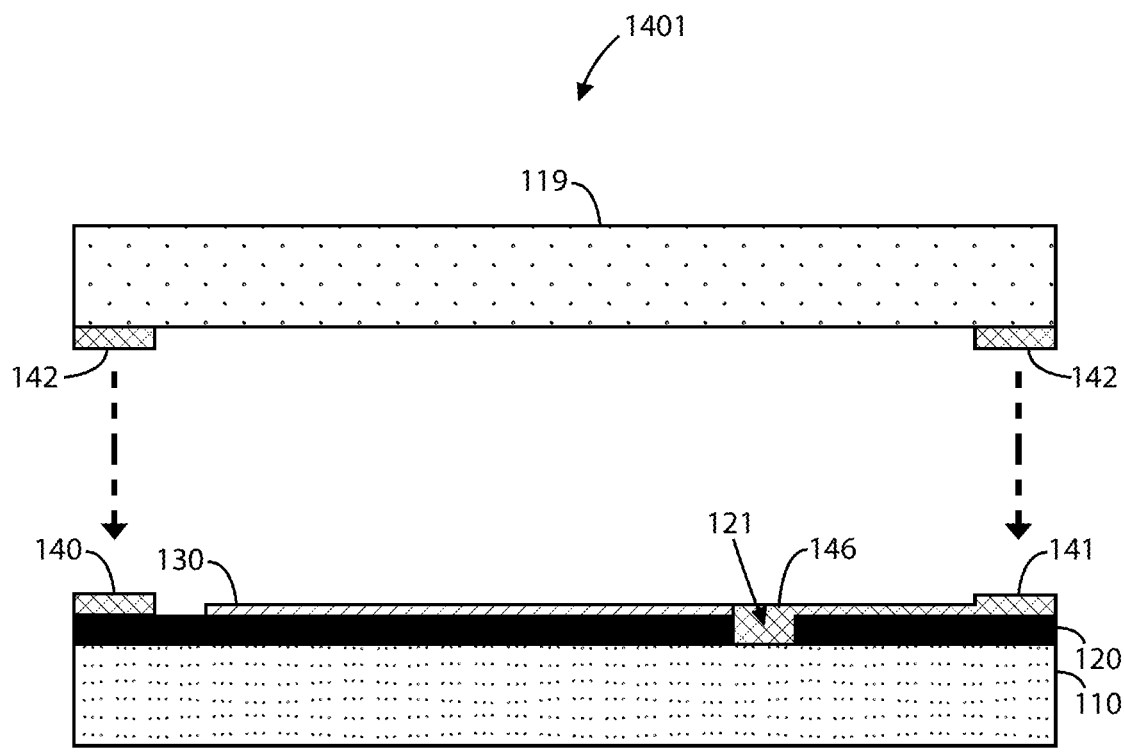
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
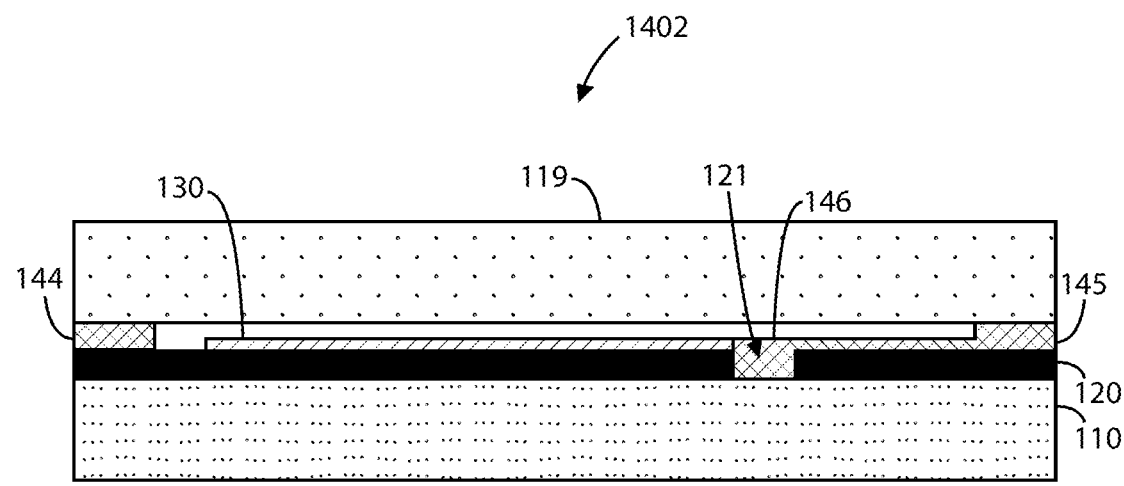
Figure 14C:
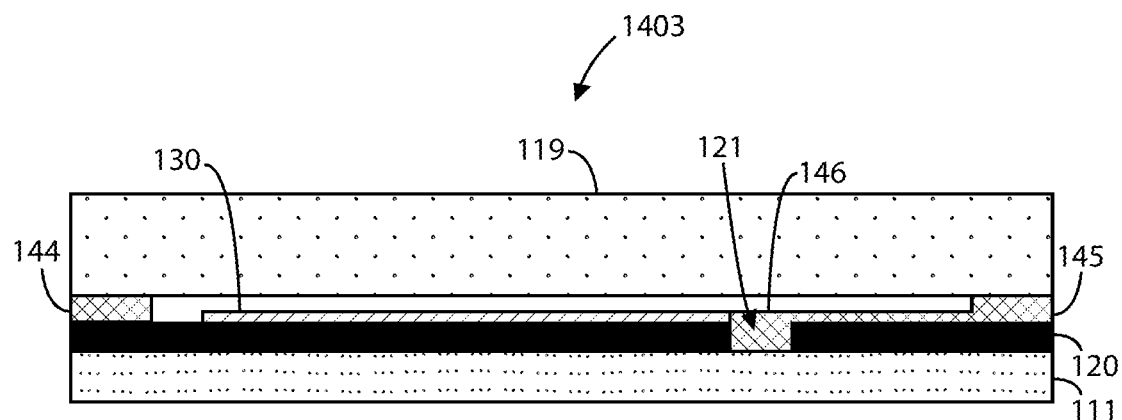
Figure 14D:
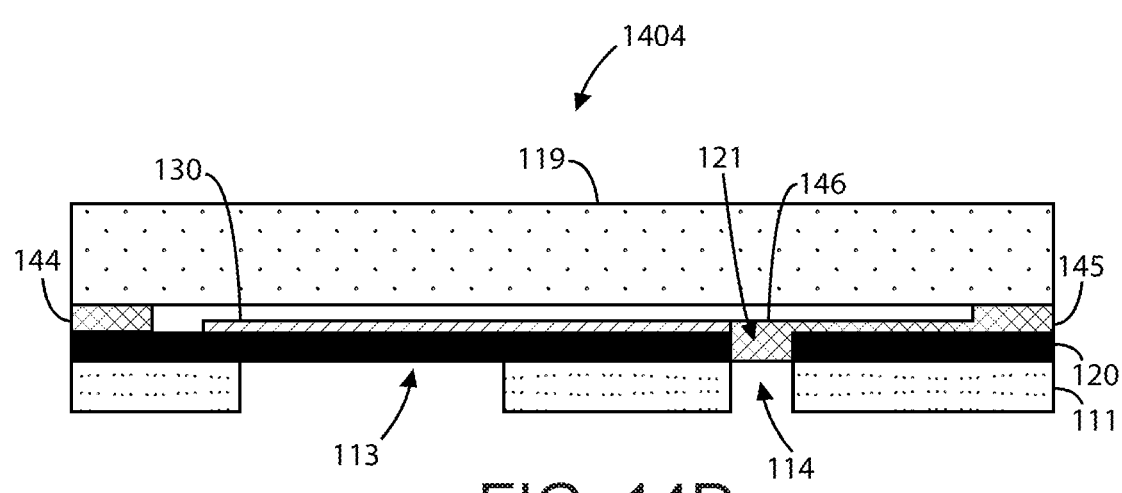
Figure 14E:
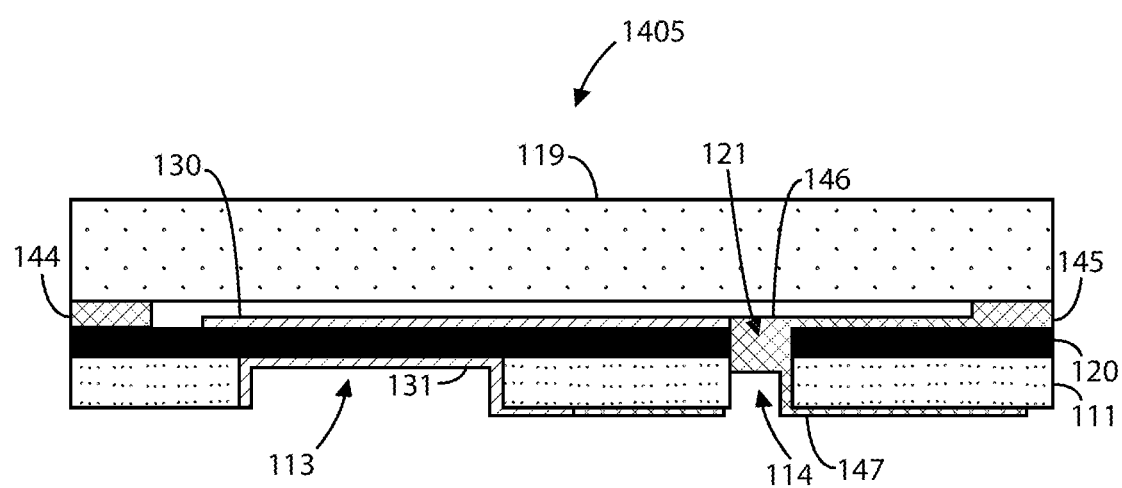
Figure 14F:
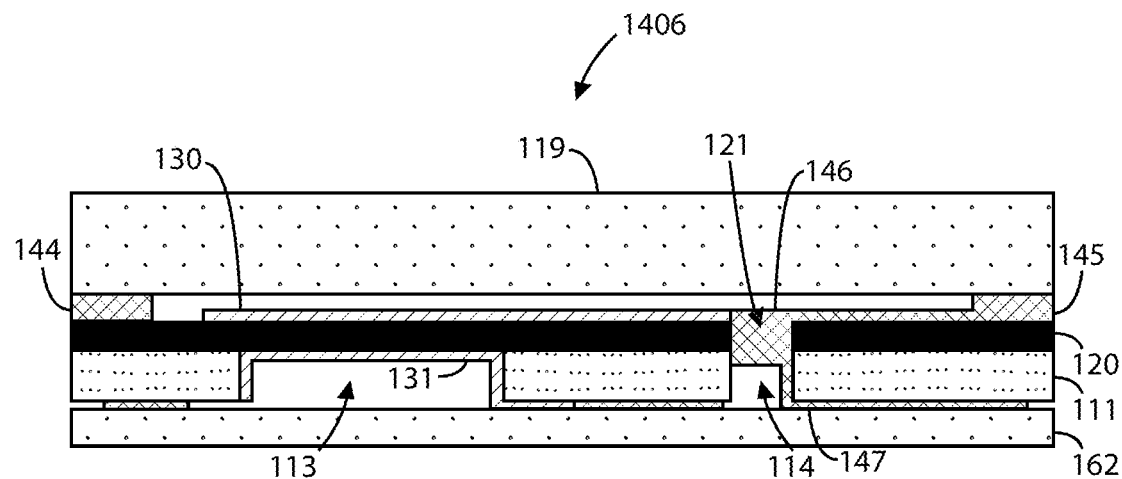

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
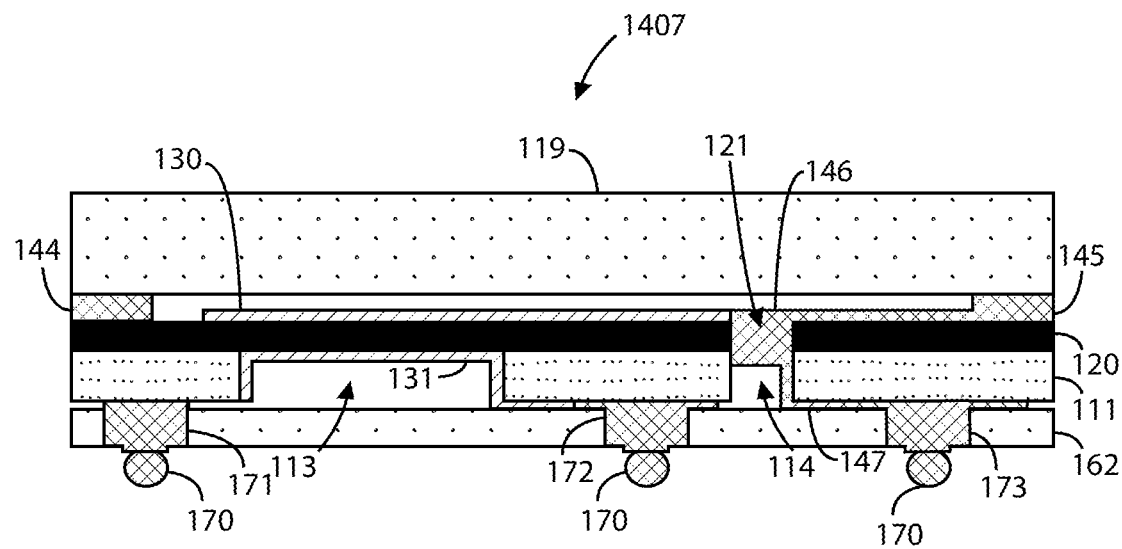

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
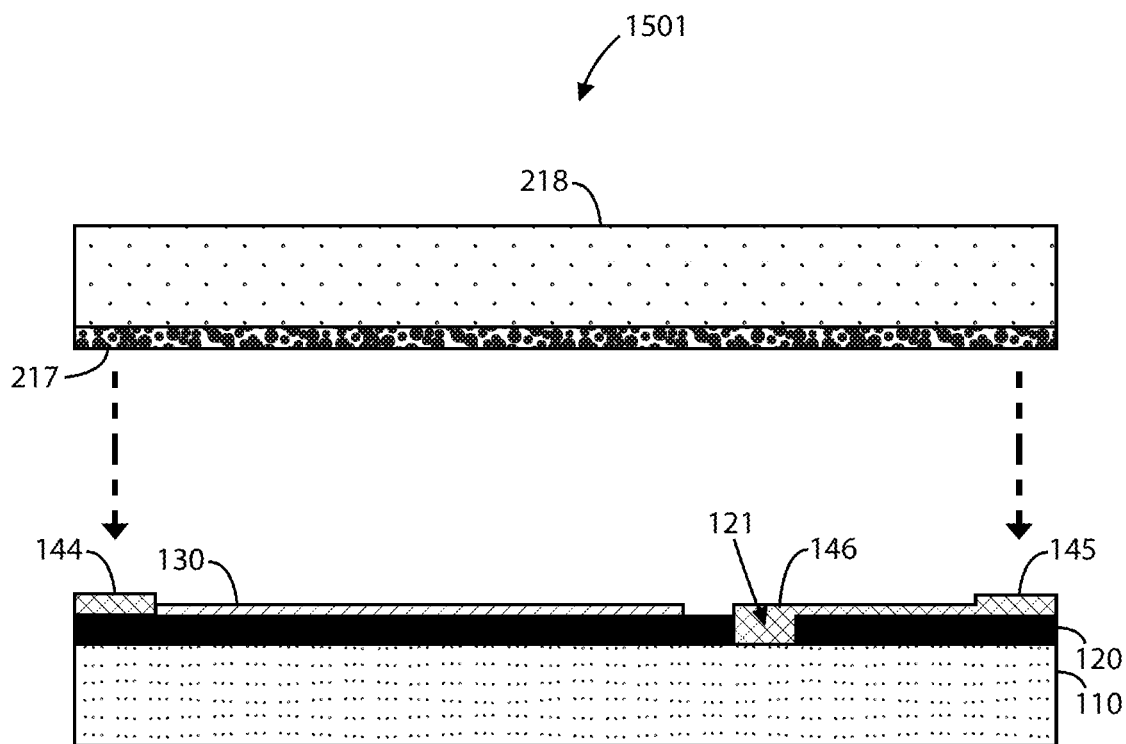
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
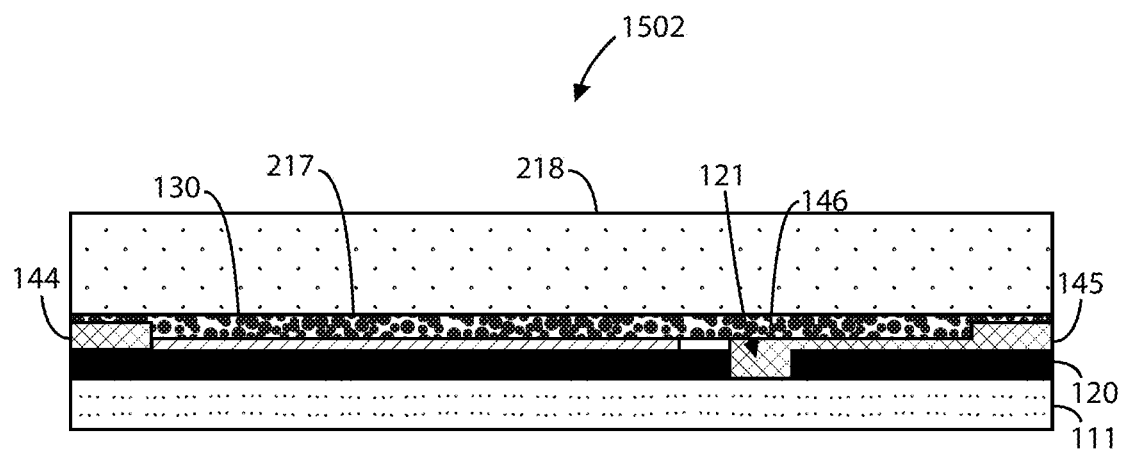

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
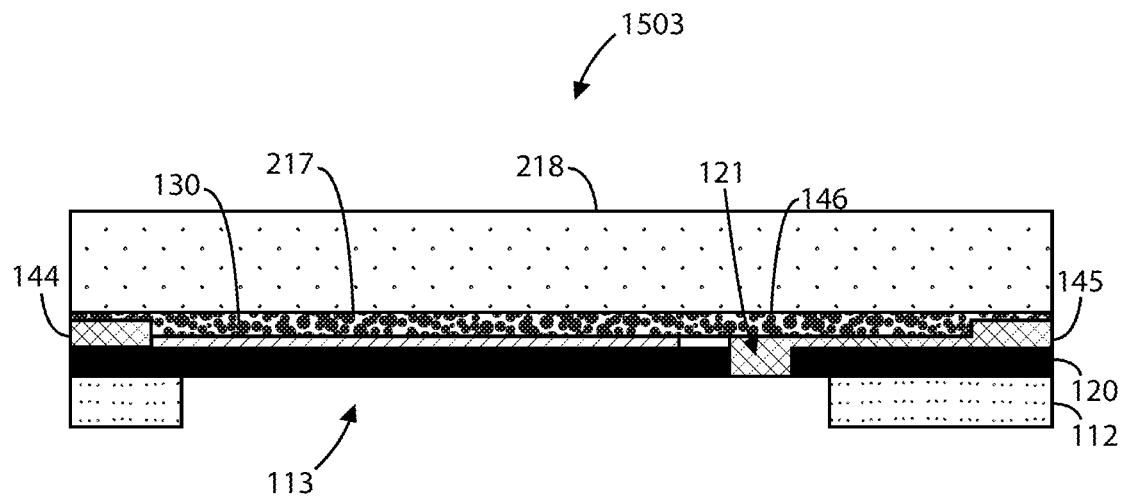

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
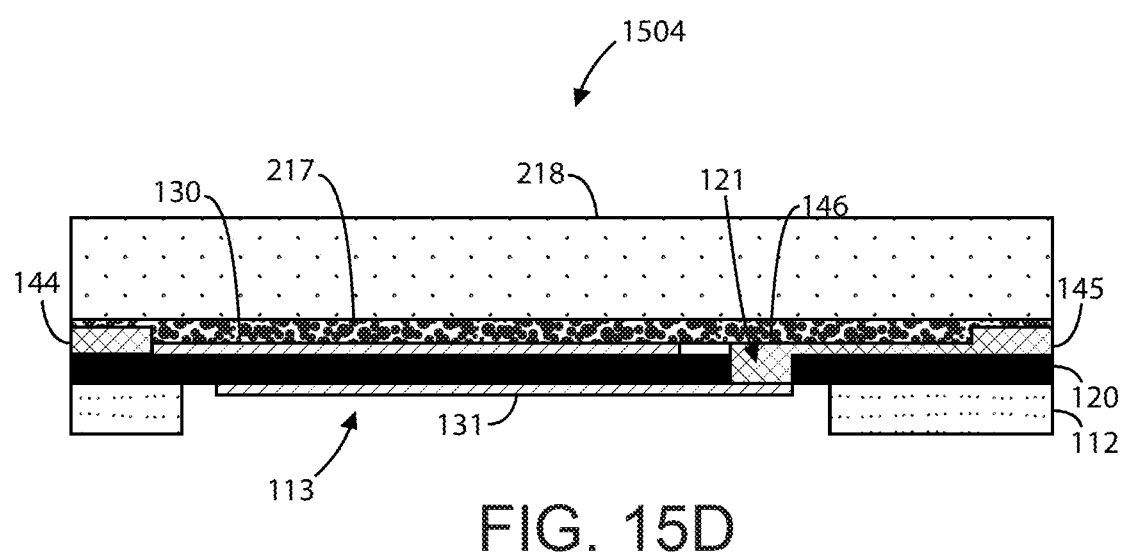

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
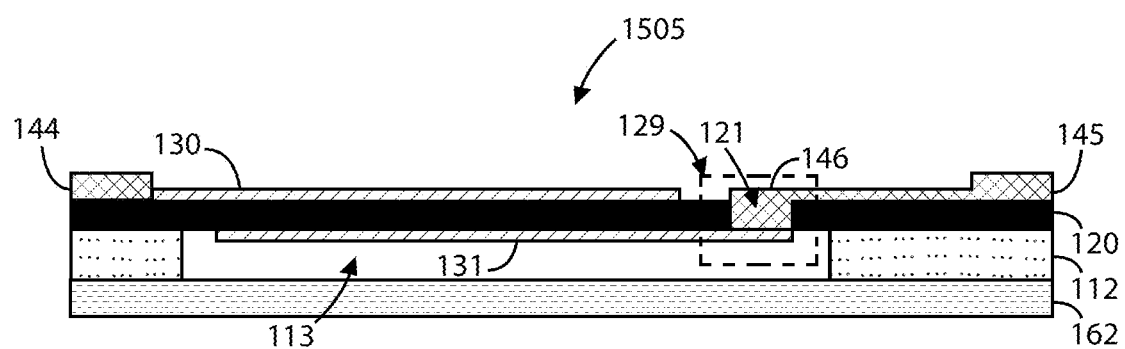

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

According to an example, the present invention includes a method for forming a piezoelectric layer to fabricate an acoustic resonator device. More specifically, the present method includes forming a single crystal material to be used to fabricate the acoustic resonator device. By modifying the strain state of the III-Nitride (III-N) crystal lattice, the present method can change the piezoelectric properties of the single crystal material to adjust the acoustic properties of subsequent devices fabricated from this material. In a specific example, the method for forming the strained single crystal material can include modification of growth conditions of individual layers by employing one or a combination of the following parameters; gas phase reactant ratios, growth pressure, growth temperature, and introduction of impurities.

In an example, the single crystal material is grown epitaxially upon a substrate. Methods for growing the single crystal material can include metal-organic chemical vapor deposition (MOCVD), molecular beam epitaxy (MBE), hydride vapor phase epitaxy (HVPE), atomic layer deposition (ALD), or the like. Various process conditions can be selectively varied to change the piezoelectric properties of the single crystal material. These process conditions can include temperature, pressure, layer thickness, gas phase ratios, and the like. For example, the temperature conditions for films containing aluminum (Al) and gallium (Ga) and their alloys can range from about 800 to about 1500 degrees Celsius. The temperature conditions for films containing Al, Ga, and indium (In) and their alloys can range from about 600 to about 1000 degrees Celsius. In another example, the pressure conditions for films containing Al, Ga, and In and their alloys can range from about 1E-4 Torr to about 900 Torr.

Figure 16:
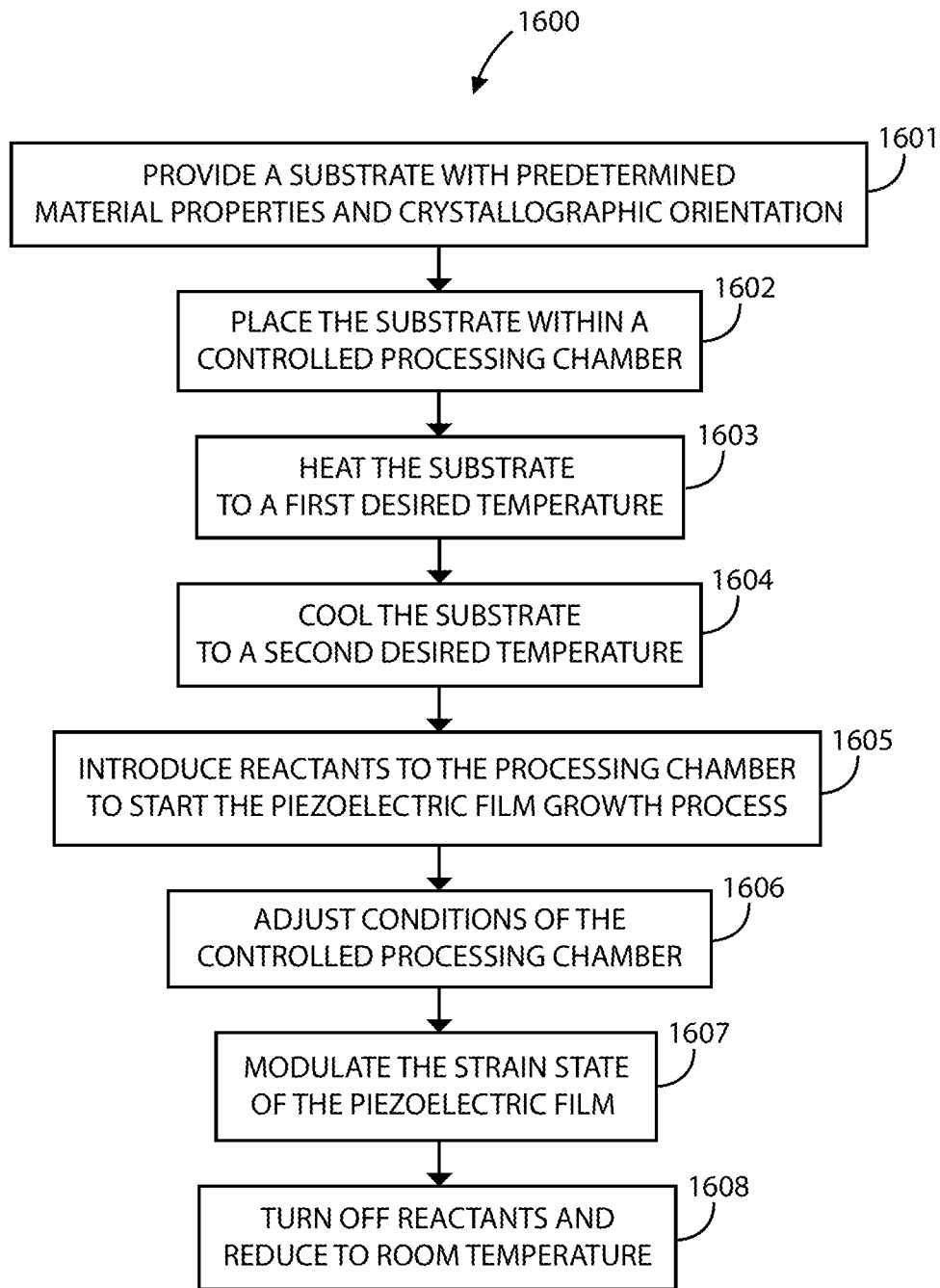
FIG. 16 is a simplified flow diagram illustrating a method for manufacturing a single-crystal piezoelectric layer according to an example of the present invention.

FIG. 16 is a flow diagram illustrating a method for manufacturing a single-crystal piezoelectric layer according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1600 can be outlined as follows:

1601. Provide a substrate having the required material properties and crystallographic orientation. Various substrates can be used in the present method for fabricating an acoustic resonator device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives;

1602. Place the selected substrate into a processing chamber within a controlled environment;

1603. Heat the substrate to a first desired temperature. At a reduced pressure between 5-800 mbar the substrates are heated to a temperature in the range of 1100°-1350° C. in the presence of purified hydrogen gas as a means to clean the exposed surface of the substrate. The purified hydrogen flow shall be in the range of 5-30 slpm (standard liter per minute) and the purity of the gas should exceed 99.9995%;

1604. Cool the substrate to a second desired temperature. After 10-15 minutes at elevated temperature, the substrate surface temperature should be reduced by 100-200° C.; the temperature offset here is determined by the selection of substrate material and the initial layer to be grown (Highlighted in FIGS. 18A-C);

1605. Introduce reactants to the processing chamber. After the temperature has stabilized the Group III and Group V reactants are introduced to the processing chamber and growth is initiated.

1606. Upon completion of the nucleation layer the growth chamber pressures, temperatures, and gas phase mixtures may be further adjusted to grow the layer or plurality of layers of interest for the acoustic resonator device.

1607. During the film growth process the strain-state of the material may be modulated via the modification of growth conditions or by the controlled introduction of impurities into the film (as opposed to the modification of the electrical properties of the film).

1608. At the conclusion of the growth process the Group III reactants are turned off and the temperature resulting film or films are controllably lowered to room. The rate of thermal change is dependent upon the layer or plurality of layers grown and in the preferred embodiment is balanced such that the physical parameters of the substrate including films are suitable for subsequent processing.

Referring to step 1605, the growth of the single crystal material can be initiated on a substrate through one of several growth methods: direct growth upon a nucleation layer, growth upon a super lattice nucleation layer, and growth upon a graded transition nucleation layer. The growth of the single crystal material can be homoepitaxial, heteroepitaxial, or the like. In the homoepitaxial method, there is a minimal lattice mismatch between the substrate and the films such as the case for a native III-N single crystal substrate material. In the heteroepitaxial method, there is a variable lattice mismatch between substrate and film based on in-plane lattice parameters. As further described below, the combinations of layers in the nucleation layer can be used to engineer strain in the subsequently formed structure.

Referring to step 1606, various substrates can be used in the present method for fabricating an acoustic resonator device. Silicon substrates of various crystallographic orientations may be used. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives.

In an example, the present method involves controlling material characteristics of the nucleation and piezoelectric layer(s). In a specific example, these layers can include single crystal materials that are configured with defect densities of less than 1E+11 defects per square centimeter. The single crystal materials can include alloys selected from at least one of the following: AlN, AlGaN, GaN, InN, InGaN, AlInN, AlInGaN, and BN. In various examples, any single or combination of the aforementioned materials can be used for the nucleation layer(s) and/or the piezoelectric layer(s) of the device structure.

According to an example, the present method involves strain engineering via growth parameter modification. More specifically, the method involves changing the piezoelectric properties of the epitaxial films in the piezoelectric layer via modification of the film growth conditions (these modifications can be measured and compared via the sound velocity of the piezoelectric films). These growth conditions can include nucleation conditions and piezoelectric layer conditions. The nucleation conditions can include temperature, thickness, growth rate, gas phase ratio (V/III), and the like. The piezo electric layer conditions can include transition conditions from the nucleation layer, growth temperature, layer thickness, growth rate, gas phase ratio (V/III), post growth annealing, and the like. Further details of the present method can be found below.

Figure 17:
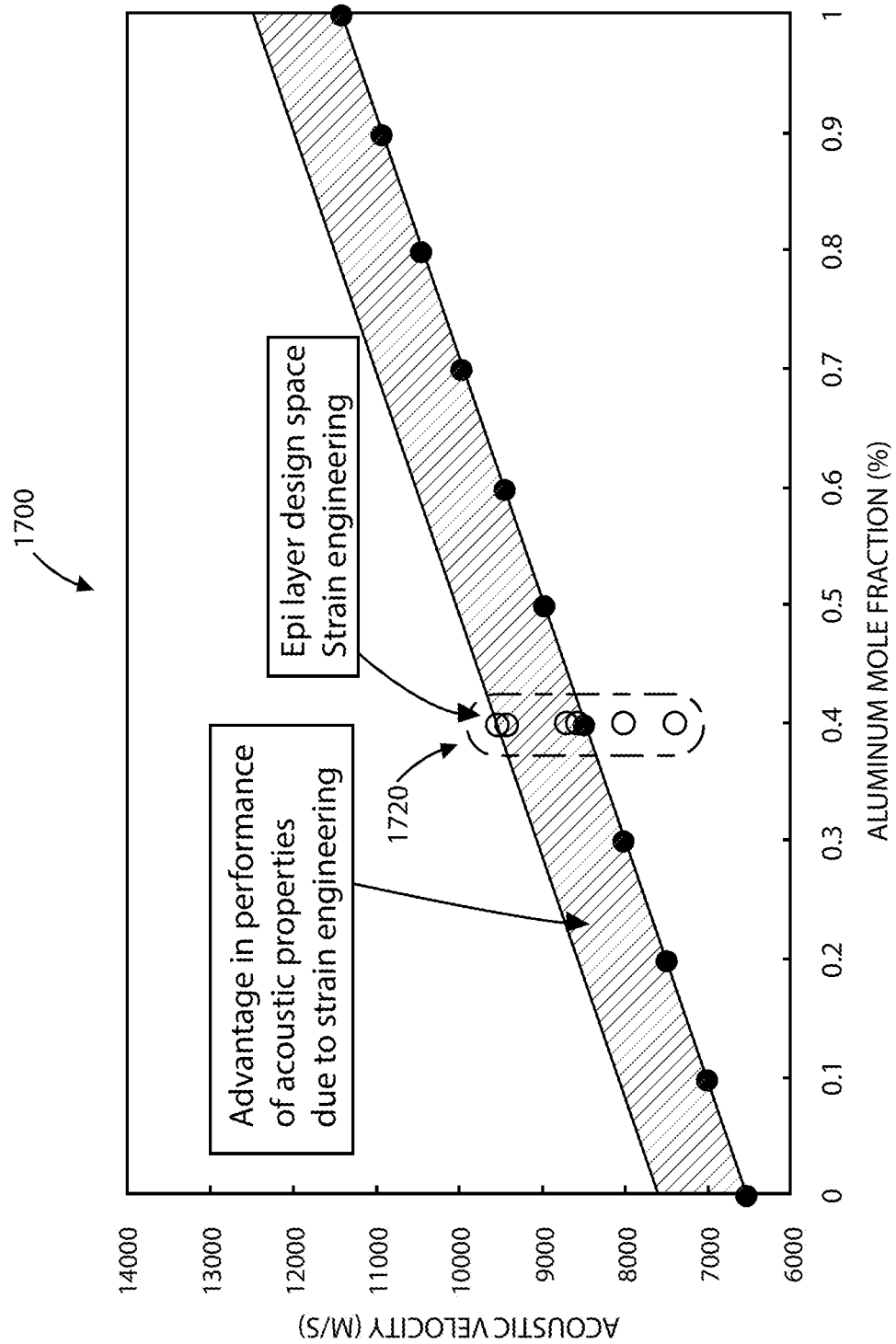
FIG. 17 is a simplified graph illustrating the results of forming a piezoelectric layer for an acoustic resonator device according to an example of the present invention. The graph highlights the ability of to tailor the acoustic properties of the material for a given Aluminum mole fraction. Such flexibility allows for the resulting resonator properties to be tailored to the individual application.

FIG. 17 is a simplified graph illustrating the results of forming a piezoelectric layer for an acoustic resonator device according to an example of the present invention. This graph highlights the ability of to tailor the acoustic properties of the material for a given Aluminum mole fraction. Referring to step 1607 above, such flexibility allows for the resulting resonator properties to be tailored to the individual application. As shown, graph 1700 depicts a plot of acoustic velocity (m/s) over aluminum mole fraction (%). The marked region 1720 shows the modulation of acoustic velocity via strain engineering of the piezo electric layer at an aluminum mole fraction of 0.4. Here, the data shows that the change in acoustic velocity ranges from about 7,500 m/s to about 9,500 m/s, which is about ±1,000 m/s around the initial acoustic velocity of 8,500 m/s. Thus, the modification of the growth parameters provides a large tunable range for acoustic velocity of the acoustic resonator device. This tunable range will be present for all aluminum mole fractions from 0 to 1.0 and is a degree of freedom not present in other conventional embodiments of this technology The present method also includes strain engineering by impurity introduction, or doping, to impact the rate at which a sound wave will propagate through the material. Referring to step 1607 above, impurities can be specifically introduced to enhance the rate at which a sound wave will propagate through the material. In an example, the impurity species can include, but is not limited to, the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), and vanadium (Va). Silicon, magnesium, carbon, and oxygen are common impurities used in the growth process, the concentrations of which can be varied for different piezoelectric properties. In a specific example, the impurity concentration ranges from about 1E+10 to about 1E+21 per cubic centimeter. The impurity source used to deliver the impurities to can be a source gas, which can be delivered directly, after being derived from an organometallic source, or through other like processes.

The present method also includes strain engineering by the introduction of alloying elements, to impact the rate at which a sound wave will propagate through the material. Referring to step 1607 above, alloying elements can be specifically introduced to enhance the rate at which a sound wave will propagate through the material. In an example, the alloying elements can include, but are not limited to, the following: magnesium (Mg), erbium (Er), rubidium (Rb), strontium (Sr), scandium (Sc), titanium (Ti), zirconium (Zr), Hafnium (Hf), vanadium (Va), Niobium (Nb), and tantalum (Ta). In a specific embodiment, the alloying element (ternary alloys) or elements (in the case of quaternary alloys) concentration ranges from about 0.01% to about 50%. Similar to the above, the alloy source used to deliver the alloying elements can be a source gas, which can be delivered directly, after being derived from an organometallic source, or through other like processes. Those of ordinary skill in the art will recognize other variations, modifications, and alternatives to these processes.

The methods for introducing impurities can be during film growth (in-situ) or post growth (ex-situ). During film growth, the methods for impurity introduction can include bulk doping, delta doping, co-doping, and the like. For bulk doping, a flow process can be used to create a uniform dopant incorporation. For delta doping, flow processes can be intentionally manipulated for localized areas of higher dopant incorporation. For co-doping, the any doping methods can be used to simultaneously introduce more than one dopant species during the film growth process. Following film growth, the methods for impurity introduction can include ion implantation, chemical treatment, surface modification, diffusion, co-doping, or the like. The of ordinary skill in the art will recognize other variations, modifications, and alternatives.

Figure 18A:
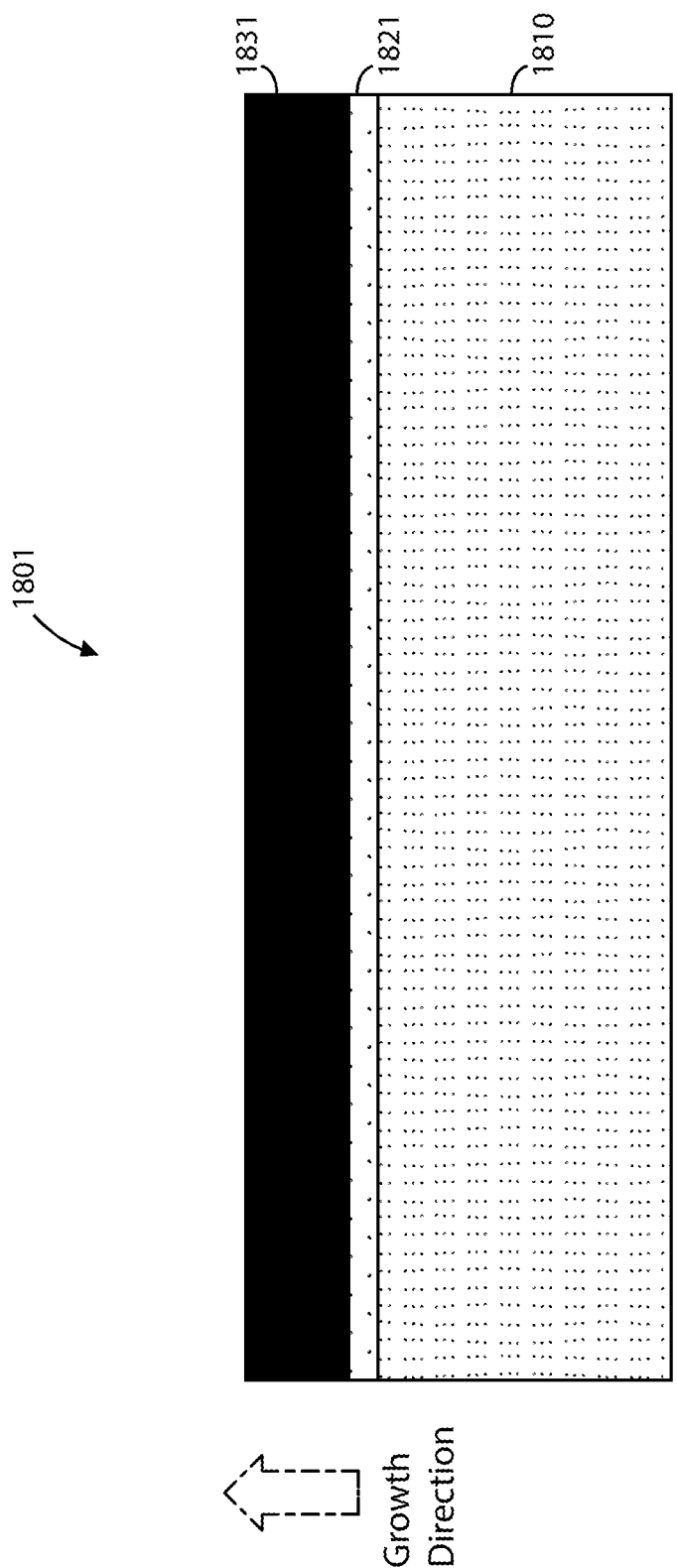
FIG. 18A is a simplified diagram illustrating a method for forming a piezoelectric layer for an acoustic resonator device according to an example of the present invention.

FIG. 18A is a simplified diagram illustrating a method for forming a piezoelectric layer for an acoustic resonator device according to an example of the present invention. As shown in device 1801, the piezoelectric layer 1831, or film, is directly grown on the nucleation layer 1821, which is formed overlying a surface region of a substrate 1810. The nucleation layer 1821 may be the same or different atomic composition as the piezoelectric layer 1831. Here, the piezoelectric film 1831 may be doped by one or more species during the growth (in-situ) or post-growth (ex-situ) as described previously.

Figure 18B:
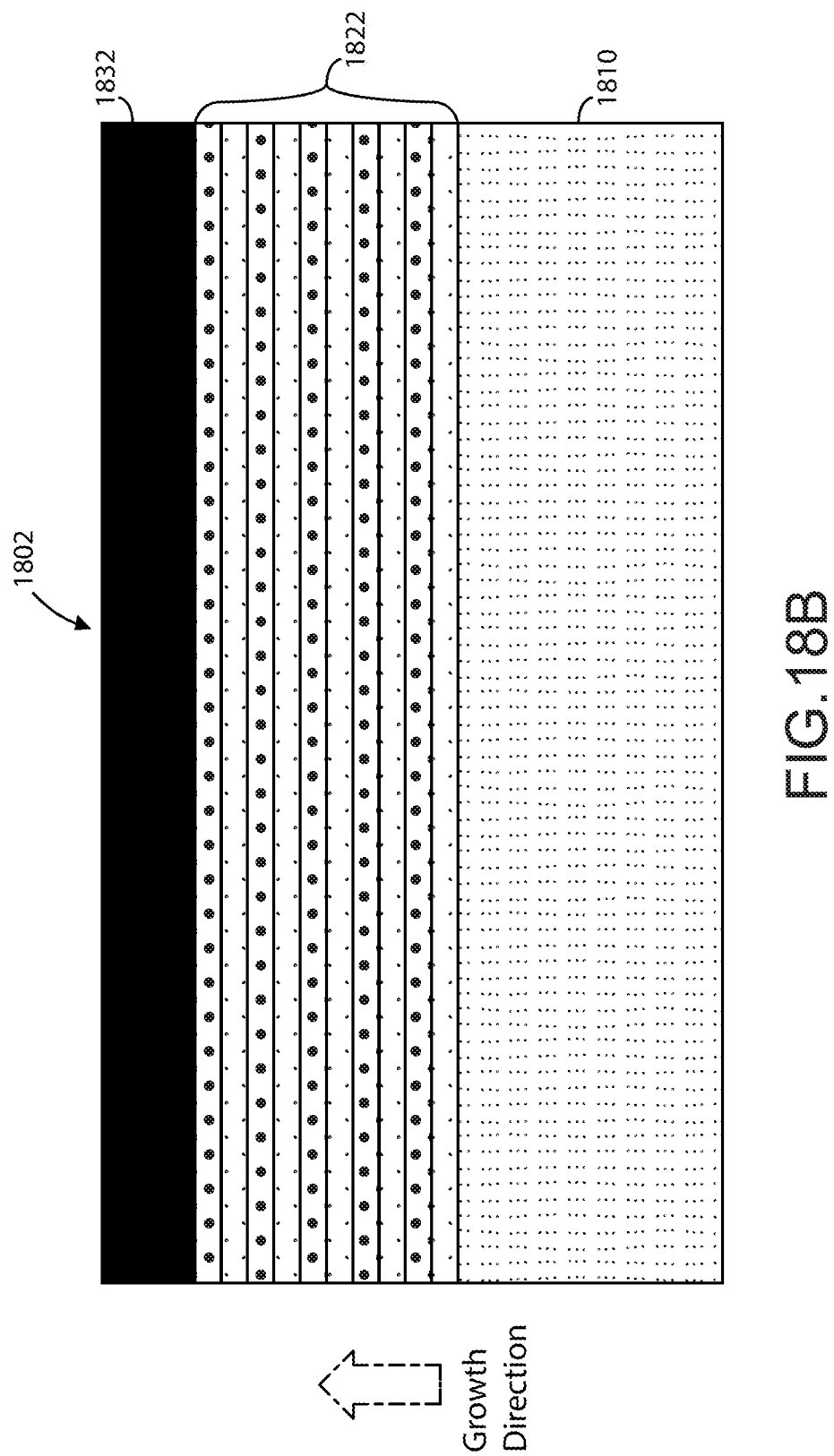
FIG. 18B is a simplified diagram illustrating a method for forming a piezoelectric layer for an acoustic resonator device according to an example of the present invention.

FIG. 18B is a simplified diagram illustrating a method for forming a piezoelectric layer for an acoustic resonator device according to an example of the present invention. As shown in device 1802, the piezoelectric layer 1832, or film, is grown on a super lattice nucleation layer 1822, which is comprised of layer with alternating composition and thickness. This super lattice layer 1822 is formed overlying a surface region of the substrate 1810. The strain of device 1802 can be tailored by the number of periods, or alternating pairs, in the super lattice layer 1822 or by changing the atomic composition of the constituent layers. Similarly, the piezoelectric film 1832 may be doped by one or more species during the growth (in-situ) or post-growth (ex-situ) as described previously.

Figure 18C:
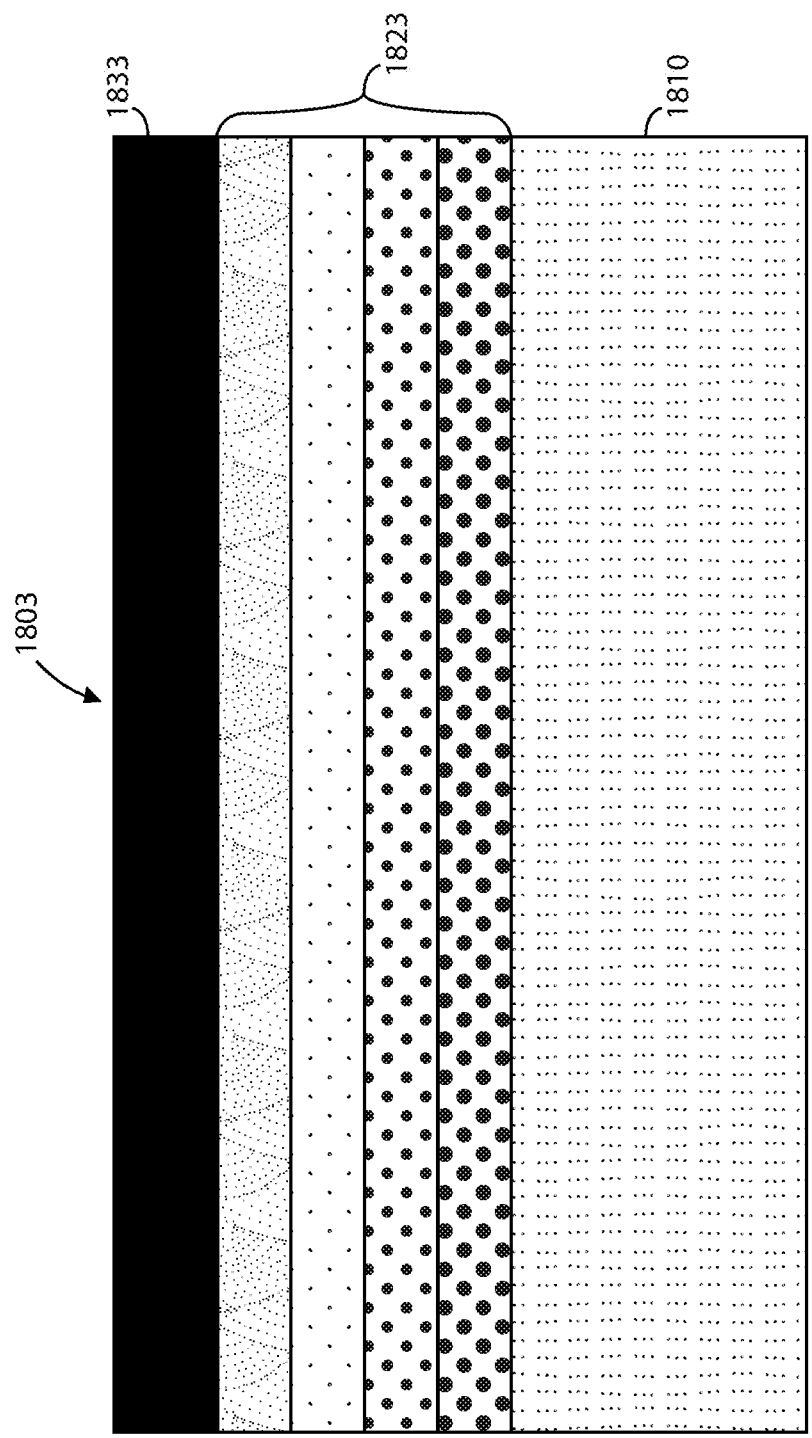
FIG. 18C is a simplified diagram illustrating a method for forming a piezoelectric layer for an acoustic resonator device according to an example of the present invention.

FIG. 18C is a simplified diagram illustrating a method for forming a piezoelectric layer for an acoustic resonator device according to an example of the present invention. As shown in device 1803, the piezoelectric layer 1833, or film, is grown on graded transition layers 1823. These transition layers 1823, which are formed overlying a surface region of the substrate 1810, can be used to tailor the strain of device 1803. In an example, the alloy (binary or ternary) content can be decreased as a function of growth in the growth direction. This function may be linear, step-wise, or continuous. Similarly, the piezoelectric film 1833 may be doped by one or more species during the growth (in-situ) or post-growth (ex-situ) as described previously.

In an example, the present invention provides a method for manufacturing an acoustic resonator device. As described previously, the method can include a piezoelectric film growth process such as a direct growth upon a nucleation layer, growth upon a super lattice nucleation layer, or a growth upon graded transition nucleation layers. Each process can use nucleation layers that include, but are not limited to, materials or alloys having at least one of the following: AlN, AlGaN, GaN, InN, InGaN, AlInN, AlInGaN, and BN. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

In an example, the present invention provides for methods of manufacturing acoustic resonator or filter devices using modifications to production conditions, process conditions, and perimeter structure modifications. FIGS. 19A-44D describe specific examples of such manufacturing methods using a combination of top views, cross-sectional views, and close-up of device portions. Throughout these figures, unless otherwise stated, the first two digits of any numbering of device elements corresponds to the figure number, while the last two digits, or the last two digits supplemented by a hyphenated number, of any numbering of device elements correspond to the same device element across all figures (e.g., 1920, 2020, and 2120 all refer to the piezoelectric layer).

Figure 19A:
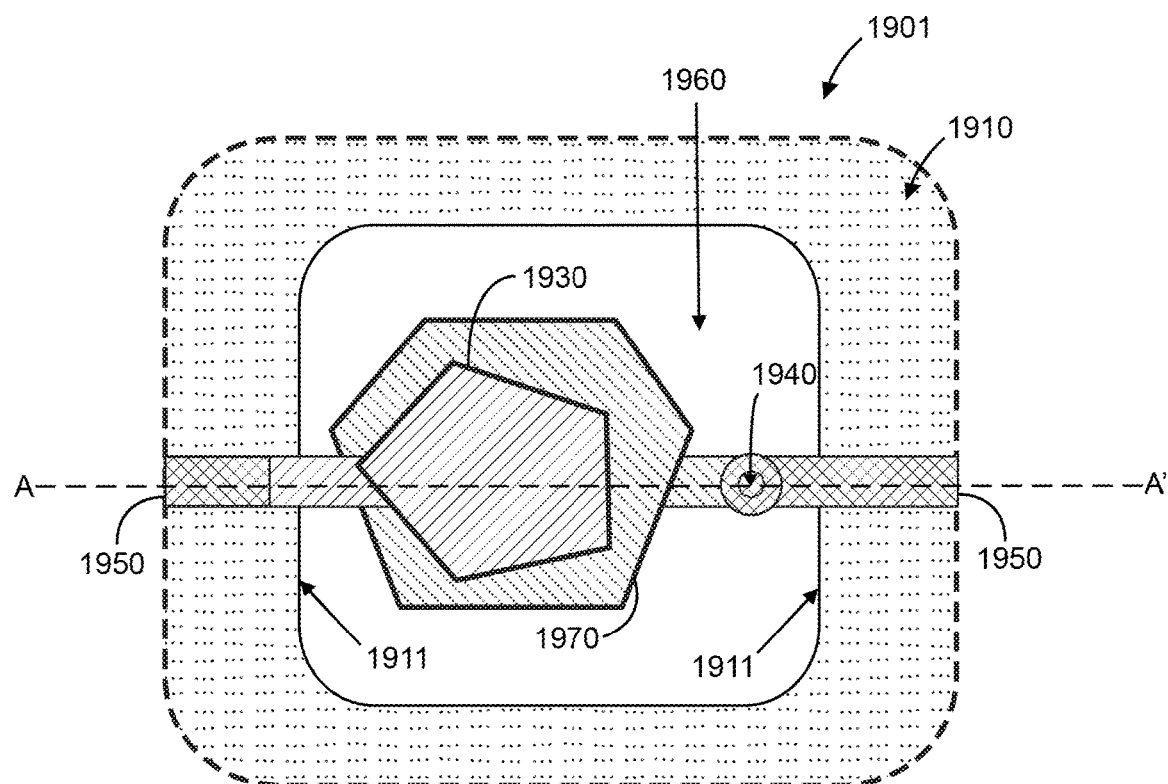
FIG. 19A is a simplified diagram illustrating a top view of an acoustic resonator device according to an example of the present invention.

FIG. 19A is a simplified diagram illustrating a top view of an acoustic resonator device according to an example of the present invention. As shown, device 1901 shows a topside metal electrode 1930 and a backside metal electrode 1970 formed on opposite sides of a piezoelectric layer 1920 (not shown), which is formed overlying a substrate 1910. Here, the piezoelectric layer 1920 is omitted to show the relative spatial positions of the device elements, but the piezoelectric layer 1920 is shown below in FIG. 19B. Both the topside metal electrode 1930 and the backside metal electrode 1970 are electrically coupled to one or more metal pads 1950. The backside metal electrode 1970 is also electrically coupled to a topside metal plug 1941 formed within a topside microtrench 1940. The topside metal plug 1941 is electrically coupled to a metal pad 1950. Also, the backside metal electrode 1970 is formed within a backside trench 1960, which defines the cavity side walls or backside trench edges 1911 of substrate 1910.

Figure 19B:
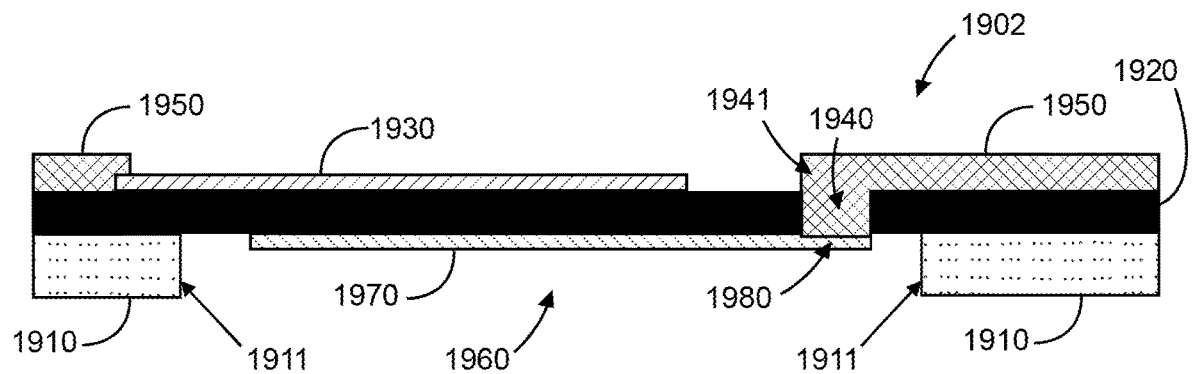
FIG. 19B is a simplified diagram illustrating a cross-sectional view of the acoustic resonator device shown in FIG. 19A.

FIG. 19B is a simplified diagram illustrating a cross-sectional view of the acoustic resonator device shown in FIG. 19A. Here, device 1902 shows the same device elements as described for device 1901 along the A-A' dotted line in FIG. 19A. FIGS. 19A and 19B provide a foundation to discuss the modifications found in FIGS. 20A-27B. As an additional note, any of the resonator/filters described above and below may contain various passivation layers that can serve as a temperature compensation layer or any other dielectric layer. These passivation layers can be used to protect the topside and backside electrodes and can comprise silicon materials, dielectric materials, and the like and combinations thereof.

In an example, the present invention provides a method of using different geometric shapes or geometric areas to characterize the topside metal electrode 1930, the backside metal electrode 1970, and the backside trench/cavity 1960. Potential benefits of forgoing restriction of the shapes of these device elements can reduce the impact of spurious modes and relax constraints on process.

The different geometries can be formed by creating different geometric areas using masks to pattern the electrodes (1930, 1970) and the backside trench 1960. These geometric areas can be patterned using photo-lithography, etching, and other like processes or combinations thereof. The geometric areas can include polygonal shapes having 'n' sides, where 'n' is greater than or equal to three. In specific examples, these geometric areas can include skewed or regular polygonal shapes having parallel or non-parallel edges. In other cases, the geometric area can include a circle, an ellipses, non-polygonal shapes, skew non-polygonal shapes, or irregular shapes, or any other shape. These geometric areas can be characterized as having similar or dissimilar shapes. In a specific example, the area ratio between the geometric areas of the topside metal electrode and the backside metal electrode can be between about 0.1 to about 10. Also, the geometric areas of the electrodes and the backside trench can be spatially configured such that the distance between either the topside metal electrode or the backside metal electrode and any of the backside trench edges is between about 0.1 microns and about 500 microns. The device elements, methods, and techniques described above can be combined with any device elements, methods, and techniques described in the following figures. Those of ordinary skill in the art will recognize other variations, modifications, and alternatives.

Figure 20A:
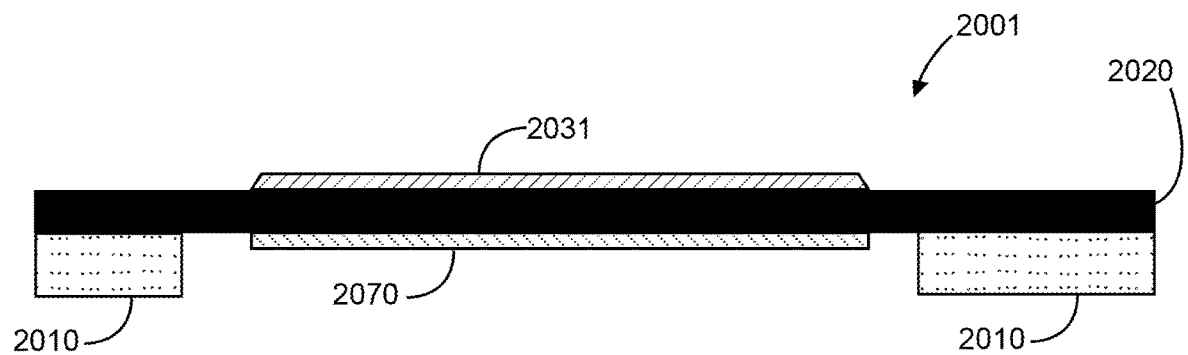
FIG. 20A is a simplified diagram illustrating a cross-sectional view of an acoustic resonator device with electrode boundary modifications according to an example of the present invention.

FIG. 20A is a simplified diagram illustrating a cross-sectional view of an acoustic resonator device with electrode boundary modifications according to an example of the present invention. As shown, device 2001 depicts a topside metal electrode 2031 formed with modified edges. This method can also be applied to the backside or both the topside and backside.

Figures 20B, 20C, 20D:
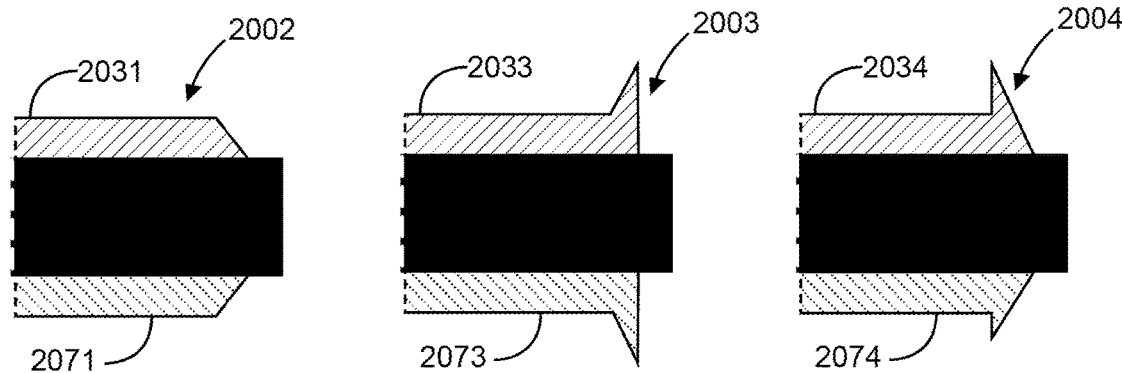
FIGS. 20B through 20G are simplified diagrams illustrating cross-sectional views of portions of acoustic resonator devices with electrode boundary modifications according to an example of the present invention.
Figures 20E, 20F, 20G:
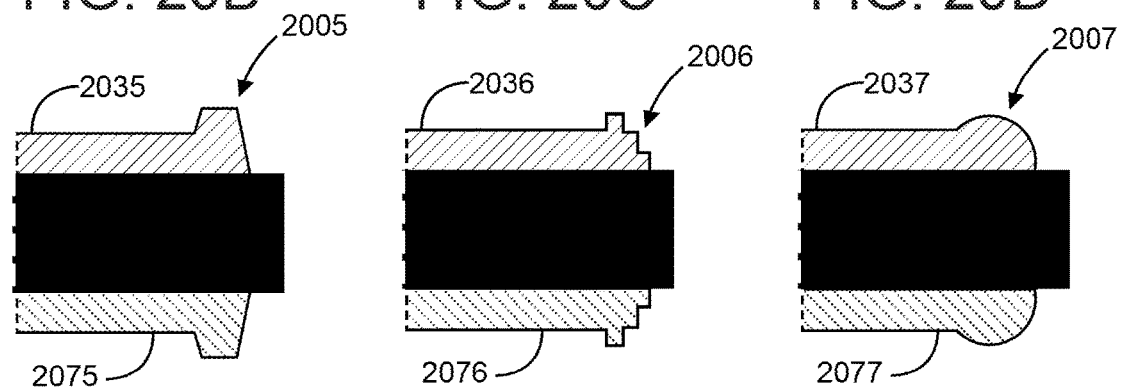

FIGS. 20B through 20G are simplified diagrams illustrating cross-sectional views of portions of acoustic resonator devices with electrode boundary modifications according to an example of the present invention. In each of the following examples, the electrode edge profile modifications can be implemented on the topside electrode, the backside electrode, or both. Different metal and dielectric materials may also be used. In FIG. 20B, device 2002 includes a top metal electrode 2031 and a bottom metal electrode 2071 with "down slope" edges. In FIG. 20C, device 2003 includes a top metal electrode 2033 and a bottom metal electrode 2073 with "up slope" edges. In FIG. 20D, device 2004 includes a top metal electrode 2034 and a bottom metal electrode 2074 with "up and down slope" edges. In FIG. 20E, device 2005 includes a top metal electrode 2035 and a bottom metal electrode 2075 with "up-flat and down slope" edges. In FIG. 20F, device 2006 includes a top metal electrode 2036 and a bottom metal electrode 2076 with "stair steps" edges. In FIG. 20G, device 2007 includes a top metal electrode 2037 and a bottom metal electrode 2077 with "circular" edges. Other shapes may be used as well.

In an example, the present invention provides a method of modifying the edges of the metal electrodes or resonator using additive and/or subtractive processes to achieve a desired profile at the resonator or electrode boundary. This can also include tapering or shaping the resonator boundary and using an ion implantation process at the boundary. Also, the present method can include forming a desired gap between the substrate and the electrodes and configuring a desired relative enclosure between the top and bottom electrodes. These methods can be used singly or in combination to increase the energy content of a desired mode. Other potential benefits include, among others, increased Q factor and the ability to reduce mask levels or process steps compared to other methods of spurious mode suppression.

In a specific example, standard multiple photolithography and etching processes can be used to realized the patterns in the electrode metals. The desired profile of the electrode edge can be achieved by build-up or removal approaches using traditional layer deposition methods, such as sputtering, evaporating, printing, or the like, followed by dry or wet etching of the electrode metal with specific masking layers to achieve the desired ratio or removal rates. Such processes can be used to form tapered profiles. Additive processes can involve deposition processes such as patterned sputtering, patterned evaporation and lift-off, evaporation and patterned etch, and the like. Subtractive processes can include involve blanket deposition and non-masked removal processes such as laser ablation, ion beam milling, or the like. The device elements, methods, and techniques described above can be combined with any device elements, methods, and techniques described in the following figures. Those of ordinary skill in the art will recognize other variations, modifications, and alternatives.

Figure 21A:
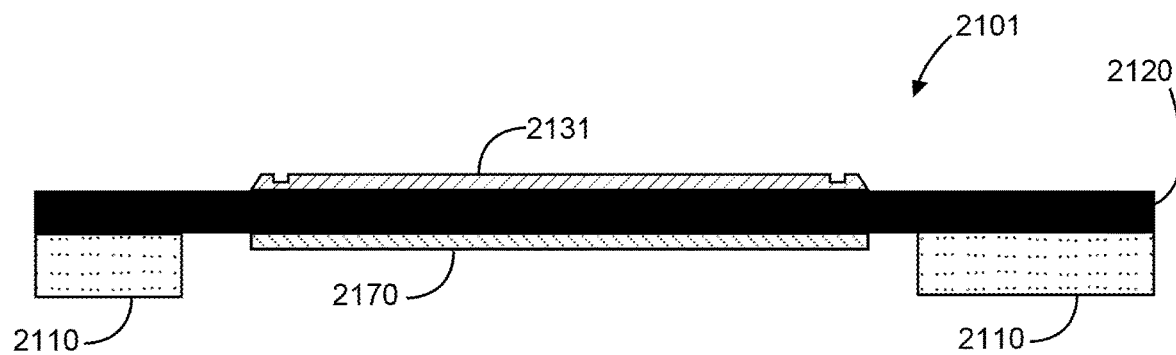
FIG. 21A is a simplified diagram illustrating a cross-sectional view of an acoustic resonator device with grooved electrode boundary modifications according to an example of the present invention.

FIG. 21A is a simplified diagram illustrating a cross-sectional view of an acoustic resonator device with grooved electrode boundary modifications according to an example of the present invention. FIG. 21A is similar to FIG. 20A with the addition of a groove formed within a vicinity of the electrode edges. In each of the following examples, the modifications can be implemented on the topside electrode, the backside electrode, or both. Different metal and dielectric materials may also be used.

Figures 21B, 21C, 21D:
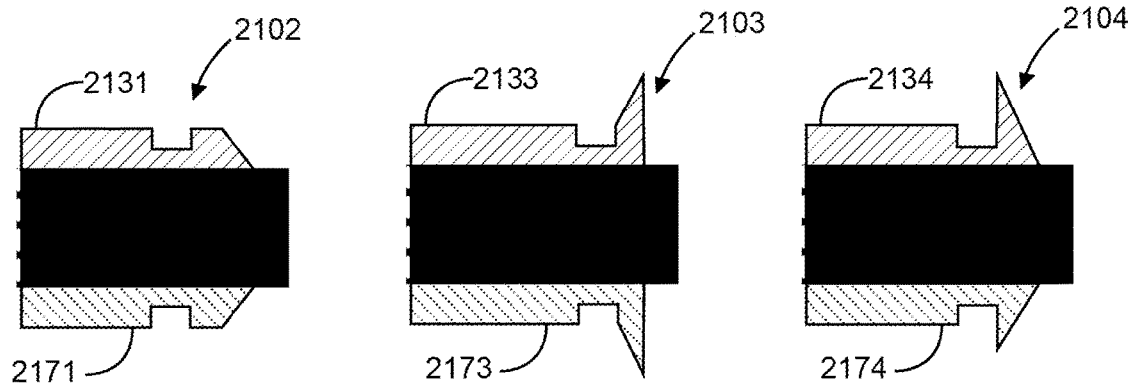
FIGS. 21B through 21G are simplified diagrams illustrating cross-sectional views of portions of acoustic resonator devices with grooved electrode boundary modifications according to an example of the present invention.
Figures 21E, 21F, 21G:
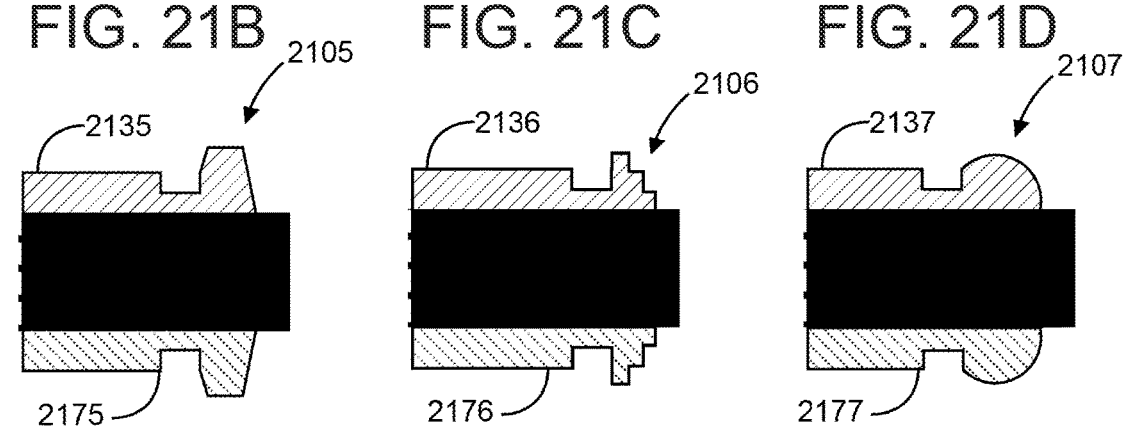

FIGS. 21B through 21G are simplified diagrams illustrating cross-sectional views of portions of acoustic resonator devices with grooved electrode boundary modifications according to an example of the present invention. Each of these figures shows the same edge profiles shapes with the addition of the groove formed near the edge. In FIG. 21B, device 2102 includes a top metal electrode 2131 and a bottom metal electrode 2171 with grooved "down slope" edges. In FIG. 21C, device 2103 includes a top metal electrode 2133 and a bottom metal electrode 2173 with grooved "up slope" edges. In FIG. 21D, device 2104 includes a top metal electrode 2134 and a bottom metal electrode 2174 with grooved "up and down slope" edges. In FIG. 21E, device 2105 includes a top metal electrode 2135 and a bottom metal electrode 2175 with grooved "up-flat and down slope" edges. In FIG. 21F, device 2106 includes a top metal electrode 2136 and a bottom metal electrode 2176 with grooved "stair steps" edges. In FIG. 21G, device 2107 includes a top metal electrode 2137 and a bottom metal electrode 2177 with grooved "circular" edges. Other shapes may be used as well. The device elements, methods, and techniques described above can be combined with any device elements, methods, and techniques described in the following figures. Those of ordinary skill in the art will recognize other variations, modifications, and alternatives.

Figure 22A:
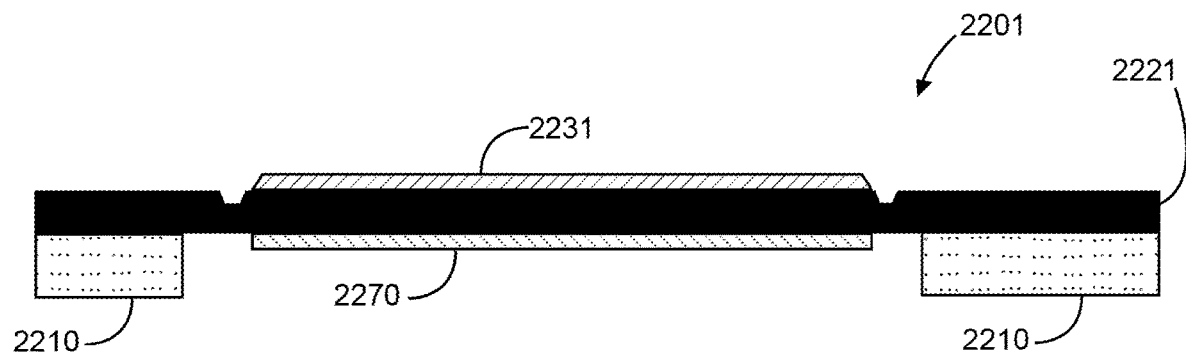
FIG. 22A is a simplified diagram illustrating a cross-sectional view of an acoustic resonator device with a grooved piezoelectric layer according to an example of the present invention.

FIG. 22A is a simplified diagram illustrating a cross-sectional view of an acoustic resonator device with a grooved piezoelectric layer according to an example of the present invention. As shown, the piezoelectric layer 2221 of device 2201 has grooves formed within a vicinity or the electrode edges. In each of the following examples, the modifications can be implemented on the topside of the piezoelectric layer, the backside of the piezoelectric layer, or both.

Figure 22B:
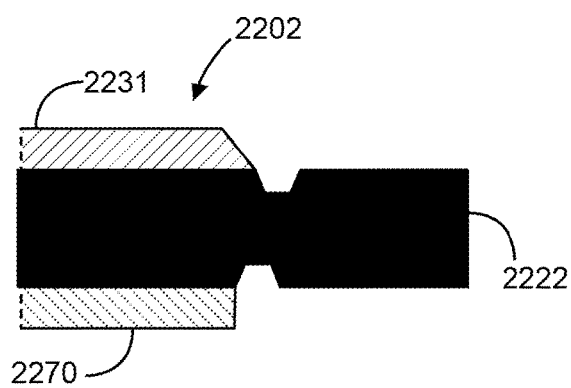
FIGS. 22B and 22C are simplified diagrams illustrating cross-sectional views of portions of acoustic resonator devices with grooved piezoelectric layers according to an example of the present invention.
Figure 22C:
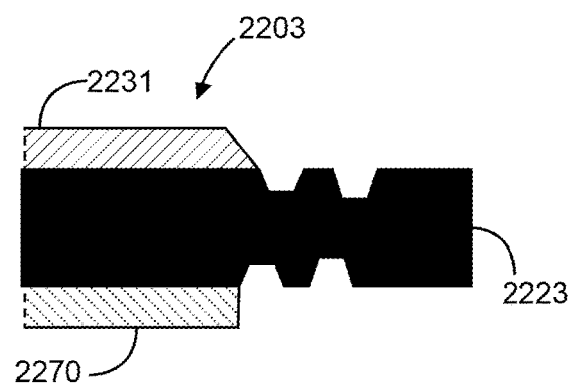

FIGS. 22B and 22C are simplified diagrams illustrating cross-sectional views of portions of acoustic resonator devices with grooved piezoelectric layers according to an example of the present invention. FIG. 22B shows an example with single grooves formed on both the topside and backside of the piezoelectric layer 2222. FIG. 22C shows an example with double grooves formed on both the topside and backside of the piezoelectric layer 2223. The device elements, methods, and techniques described above can be combined with any device elements, methods, and techniques described in the following figures. Those of ordinary skill in the art will recognize other variations, modifications, and alternatives.

Figure 23A:
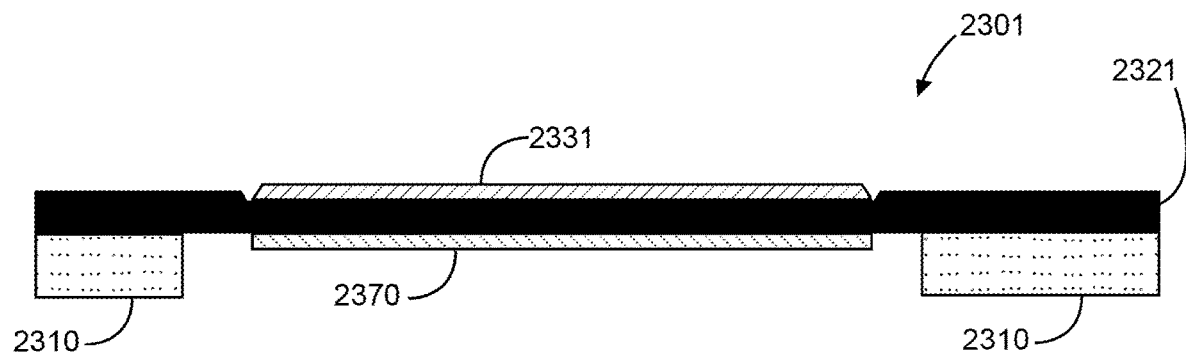
FIG. 23A is a simplified diagram illustrating a cross-sectional view of an acoustic resonator device with a grooved piezoelectric sub-surface layer according to an example of the present invention.

FIG. 23A is a simplified diagram illustrating a cross-sectional view of an acoustic resonator device with a grooved piezoelectric sub-surface layer according to an example of the present invention. As shown, the topside metal electrode 2331 of device 2301 is formed within a groove or cavity within the piezoelectric layer 2321. In each of the following examples, the modifications can be implemented on the topside of the piezoelectric layer, the backside of the piezoelectric layer, or both.

Figure 23B:
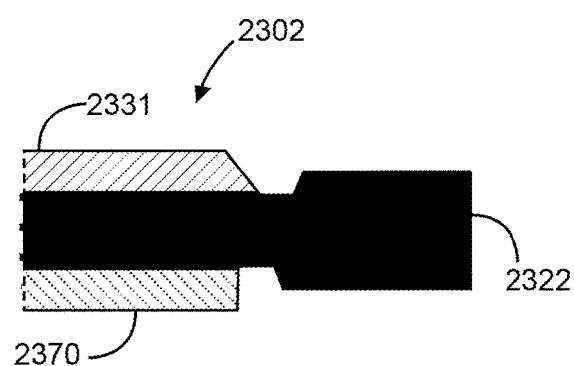
FIGS. 23B and 23C are simplified diagrams illustrating cross-sectional views of portions of acoustic resonator devices with grooved piezoelectric sub-surface layers according to an example of the present invention.
Figure 23C:
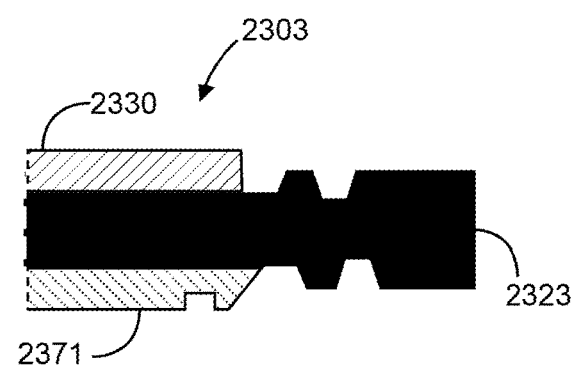

FIGS. 23B and 23C are simplified diagrams illustrating cross-sectional views of portions of acoustic resonator devices with grooved piezoelectric sub-surface layers according to an example of the present invention. FIG. 23B shows an example with both topside and backside grooves in the piezoelectric layer 2322. FIG. 23C shows the combination of topside and backside grooves and an additional groove formed on each side within a vicinity of the edge of the topside and backside grooves. The device elements, methods, and techniques described above can be combined with any device elements, methods, and techniques described in the following figures. Those of ordinary skill in the art will recognize other variations, modifications, and alternatives.

Figure 24A:
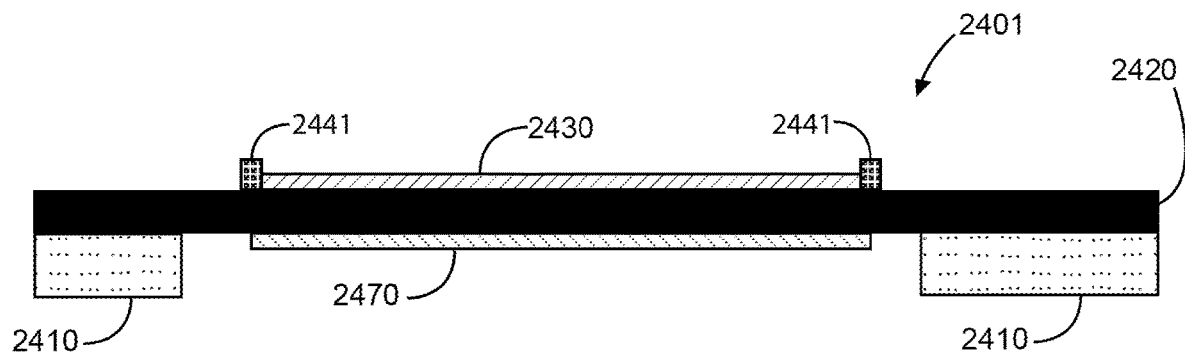
FIG. 24A is a simplified diagram illustrating a cross-sectional view of an acoustic resonator device with electrode perimeter structure modification according to an example of the present invention.

FIG. 24A is a simplified diagram illustrating a cross-sectional view of an acoustic resonator device with electrode edge border materials according to an example of the present invention. As shown, device 2401 shows the use of edge border materials 2441 formed within a vicinity or adjacent to the top metal electrode 2430. In each of the following examples, the modifications can be implemented on the topside of the piezoelectric layer, the backside of the piezoelectric layer, or both.

Figures 24B, 24C:
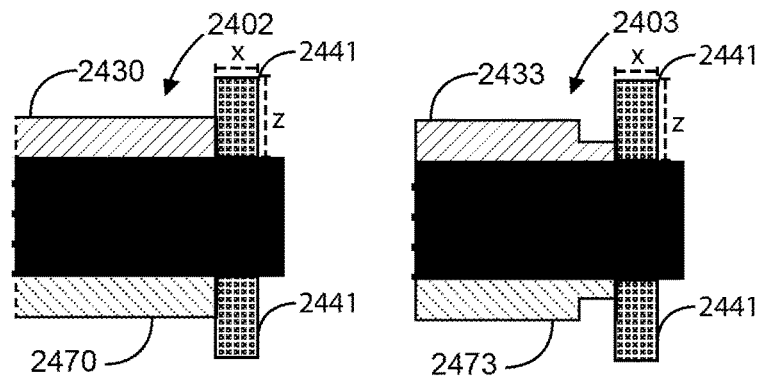
FIGS. 24B through 24E are simplified diagrams illustrating cross-sectional views of portions of acoustic resonator devices with electrode perimeter structure modification according to an example of the present invention.
Figures 24D, 24E:
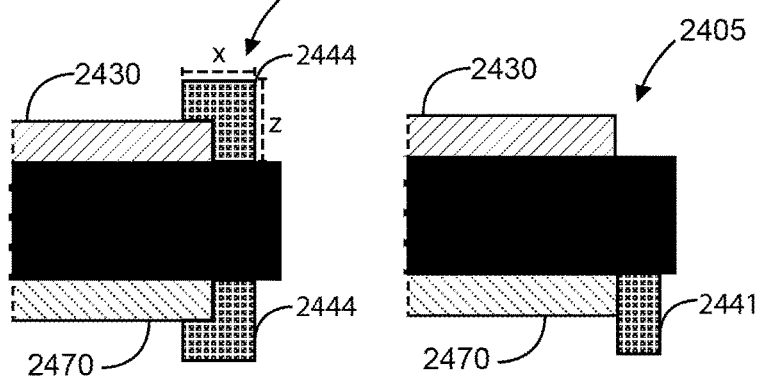

FIGS. 24B through 24E are simplified diagrams illustrating cross-sectional views of portions of acoustic resonator devices with electrode edge border materials according to an example of the present invention. FIG. 24B shows an example of using topside and backside edge border materials 2441. FIG. 24C shows an example of additionally forming grooves in the electrode 2433 adjacent to the edge border material 2441. FIG. 24D shows an example of edge border materials 2444 that overlap the electrode. FIG. 24E shows an example of only using backside electrode edge border materials 2441. The device elements, methods, and techniques described above can be combined with any device elements, methods, and techniques described in the following figures. Those of ordinary skill in the art will recognize other variations, modifications, and alternatives.

FIGS. 25A through 25D are simplified diagrams illustrating cross-sectional views of a an acoustic resonator device subjected to an ion implantation process according to an example of the present invention. As described previously, ion implantation processes can be used to increase the energy content of a desired mode. Masked ion implantation involving depositing a masking material and selectively removing portions of that material via photo lithography and etching steps. The ion implantation of specific species can be used to achieve desired piezoelectric coefficient parameter values need for the desired k2. In each of the following examples, the modifications can be implemented on the topside of the piezoelectric layer, the backside of the piezoelectric layer, or both.

FIG. 25A shows an example in which the ion implantation process is used before the formation of the top metal electrode. FIG. 25B shows an example in which the ion implantation process is used after the formation of the top metal electrode. FIG. 25C shows an example in which the ion implantation process is used before the formation of the backside metal electrode, while FIG. 25D shows an example in which the ion implantation process is used after the formation of the backside metal electrode. In the latter two figures, the device is mounted on a temporary carrier 2590 by using a temporary adhesive 2580. In a specific example, the masked ion implantation process can be bounded to a zone characterized by 500 um outside the central resonator area, wherein the zone extends from and includes the central resonator area. This implantation process can also be characterized by a dosage between 1E+14 and 1E+20 ions per cubic centimeter. Also, this process can use one or more of the following species: H, He, B, C, O, Fe, Mo, Ta, W, or other transition metal or combinations thereof. The device elements, methods, and techniques described above can be combined with any device elements, methods, and techniques described in the following figures. Those of ordinary skill in the art will recognize other variations, modifications, and alternatives.

Figure 26A:
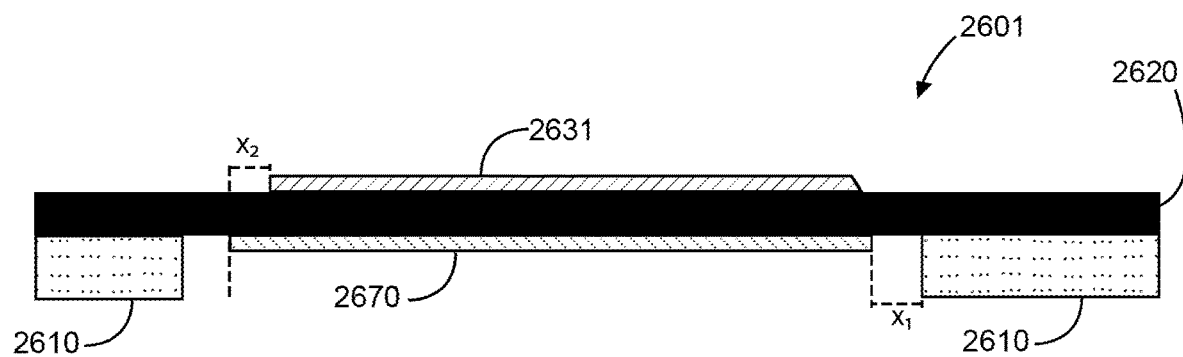
FIG. 26A is a simplified diagram illustrating a cross-sectional view of an acoustic resonator device with spatial modifications according to an example of the present invention.

FIG. 26A is a simplified diagram illustrating a cross-sectional view of an acoustic resonator device with spatial modifications according to an example of the present invention. As shown, device 2601 addresses the specific dimensions of the cavity sidewall or backside trench sidewall gap and enclosure distance of the backside metal electrode compared to the topside metal electrode. These modifications can potentially improve all resonator performance metrics. In each of the following examples, the modifications can be implemented on the topside of the piezoelectric layer, the backside of the piezoelectric layer, or both.

Figure 26B:
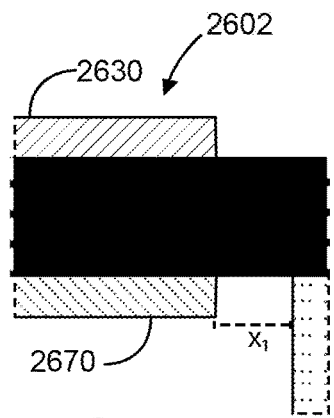
FIGS. 26B through 26E are simplified diagrams illustrating cross-sectional views of portions of acoustic resonator devices with spatial modifications according to an example of the present invention.

FIGS. 26B through 26E are simplified diagrams illustrating cross-sectional views of portions of acoustic resonator devices with spatial modifications according to an example of the present invention. FIG. 26B shows an example of forming device 2602 with the sidewall gap distance of $x_1$. In a specific example, the distance $x_1$ can range from about 0.1 um to about 500 um. The device elements, methods, and techniques described above can be combined with any device elements, methods, and techniques described in the following figures. Those of ordinary skill in the art will recognize other variations, modifications, and alternatives.

Figure 26C:
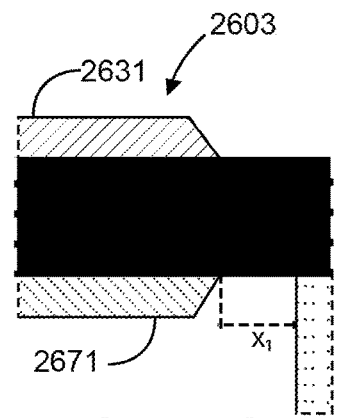
Figure 26D:
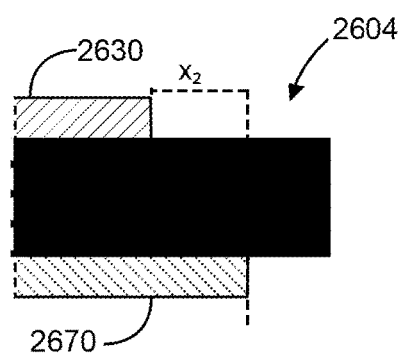
Figure 26E:
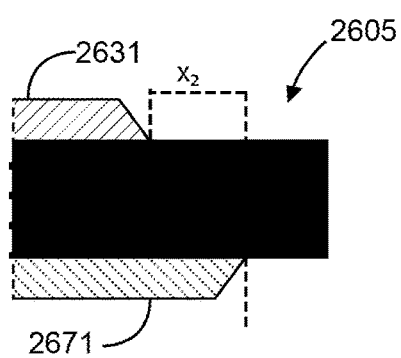

FIG. 26C shows the combination of the sidewall gap with the electrode edge profile shaping described earlier. FIG. 26D shows an example of forming the device 2604 such that the backside contact or metal electrode 2670 is larger than the topside contact or metal electrode 2630 with an overlap distance of $x_2$. In a specific example, $x_2$ can range from about 0.1 um to about 500 um. The device elements, methods, and techniques described above can be combined with any device elements, methods, and techniques described in the following figures. Those of ordinary skill in the art will recognize other variations, modifications, and alternatives.

Figure 27A:
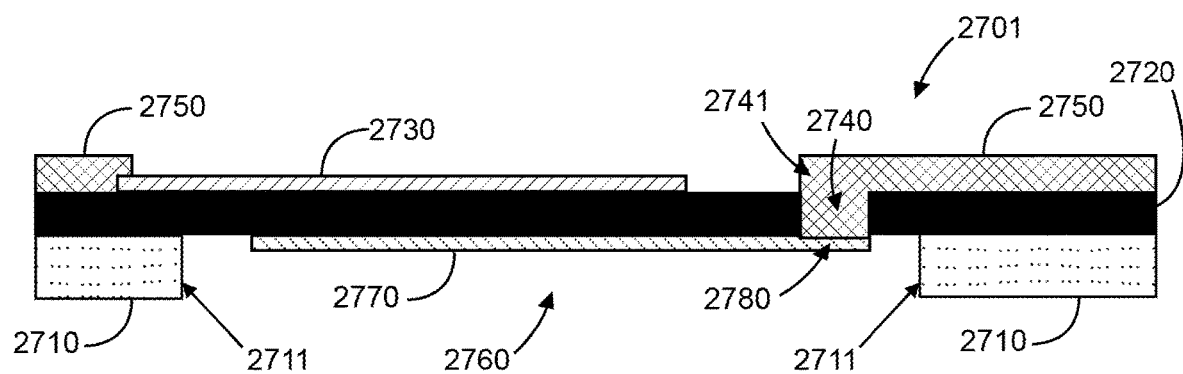
FIG. 27A is a simplified diagram illustrating a cross-sectional view of an acoustic resonator device according to an example of the present invention.

FIG. 27A is a simplified diagram illustrating a cross-sectional view of an acoustic resonator device according to an example of the present invention. This figure, similar to FIG. 19A, is considered a series resonator and is used as comparison for FIG. 27B below.

Figure 27B:
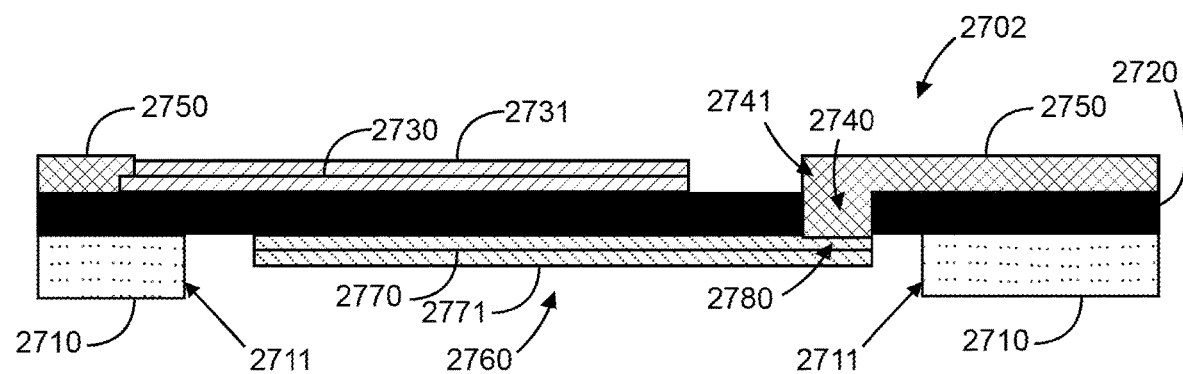
FIG. 27B is a simplified diagram illustrating a cross-sectional view of an acoustic resonator device with frequency offset structure according to an example of the present invention.

FIG. 27B is a simplified diagram illustrating a cross-sectional view of an acoustic resonator device with frequency offset structure according to an example of the present invention. As shown, device 2702 includes forming additional frequency offset structure electrode layers electrically coupled to the topside metal electrode 2730, the backside metal electrode 2770, or both. This forms a shunt resonator. In a specific example, the frequency offset structure layers can include metals and materials such as Mo, Al, W, Ru, AlN, SiN, or $SiO_2$. The device elements, methods, and techniques described above can be combined with any device elements, methods, and techniques described in the following figures. Those of ordinary skill in the art will recognize other variations, modifications, and alternatives.

Figure 28A:
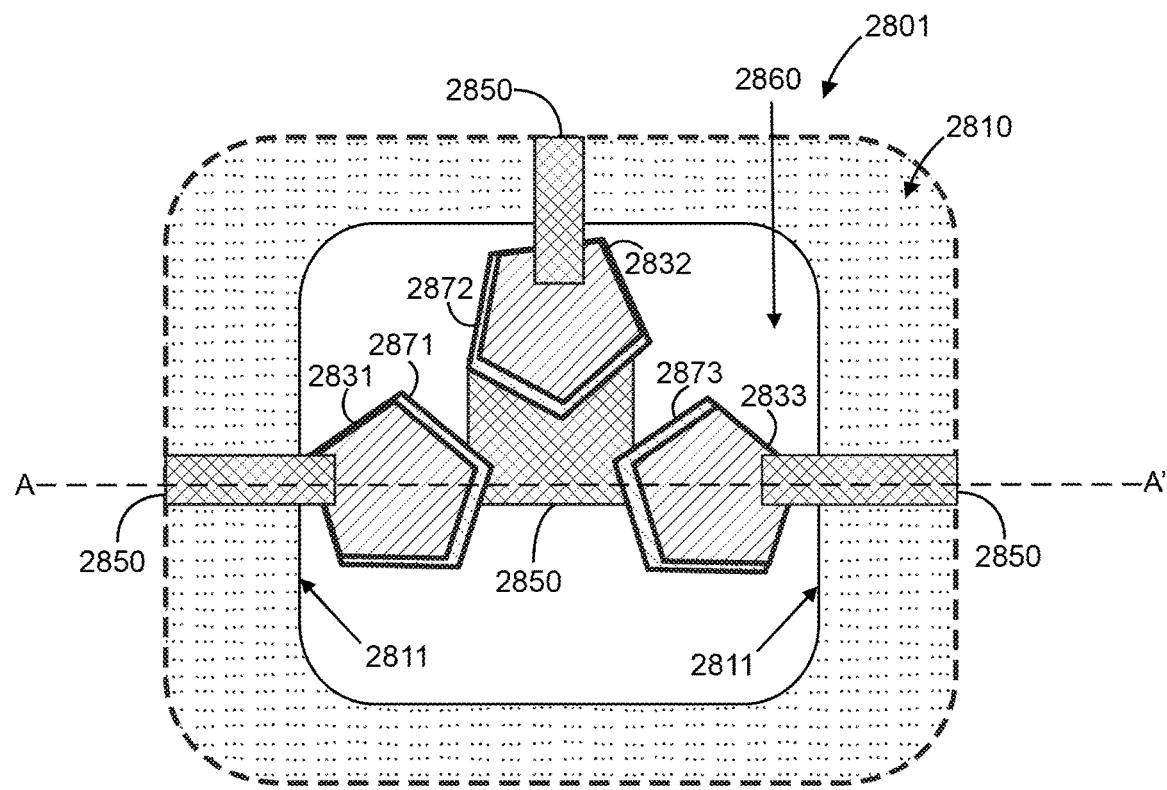
FIG. 28A is a simplified diagram illustrating a top view of a multiple acoustic resonator device according to an example of the present invention.

FIG. 28A is a simplified diagram illustrating a top view of a multiple acoustic resonator device according to an example of the present invention. As shown, device 2801 includes three separate resonators, each having a topside (2831, 2832, 2833) and backside (2871, 2872, 2873) metal electrodes. Each of the topside metal electrodes are coupled to a metal pad 2850 extending away from the backside trench 2860 and all of the topside metal electrodes are coupled together by another metal pad 2850.

Figure 28B:
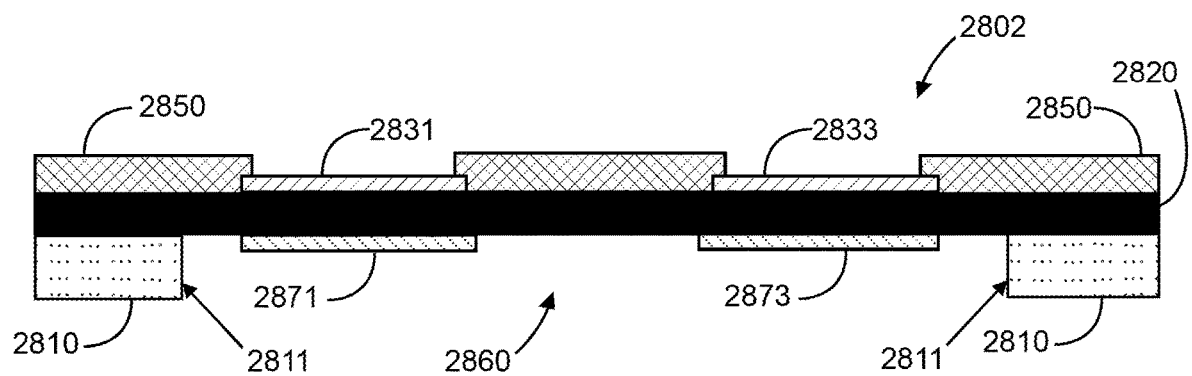
FIG. 28B is a simplified diagram illustrating a cross-sectional view of the multiple acoustic resonator device shown in FIG. 28A.

FIG. 28B is a simplified diagram illustrating a cross-sectional view of the multiple acoustic resonator device shown in FIG. 28A. The device elements, methods, and techniques described above can be combined with any device elements, methods, and techniques described in the following figures. Those of ordinary skill in the art will recognize other variations, modifications, and alternatives.

Figure 29A:
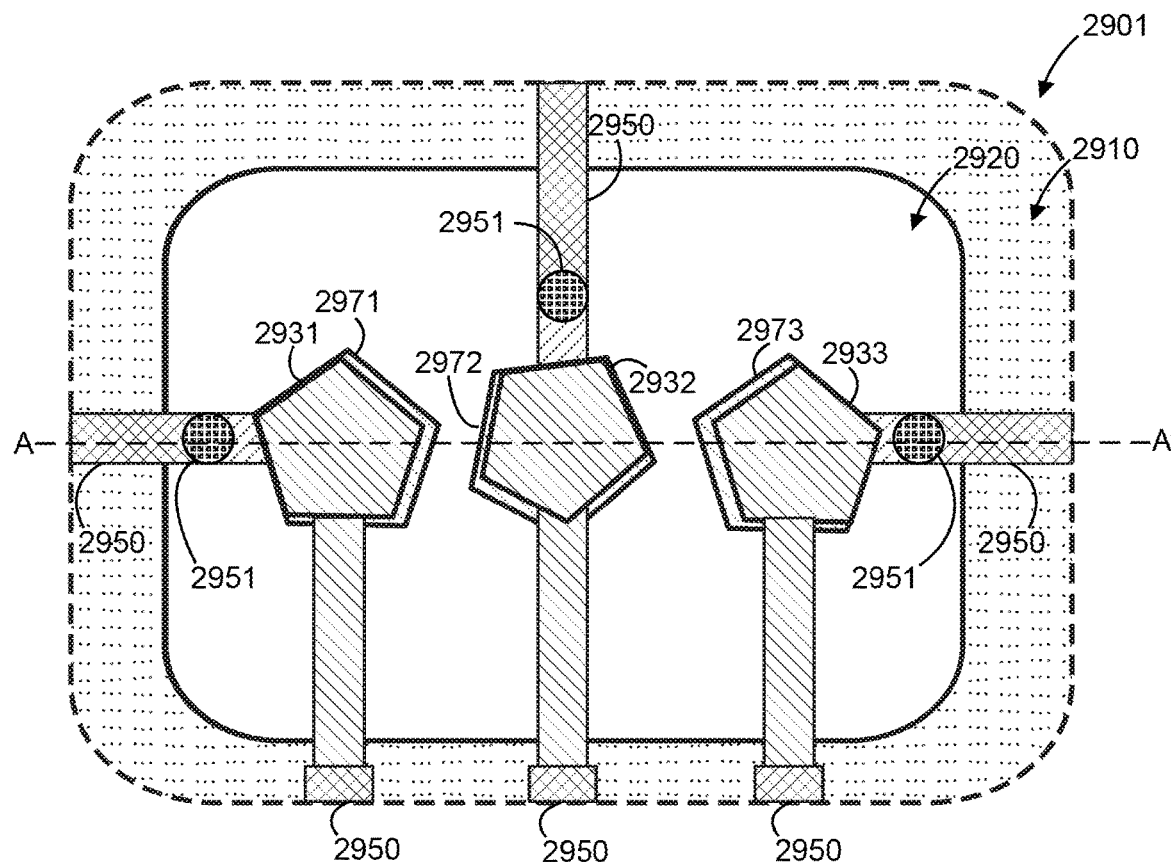
FIG. 29A is a simplified diagram illustrating a top view of a multiple acoustic resonator device according to an example of the present invention.

FIG. 29A is a simplified diagram illustrating a top view of a multiple acoustic resonator device according to an example of the present invention. As shown, device 2901 includes the same three separate resonators, each having a topside (2931, 2932, 2933) and backside (2971, 2972, 2973) metal electrodes. Here, each of the topside metal electrodes are electrically coupled to metal pads 2950 that are electrically coupled to vias 2951 within the backside cavity region.

Figure 29B:
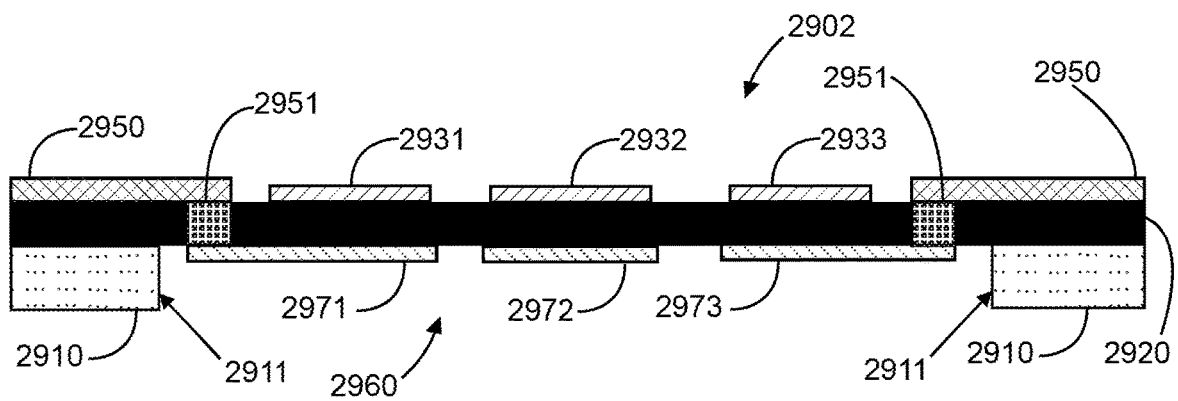
FIG. 29B is a simplified diagram illustrating a cross-sectional view of the multiple acoustic resonator device shown in FIG. 29A.

FIG. 29B is a simplified diagram illustrating a cross-sectional view of the multiple acoustic resonator device shown in FIG. 29A. The device elements, methods, and techniques described above can be combined with any device elements, methods, and techniques described in the following figures. Those of ordinary skill in the art will recognize other variations, modifications, and alternatives.

Figure 30A:
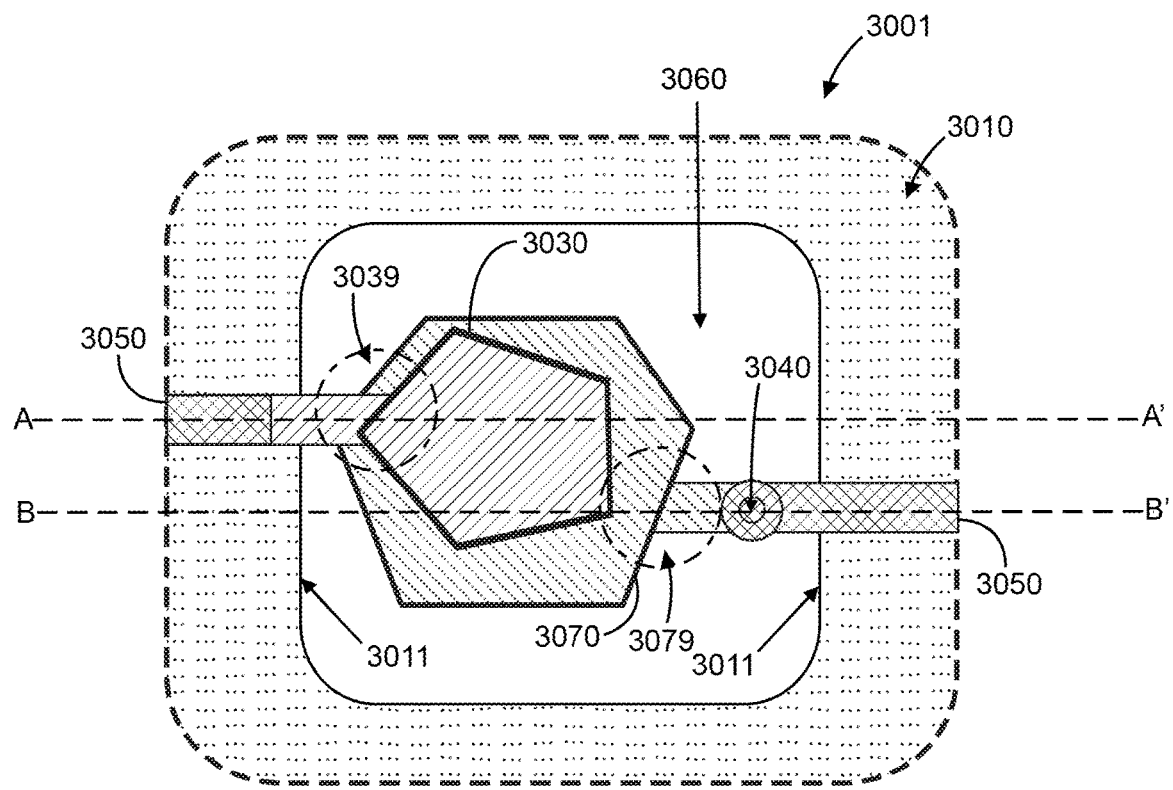
FIG. 30A is a simplified diagram illustrating a top view of an acoustic resonator device according to an example of the present invention, which is further described in FIGS. 31A through 39D.

FIG. 30A is a simplified diagram illustrating a top view of an acoustic resonator device according to an example of the present invention. FIG. 30A is similar to FIG. 19A except that the connections between the topside metal electrode 3030 and one of the metal pads 3050 and between the backside metal electrode 3070 and another of the metal pages 3050 are not spatially configured within the same horizontal plane. The topside connection (TC) is marked by region 3039, while the backside connection (BC) is marked by region 3079. Although this figure shows this particular offset configuration, the present invention contemplates that the TC and BC connection regions can be configured along any edge of the topside and backside metal electrodes, respectively. In each of the following examples, the modifications can be implemented on the topside of the piezoelectric layer, the backside of the piezoelectric layer, or both.

Figure 30B:
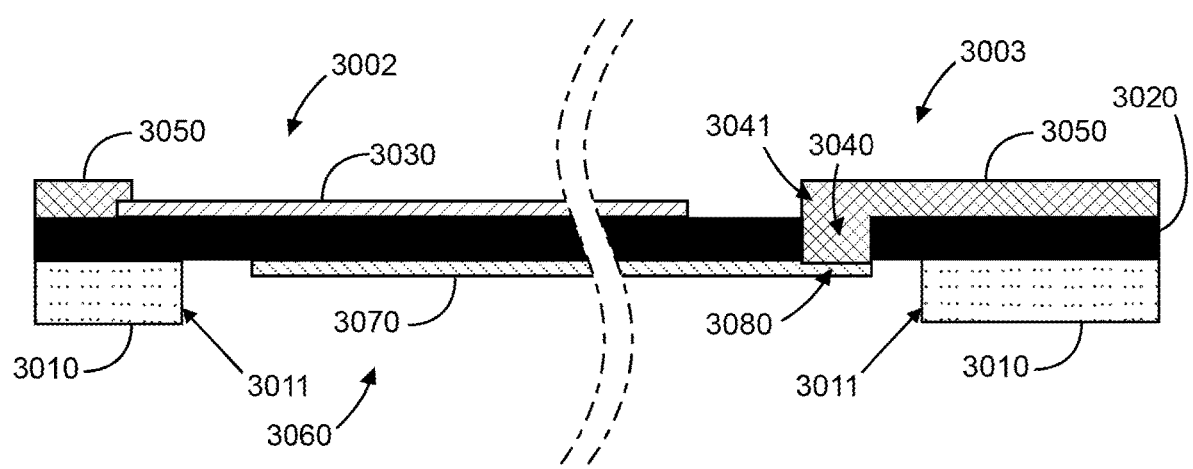
FIG. 30B is a simplified diagram illustrating a cross-sectional view of the acoustic resonator device shown in FIG. 30A, which is further described in FIGS. 31A through 39D.

FIG. 30B is a simplified diagram illustrating a cross-sectional view of the acoustic resonator device shown in FIG. 30A. A dotted line separates device portion 3002 (as defined by portion 3039 in FIG. 30A), which shows the cross-section near the TC region, and device portion 3003 (as defined by portion 3040 in FIG. 30A), which shows the cross-section near the BC region. The device elements, methods, and techniques described above can be combined with any device elements, methods, and techniques described in the following figures. Those of ordinary skill in the art will recognize other variations, modifications, and alternatives.

In an example, the present invention provides several methods for improving the resonator Q factor by various structural configurations upon the topside, the backside, or both. As a note, the central area of the resonator is defined as the area of the resonator that is comprised of the sandwich of the topside electrode, the piezoelectric layer, and the backside electrode, where the topside and backside electrode are without modification. This means that that uniform area of the central portion of the resonator, excluding the edges of the resonator where the perimeter may be modified in a variety of ways according to examples of the present invention. Additionally, the piezoelectric layer may refer to single crystal or polycrystalline piezoelectric layers. In a specific example, the crystalline material of the piezoelectric layer may be substantially or essentially single crystal with a combination of single crystal and polycrystalline materials. In each of the following examples, the modifications can be implemented on the topside of the piezoelectric layer, the backside of the piezoelectric layer, or both.

Figure 31A:
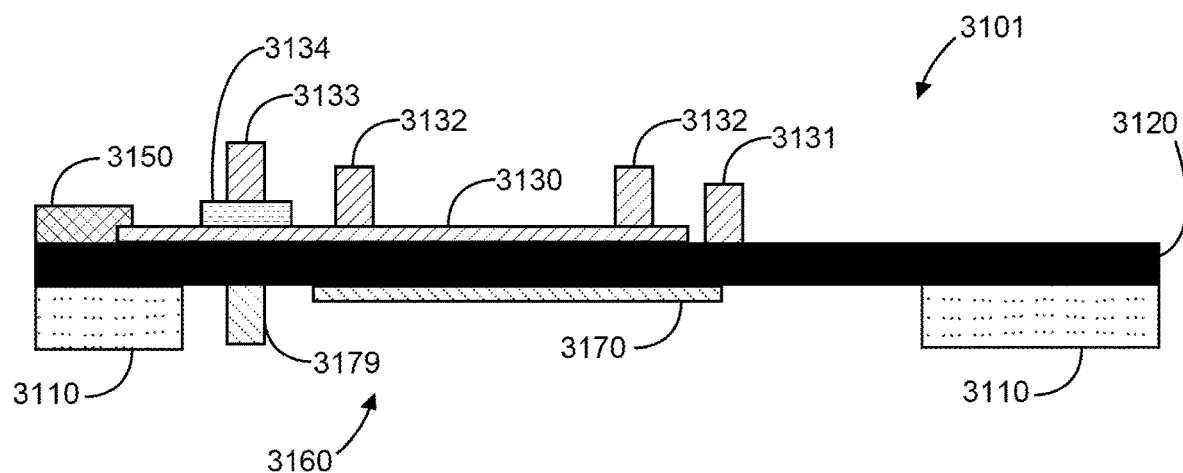
FIG. 31A is a simplified diagram illustrating a first cross-sectional view of an acoustic resonator device with topside metal perimeter structure modifications according to an example of the present invention.

FIG. 31A is a simplified diagram illustrating a first cross-sectional view of an acoustic resonator device with topside metal perimeter structure modifications according to an example of the present invention. FIG. 31A is similar to FIG. 30B with the addition of forming a topside pillar structure 3131 overlying a portion of the top piezoelectric surface region within a vicinity of the topside metal electrode and outside of the topside metal electrode perimeter.

In an example, the topside pillar structure 3131, as with any pillar structure or pillar, can include a metal material, a dielectric material, or a combination thereof This pillar structure 3131 can be spatially configured around the perimeter of the topside metal electrode and can be a continuous pillar structure or comprised of one or more non-continuous pillars. In a specific example, the topside pillar structure includes a gap region within a vicinity of the TC region or the BC region. In this case, the topside pillar structure comprises a metal material. Also, one or more optional backside pillars 3179 can be formed underlying a portion of the bottom piezoelectric surface region. The device 3101 can also include one or more combination electrode pillars formed overlying a portion of the topside electrode surface region. The combination electrode pillars comprises a metal pillar 3133 formed overlying a dielectric pillar 3134. The device 3101 can also include a topside electrode pillar structure formed overlying a portion of the topside electrode surface region and within the topside metal electrode perimeter. The topside electrode pillar structure can be spatially configured substantially along the topside electrode perimeter and can also be a continuous pillar structure or comprise one or more non-continuous pillars. This topside electrode pillar structure can also include a gap region within a vicinity of the TC or BC regions.

Figure 31B:
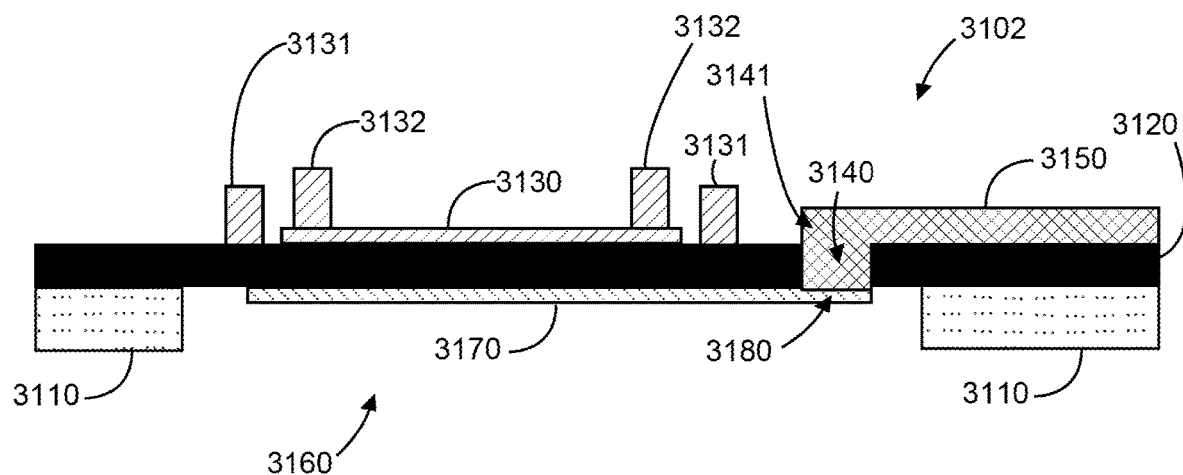
FIG. 31B is a simplified diagram illustrating a second cross-sectional view of the acoustic resonator device shown in FIG. 31A.

FIG. 31B is a simplified diagram illustrating a second cross-sectional view of the acoustic resonator device shown in FIG. 31A. This view shows the region near BC, which is near the micro-trench 3140. As shown, device 3102 includes the topside pillar structure 3131 and the topside electrode pillar structure 3132.

Figure 31C:
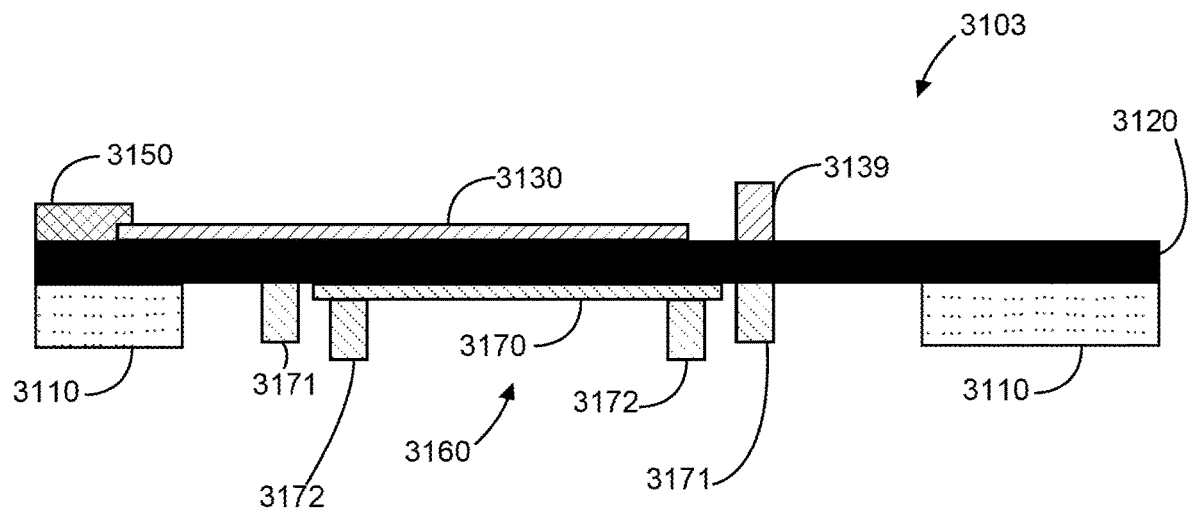
FIG. 31C is a simplified diagram illustrating a first cross-sectional view of an acoustic resonator device with backside metal perimeter structure modifications according to an example of the present invention.

FIG. 31C is a simplified diagram illustrating a first cross-sectional view of an acoustic resonator device with backside metal perimeter structure modifications according to an example of the present invention. As shown, device 3103 is the backside configuration of device 3102 in FIG. 31B. Here, the backside metal pillar structure 3171 and backside metal electrode pillar structure 3172 are formed near the TC region, along with an optional topside pillar 3139.

Figure 31D:
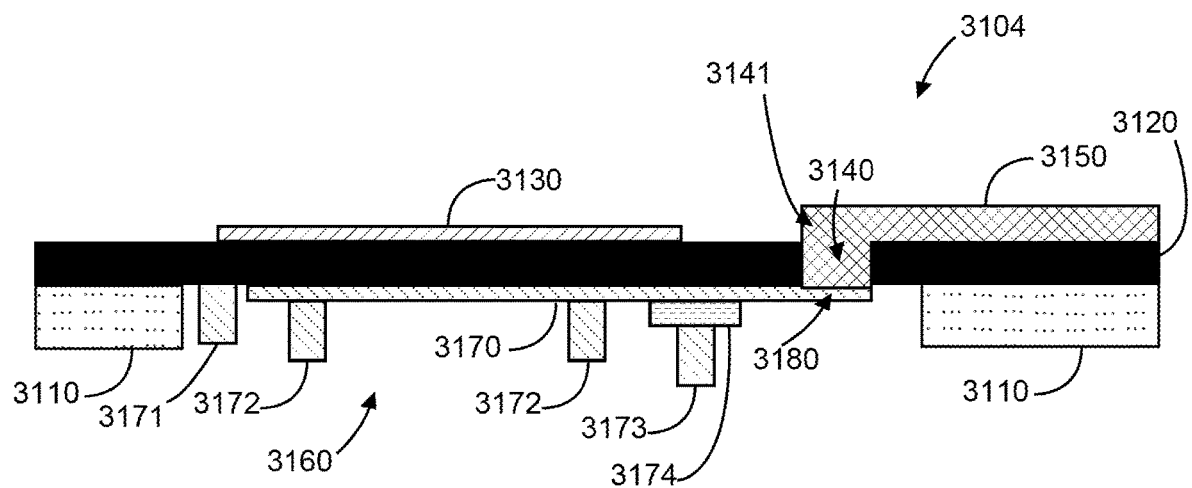
FIG. 31D is a simplified diagram illustrating a second cross-sectional view of the acoustic resonator device shown in FIG. 31C.

FIG. 31D is a simplified diagram illustrating a second cross-sectional view of the acoustic resonator device shown in FIG. 31C. As shown, device 3104 is the backside configuration of device 3101 in FIG. 31A. Here, the backside metal pillar structure 3171 and backside metal electrode pillar structure 3172 are formed near the BC region, along with an combination backside pillar (3173, 3174). The device elements, methods, and techniques described above can be combined with any device elements, methods, and techniques described in the following figures. Those of ordinary skill in the art will recognize other variations, modifications, and alternatives.

Figure 32A:
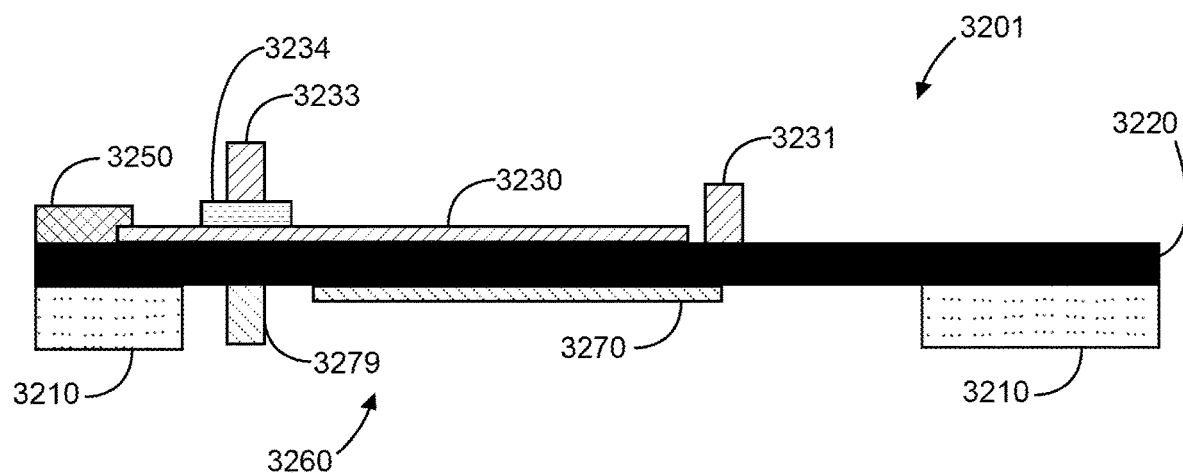
FIG. 32A is a simplified diagram illustrating a first cross-sectional view of an acoustic resonator device with topside metal perimeter structure modifications according to an example of the present invention.

FIG. 32A is a simplified diagram illustrating a first cross-sectional view of an acoustic resonator device with topside metal perimeter structure modifications according to an example of the present invention. FIG. 32A is similar to FIG. 31A except the topside electrode pillar structure is omitted. The reference numerals for the elements shown in FIG. 32A-32D match those elements shown in FIGS. 31A-31D except that the FIG. 32 numerals start with the prefix "32" as opposed to the FIG. 31 numerals, which start with the prefix "31."

Figure 32B:
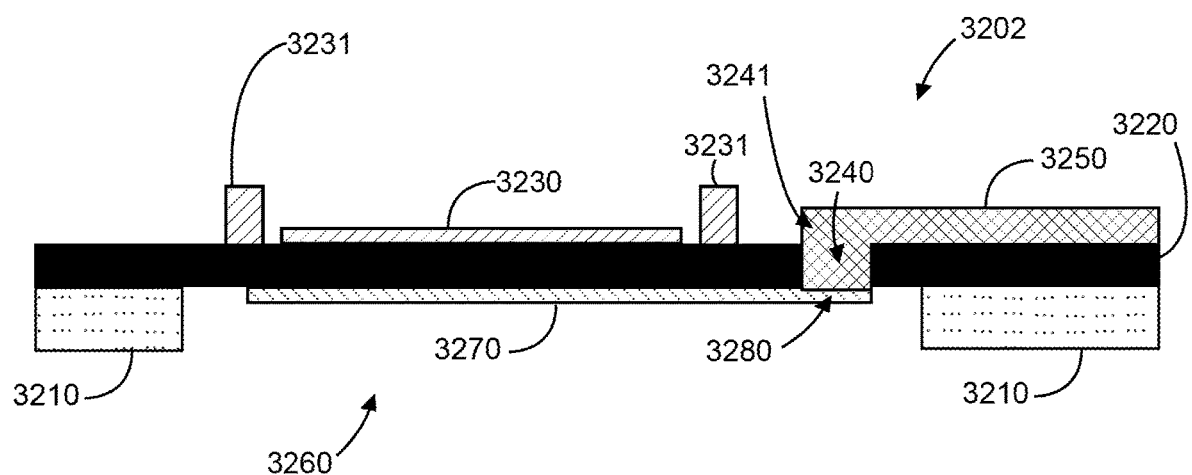
FIG. 32B is a simplified diagram illustrating a second cross-sectional view of the acoustic resonator device shown in FIG. 32A.

FIG. 32B is a simplified diagram illustrating a second cross-sectional view of the acoustic resonator device shown in FIG. 32A. FIG. 32B is similar to FIG. 31B except the topside electrode pillar structure is omitted.

Figure 32C:
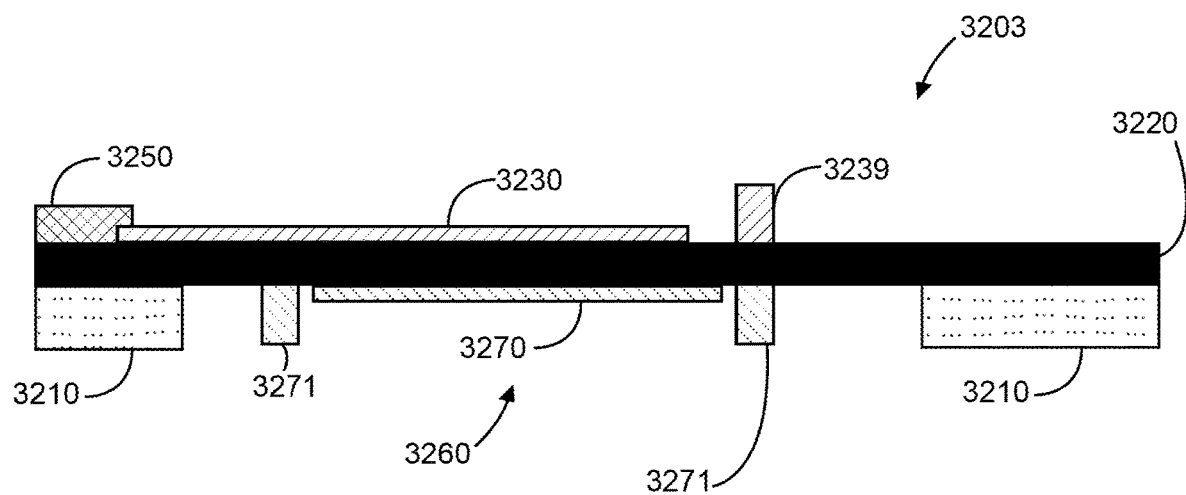
FIG. 32C is a simplified diagram illustrating a first cross-sectional view of an acoustic resonator device with backside metal perimeter structure modifications according to an example of the present invention.

FIG. 32C is a simplified diagram illustrating a first cross-sectional view of an acoustic resonator device with backside metal perimeter structure modifications according to an example of the present invention. FIG. 32C is similar to FIG. 31C except the backside electrode pillar structure is omitted.

Figure 32D:
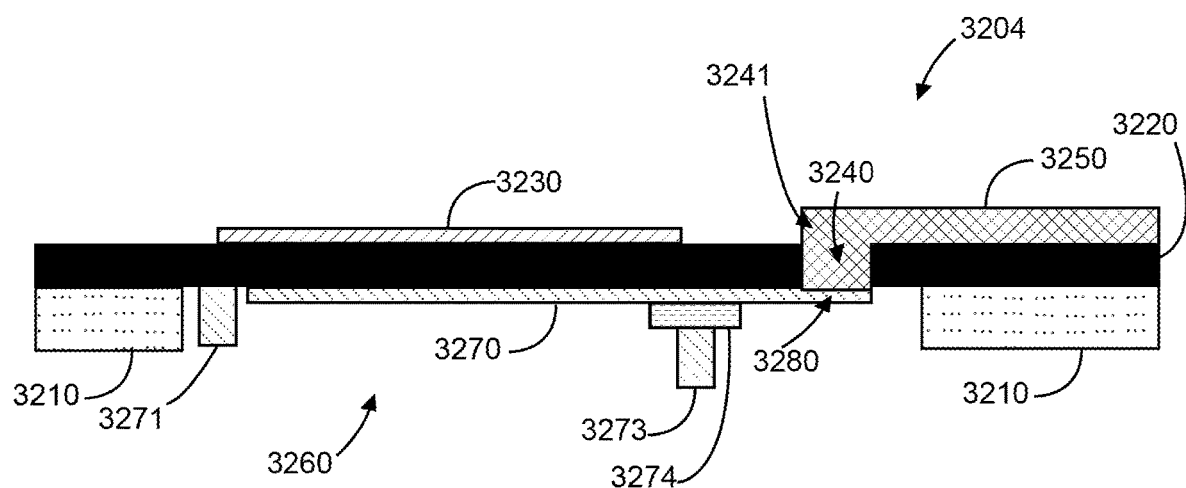
FIG. 32D is a simplified diagram illustrating a second cross-sectional view of the acoustic resonator device shown in FIG. 32C.

FIG. 32D is a simplified diagram illustrating a second cross-sectional view of the acoustic resonator device shown in FIG. 32C. FIG. 32D is similar to FIG. 31D except the backside electrode pillar structure is omitted. The device elements, methods, and techniques described above can be combined with any device elements, methods, and techniques described in the following figures. Those of ordinary skill in the art will recognize other variations, modifications, and alternatives.

Figure 33A:
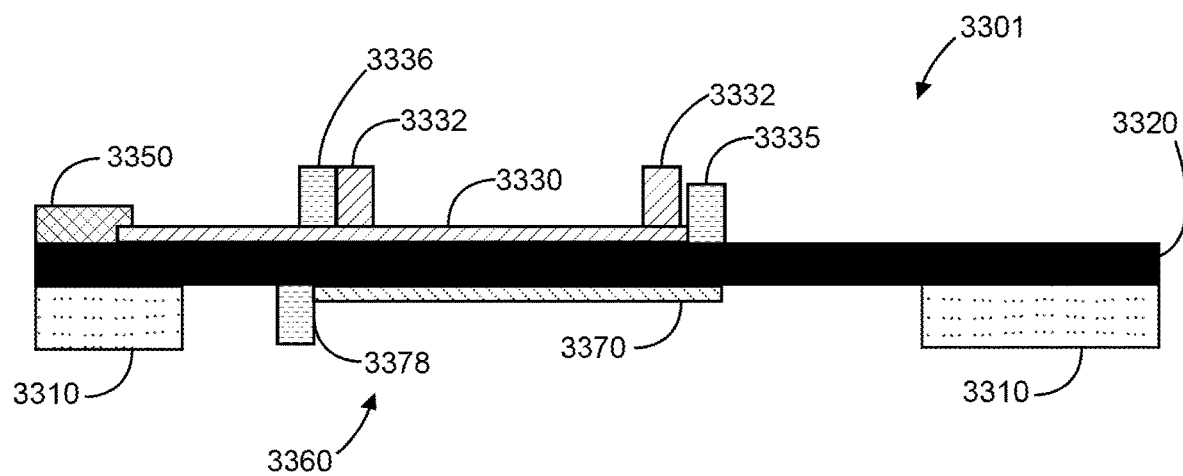
FIG. 33A is a simplified diagram illustrating a first cross-sectional view of an acoustic resonator device with topside dielectric perimeter structure modifications according to an example of the present invention.

FIG. 33A is a simplified diagram illustrating a first cross-sectional view of an acoustic resonator device with topside dielectric perimeter structure modifications according to an example of the present invention. The reference numerals for the elements shown in FIG. 33A-33D match those elements shown in FIGS. 31A-31D except that the FIG. 33 numerals start with the prefix "33" as opposed to the FIG. 31 numerals, which start with the prefix "31." As shown, device 3301 includes a topside dielectric pillar structure 3335 formed within a vicinity of the topside electrode perimeter or adjacent to the topside metal electrode 3330. Another dielectric pillar 3336 can also be formed adjacent to the topside electrode pillar structure 3332. The optional dielectric pillar 3378 is can also be formed adjacent to the backside metal electrode 3370.

Figure 33B:
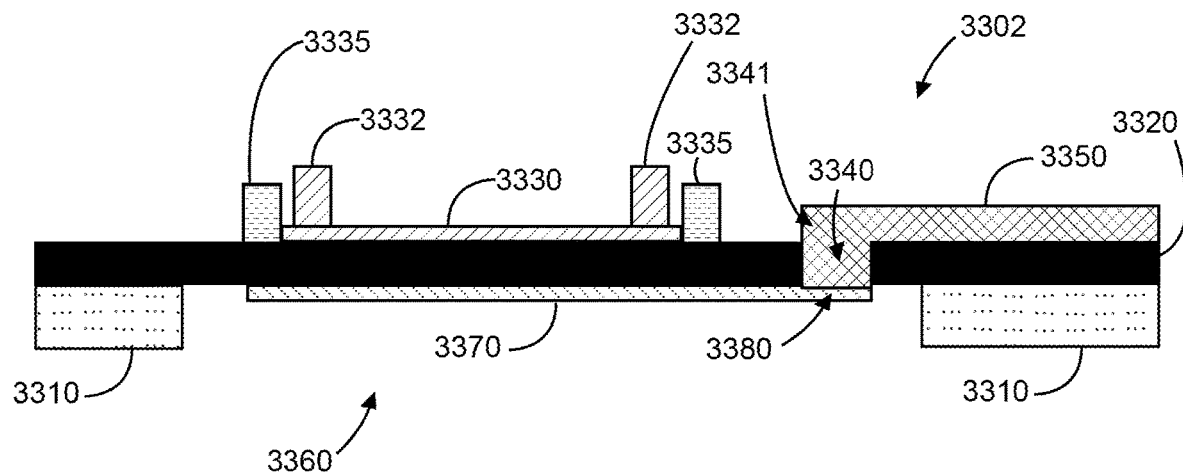
FIG. 33B is a simplified diagram illustrating a second cross-sectional view of the acoustic resonator device shown in FIG. 33A.

FIG. 33B is a simplified diagram illustrating a second cross-sectional view of the acoustic resonator device shown in FIG. 33A. As shown, device 3302 includes the topside dielectric pillar structure 3335 formed adjacent to the topside metal electrode 3330.

Figure 33C:
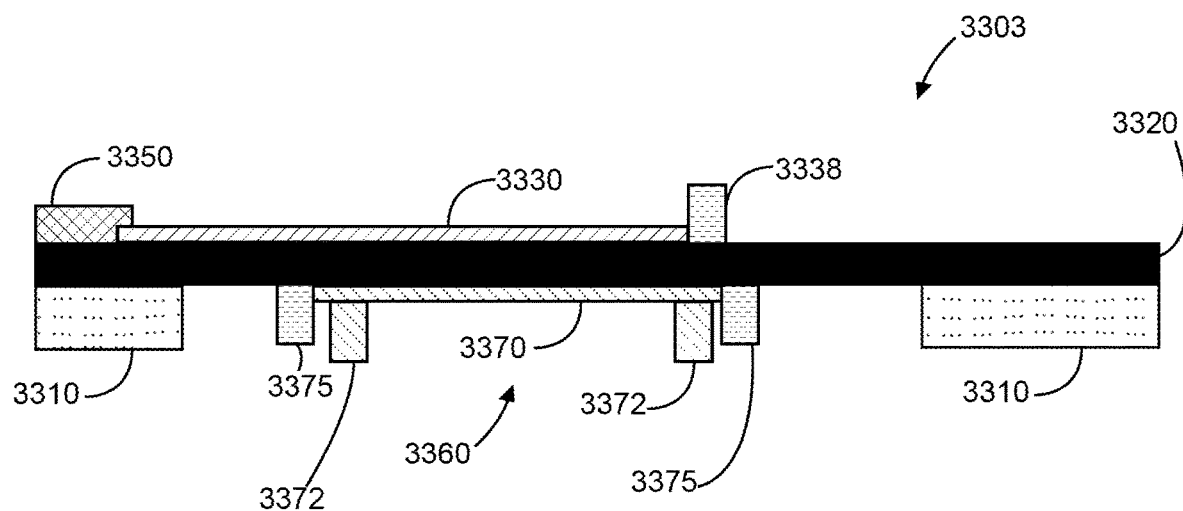
FIG. 33C is a simplified diagram illustrating a first cross-sectional view of an acoustic resonator device with backside dielectric perimeter structure modifications according to an example of the present invention.

FIG. 33C is a simplified diagram illustrating a first cross-sectional view of an acoustic resonator device with backside dielectric perimeter structure modifications according to an example of the present invention. As shown, device 3303 is the backside configuration of device 3302 in FIG. 33B. Here, a dielectric pillars 3338 is formed adjacent to the topside metal electrode 3330. Further, dielectric pillars 3375 are formed adjacent to the backside metal electrode 3370.

Figure 33D:
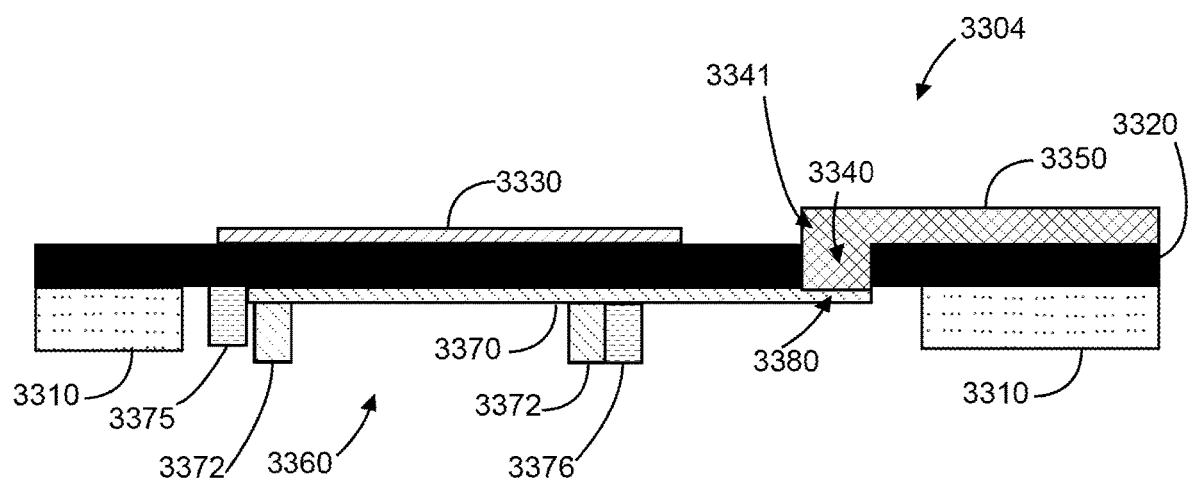
FIG. 33D is a simplified diagram illustrating a second cross-sectional view of the acoustic resonator device shown in FIG. 33C.

FIG. 33D is a simplified diagram illustrating a second cross-sectional view of the acoustic resonator device shown in FIG. 33C. As shown, device 3304 is the backside configuration of device 3301 in FIG. 33A. Here, a dielectric pillar 3376 can be formed underlying the backside metal electrode 3370 and adjacent to one of the backside metal electrode pillars 3372. The device elements, methods, and techniques described above can be combined with any device elements, methods, and techniques described in the following figures. Those of ordinary skill in the art will recognize other variations, modifications, and alternatives.

Figure 34A:
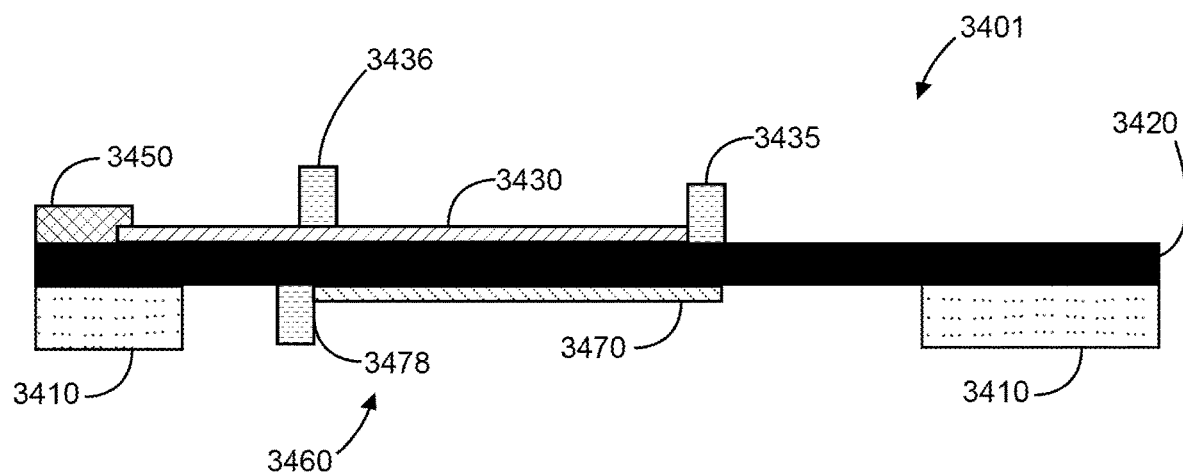
FIG. 34A is a simplified diagram illustrating a first cross-sectional view of an acoustic resonator device with topside dielectric perimeter structure modifications according to an example of the present invention.

FIG. 34A is a simplified diagram illustrating a first cross-sectional view of an acoustic resonator device with topside dielectric perimeter structure modifications according to an example of the present invention. FIG. 34A is similar to FIG. 33A except the topside electrode pillar structure is omitted. The reference numerals for the elements shown in FIG. 34A-34D match those elements shown in FIGS. 33A-33D except that the FIG. 34 numerals start with the prefix "34" as opposed to the FIG. 33 numerals, which start with the prefix "33."

Figure 34B:
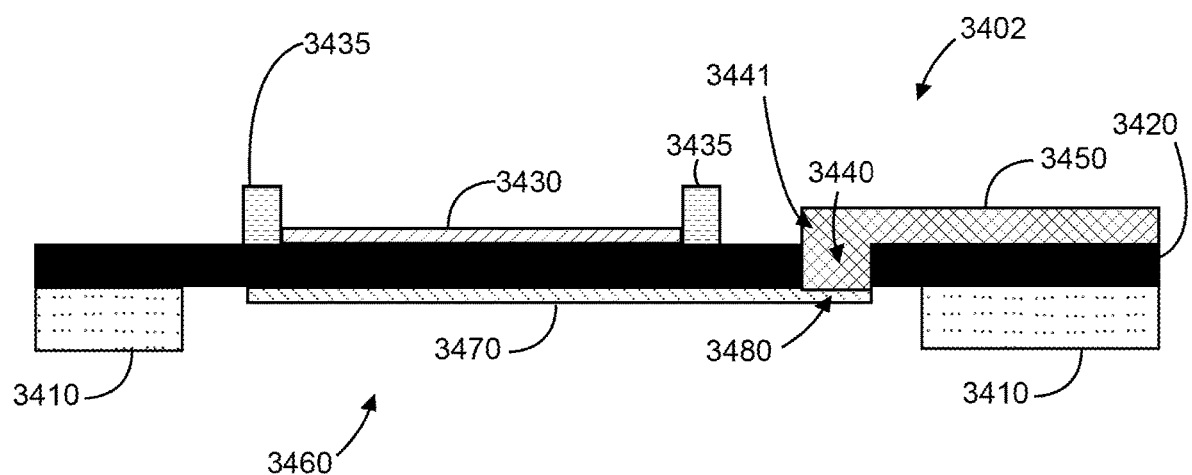
FIG. 34B is a simplified diagram illustrating a second cross-sectional view of the acoustic resonator device shown in FIG. 34A.

FIG. 34B is a simplified diagram illustrating a second cross-sectional view of the acoustic resonator device shown in FIG. 34A. FIG. 34B is similar to FIG. 33B except the topside electrode pillar structure is omitted.

Figure 34C:
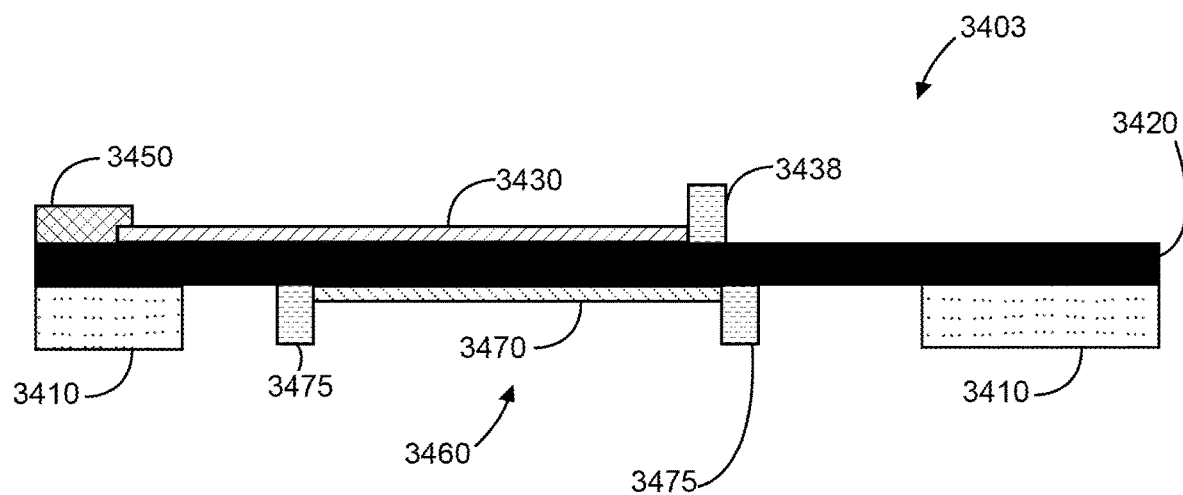
FIG. 34C is a simplified diagram illustrating a first cross-sectional view of an acoustic resonator device with backside dielectric perimeter structure modifications according to an example of the present invention.

FIG. 34C is a simplified diagram illustrating a first cross-sectional view of an acoustic resonator device with backside dielectric perimeter structure modifications according to an example of the present invention. FIG. 34C is similar to FIG. 34C except the backside electrode pillar structure is omitted.

Figure 34D:
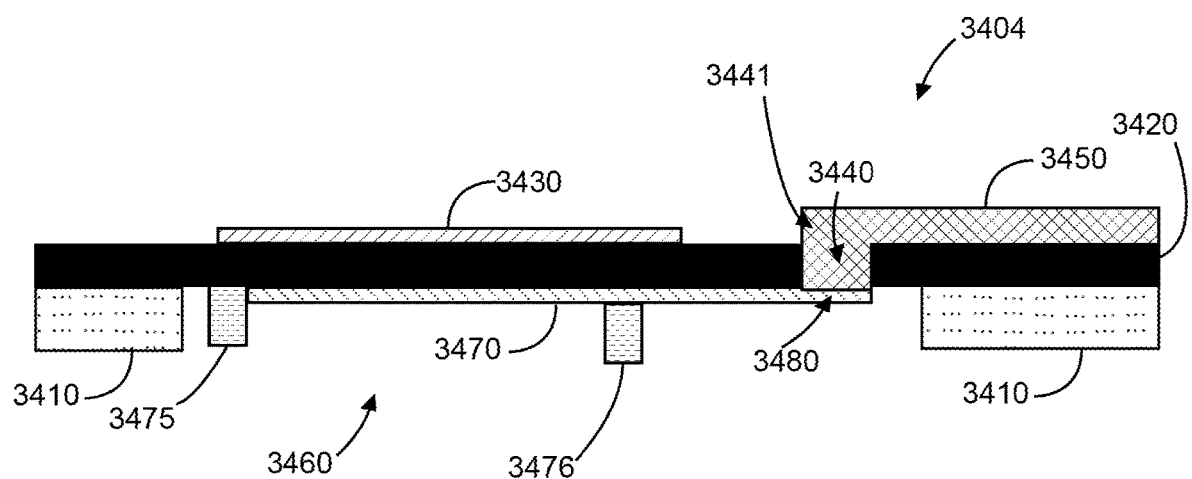
FIG. 34D is a simplified diagram illustrating a second cross-sectional view of the acoustic resonator device shown in FIG. 34C.

FIG. 34D is a simplified diagram illustrating a second cross-sectional view of the acoustic resonator device shown in FIG. 34C. FIG. 34D is similar to FIG. 33D except the backside electrode pillar structure is omitted. The device elements, methods, and techniques described above can be combined with any device elements, methods, and techniques described in the following figures. Those of ordinary skill in the art will recognize other variations, modifications, and alternatives.

Figure 35A:
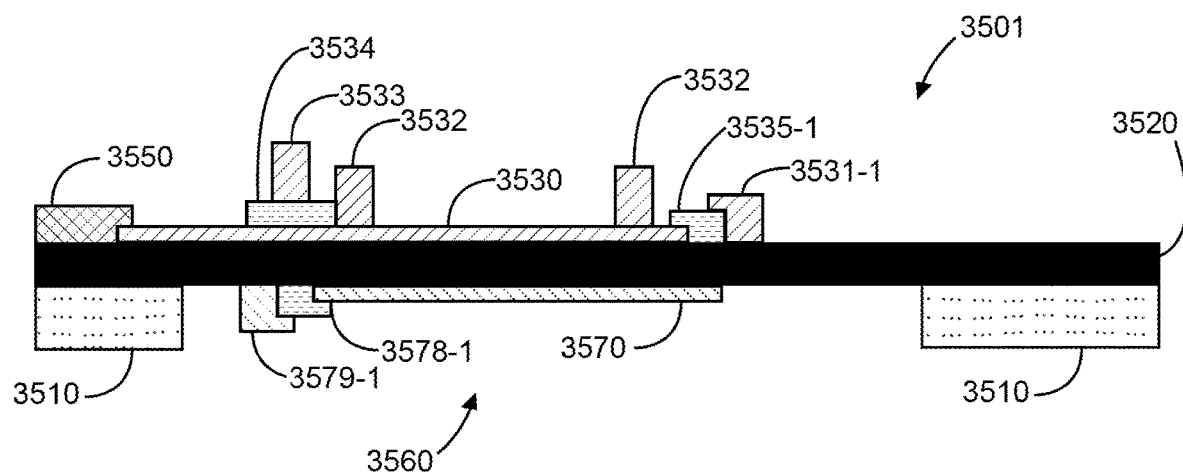
FIG. 35A is a simplified diagram illustrating a first cross-sectional view of an acoustic resonator device with topside dielectric and metal perimeter structure modifications according to an example of the present invention.

FIG. 35A is a simplified diagram illustrating a first cross-sectional view of an acoustic resonator device with topside dielectric and metal perimeter structure modifications according to an example of the present invention. As shown, device 3501 includes the topside electrode metal pillar structure 3532 and the topside combination pillar (3533, 3534) formed adjacent to the pillar structure 3532. This device 3501 also include a dielectric pillar structure 3535-1, which has an overlap portion overlying a portion of the topside metal electrode 3530, and a metal pillar structure 3531-1, which has an overlap portion overlying a portion of the dielectric pillar structure 3535-1. The optional pillars are similarly configured with the dielectric pillar 3578-1 and metal pillar 3579-1. The reference numerals for any remaining undiscussed elements shown in FIG. 35A-35D match those elements shown in FIGS. 31A-31D except that the FIG. 35 numerals start with the prefix "35" as opposed to the FIG. 31 numerals, which start with the prefix "31."

Figure 35B:
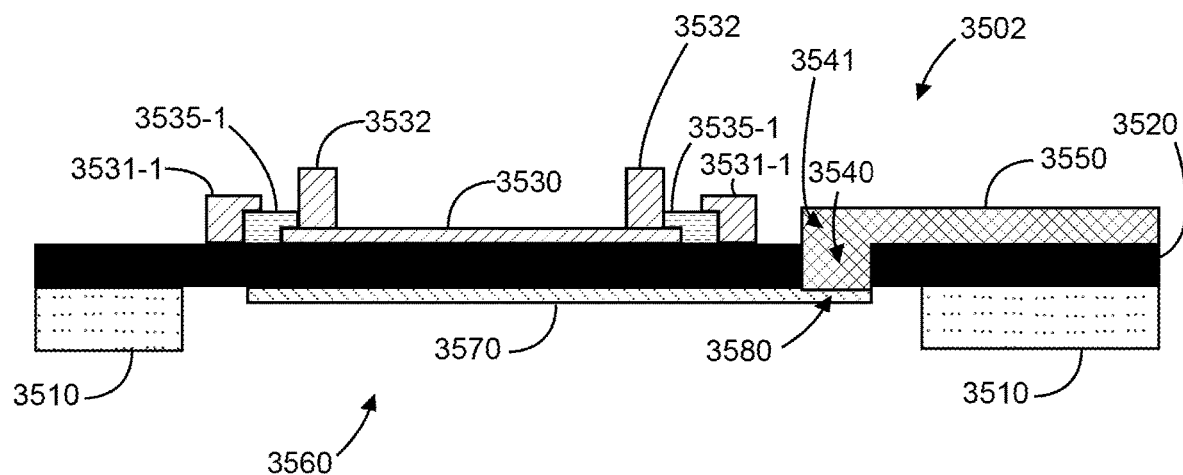
FIG. 35B is a simplified diagram illustrating a second cross-sectional view of the acoustic resonator device shown in FIG. 35A.

FIG. 35B is a simplified diagram illustrating a second cross-sectional view of the acoustic resonator device shown in FIG. 35A. Here, the combination pillar structure, including dielectric pillar structure 3535-1 and metal pillar structure 3531-1, are similarly configured and adjacent to the topside electrode metal pillar structure 3532.

Figure 35C:
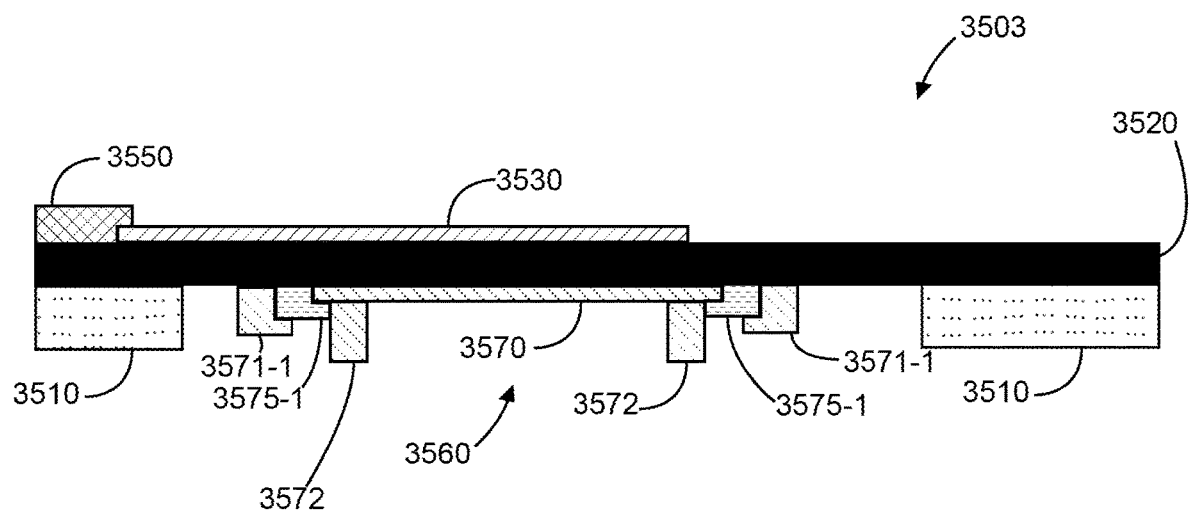
FIG. 35C is a simplified diagram illustrating a first cross-sectional view of an acoustic resonator device with backside dielectric and metal perimeter structure modifications according to an example of the present invention.

FIG. 35C is a simplified diagram illustrating a first cross-sectional view of an acoustic resonator device with backside dielectric and metal perimeter structure modifications according to an example of the present invention. As shown, device 3503 is the backside configuration of device 3502 in FIG. 35B.

Figure 35D:
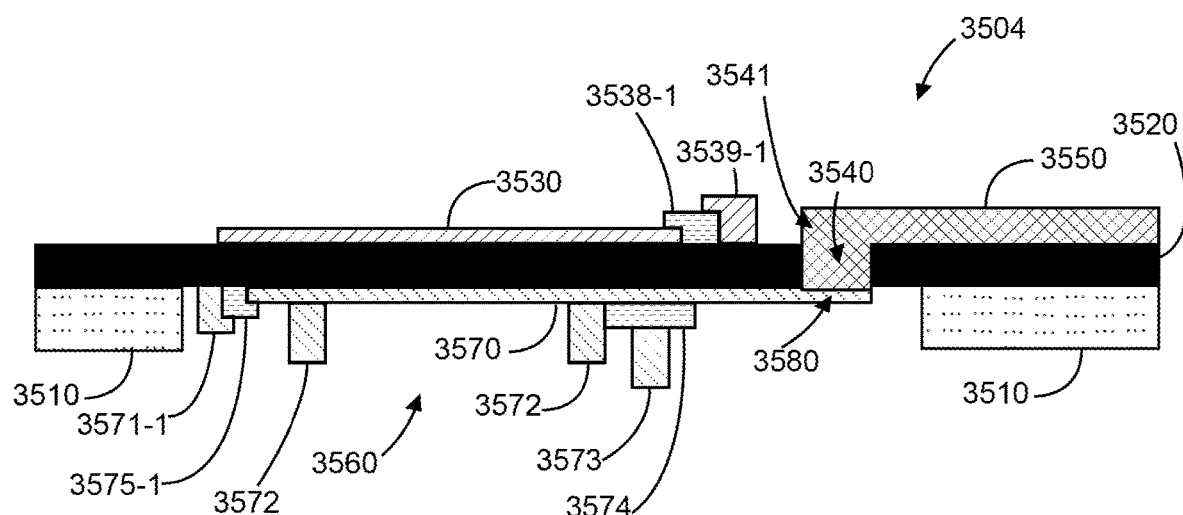
FIG. 35D is a simplified diagram illustrating a second cross-sectional view of the acoustic resonator device shown in FIG. 35C.

FIG. 35D is a simplified diagram illustrating a second cross-sectional view of the acoustic resonator device shown in FIG. 35C. As shown, device 3504 is the backside configuration of device 3501 in FIG. 35A. The device elements, methods, and techniques described above can be combined with any device elements, methods, and techniques described in the following figures. Those of ordinary skill in the art will recognize other variations, modifications, and alternatives.

Figure 36A:
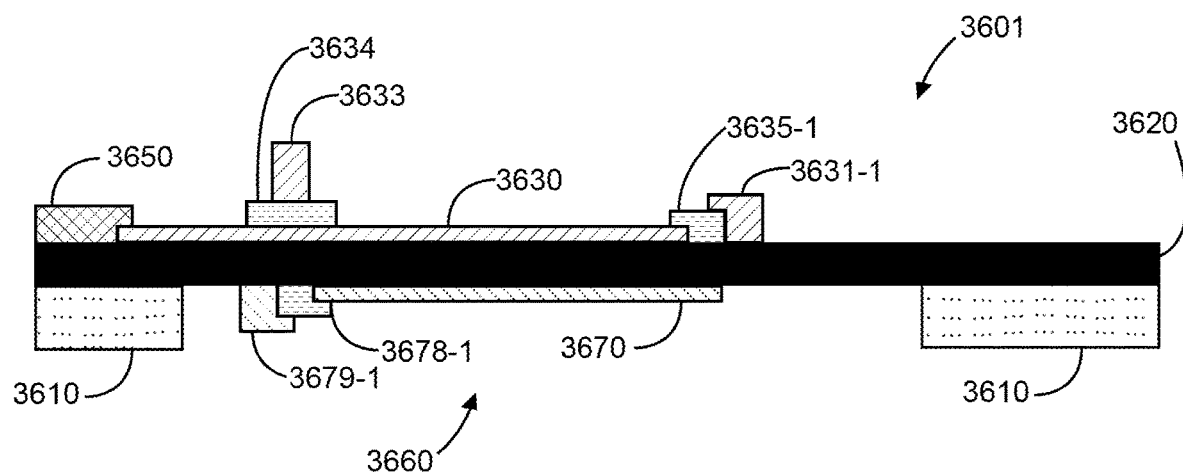
FIG. 36A is a simplified diagram illustrating a first cross-sectional view of an acoustic resonator device with topside dielectric and metal perimeter structure modifications according to an example of the present invention.

FIG. 36A is a simplified diagram illustrating a first cross-sectional view of an acoustic resonator device with topside dielectric and metal perimeter structure modifications according to an example of the present invention. FIG. 36A is similar to FIG. 35A except the topside electrode pillar structure is omitted. The reference numerals for the elements shown in FIG. 36A-36D match those elements shown in FIGS. 35A-35D except that the FIG. 36 numerals start with the prefix "36" as opposed to the FIG. 35 numerals, which start with the prefix "35."

Figure 36B:
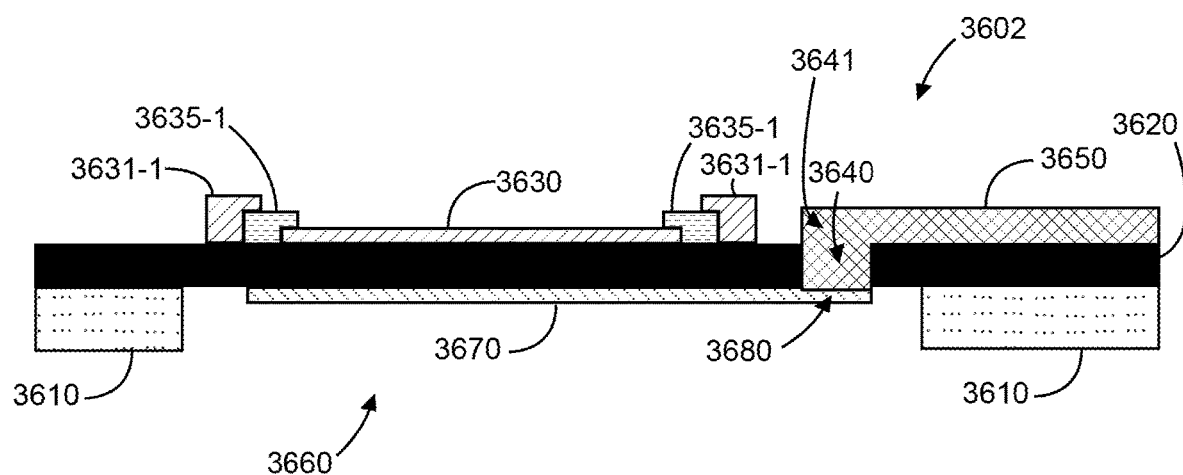
FIG. 36B is a simplified diagram illustrating a second cross-sectional view of the acoustic resonator device shown in FIG. 36A.

FIG. 36B is a simplified diagram illustrating a second cross-sectional view of the acoustic resonator device shown in FIG. 36A. FIG. 36B is similar to FIG. 35B except the topside electrode pillar structure is omitted.

Figure 36C:
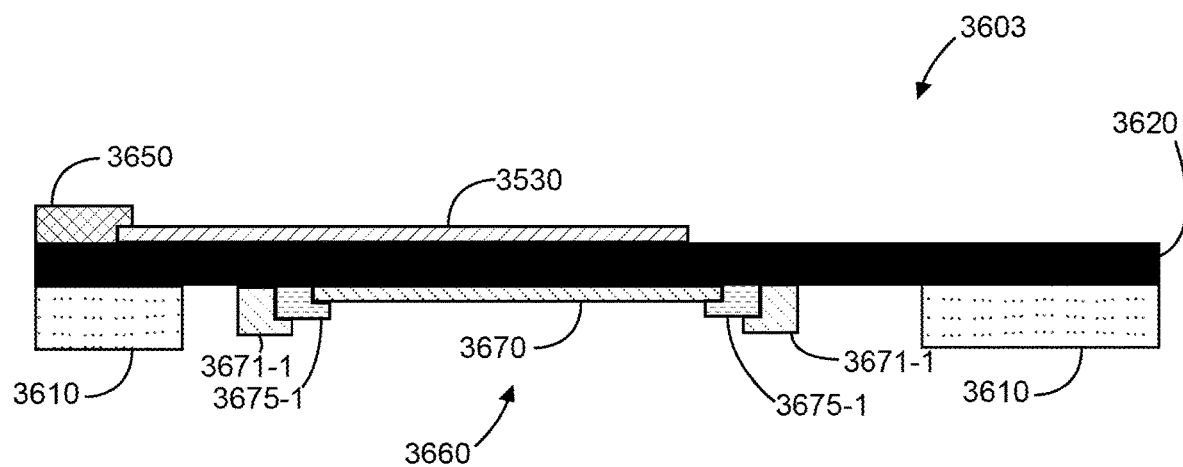
FIG. 36C is a simplified diagram illustrating a first cross-sectional view of an acoustic resonator device with backside dielectric and metal perimeter structure modifications according to an example of the present invention.

FIG. 36C is a simplified diagram illustrating a first cross-sectional view of an acoustic resonator device with backside dielectric and metal perimeter structure modifications according to an example of the present invention. FIG. 36C is similar to FIG. 35C except the backside electrode pillar structure is omitted.

Figure 36D:
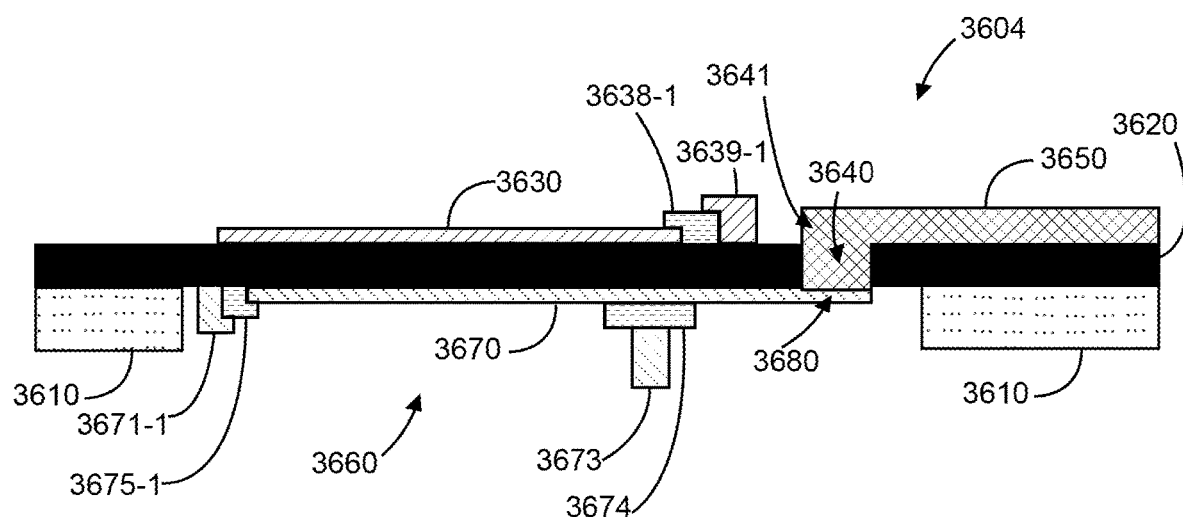
FIG. 36D is a simplified diagram illustrating a second cross-sectional view of the acoustic resonator device shown in FIG. 36C.

FIG. 36D is a simplified diagram illustrating a second cross-sectional view of the acoustic resonator device shown in FIG. 36C. FIG. 36D is similar to FIG. 35D except the backside electrode pillar structure is omitted. The device elements, methods, and techniques described above can be combined with any device elements, methods, and techniques described in the following figures. Those of ordinary skill in the art will recognize other variations, modifications, and alternatives.

Figure 37A:
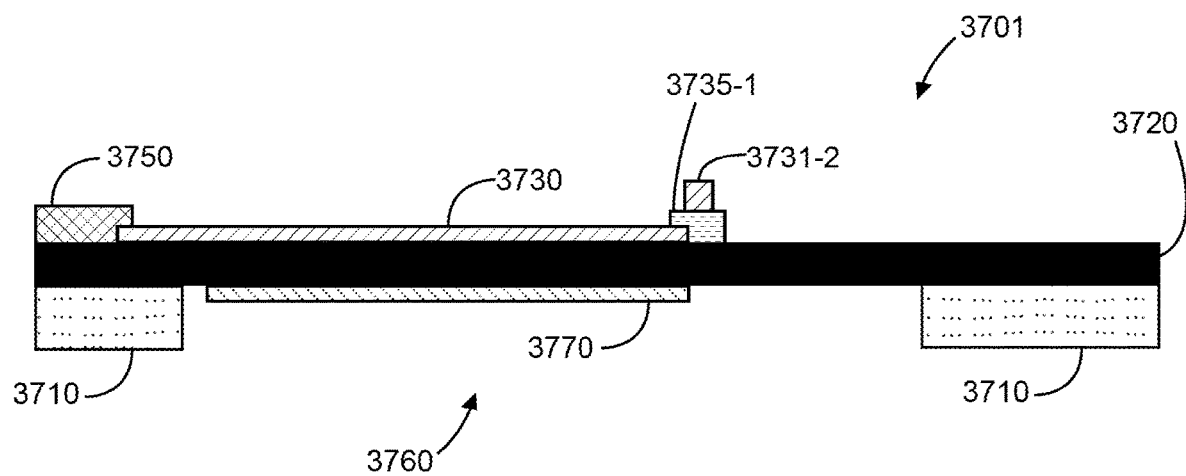
FIG. 37A is a simplified diagram illustrating a first cross-sectional view of an acoustic resonator device with topside dielectric and metal perimeter structure modifications according to an example of the present invention.

FIG. 37A is a simplified diagram illustrating a first cross-sectional view of an acoustic resonator device with topside dielectric and metal perimeter structure modifications according to an example of the present invention. As shown, device 3701 includes a combination pillar structure with a dielectric pillar structure 3735-1 with an overlying metal pillar structure 3731-2. Here, the metal pillar structure 3731-2 does not overlap the dielectric pillar structure 3735-1. The reference numerals for any remaining undiscussed elements shown in FIG. 37A-37D match those elements shown in FIGS. 35A-35D except that the FIG. 37 numerals start with the prefix "37" as opposed to the FIG. 35 numerals, which start with the prefix "35."

Figure 37B:
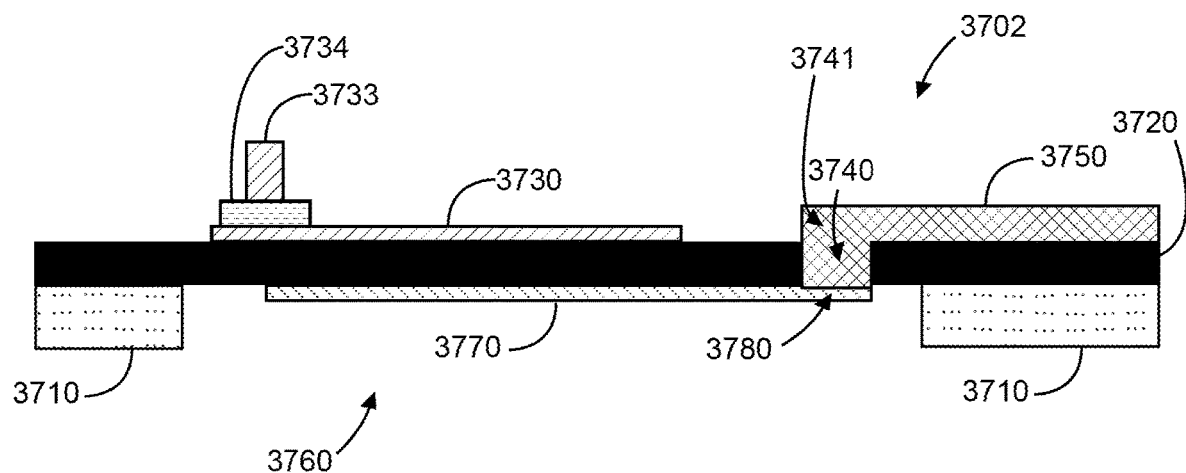
FIG. 37B is a simplified diagram illustrating a second cross-sectional view of the acoustic resonator device shown in FIG. 37A.

FIG. 37B is a simplified diagram illustrating a second cross-sectional view of the acoustic resonator device shown in FIG. 37A. As shown, device 3702 includes a combination pillar, including dielectric pillar 3734 with an overlying metal pillar 3733, formed overlying a portion of the topside metal electrode 3730.

Figure 37C:
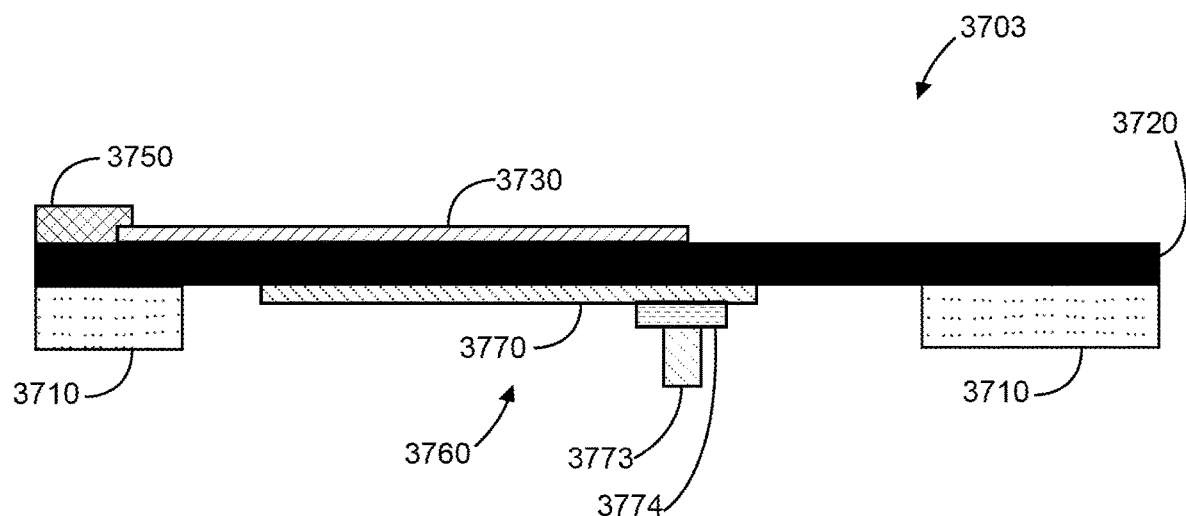
FIG. 37C is a simplified diagram illustrating a first cross-sectional view of an acoustic resonator device with backside dielectric and metal perimeter structure modifications according to an example of the present invention.

FIG. 37C is a simplified diagram illustrating a first cross-sectional view of an acoustic resonator device with backside dielectric and metal perimeter structure modifications according to an example of the present invention. As shown, device 3703 is the backside configuration of device 3702 in FIG. 37B.

Figure 37D:
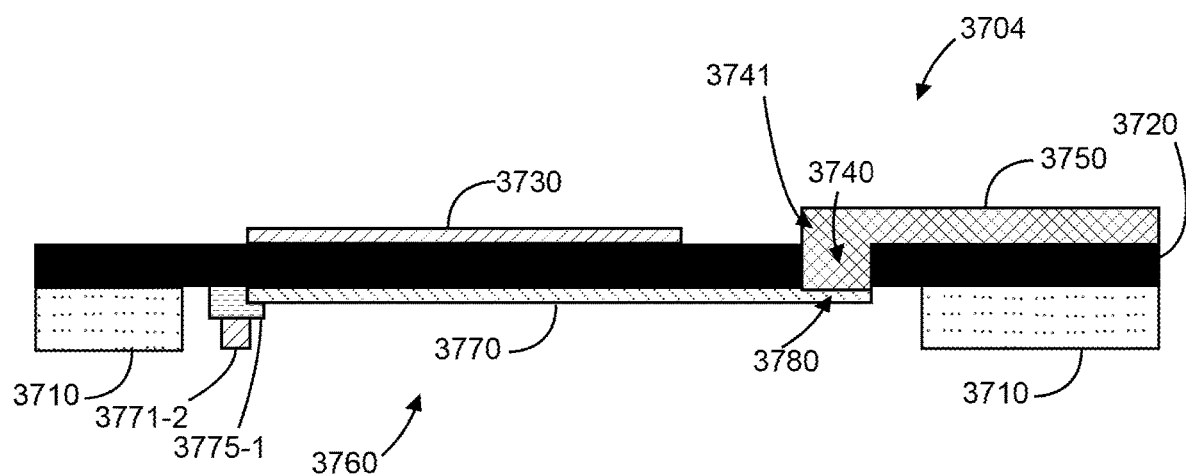
FIG. 37D is a simplified diagram illustrating a second cross-sectional view of the acoustic resonator device shown in FIG. 37C.

FIG. 37D is a simplified diagram illustrating a second cross-sectional view of the acoustic resonator device shown in FIG. 37C. As shown, device 3704 is the backside configuration of device 3701 in FIG. 37A. The device elements, methods, and techniques described above can be combined with any device elements, methods, and techniques described in the following figures. Those of ordinary skill in the art will recognize other variations, modifications, and alternatives.

Figure 38A:
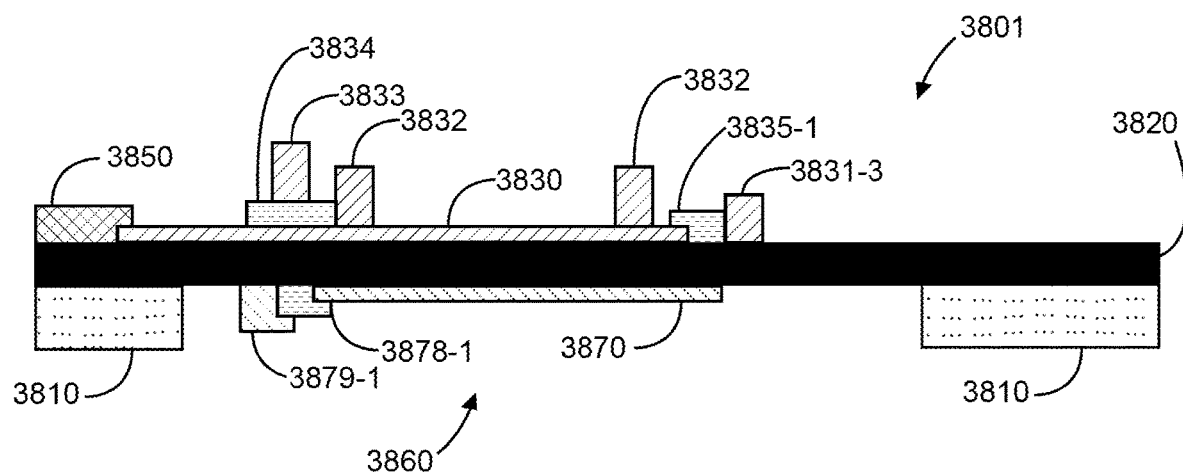
FIG. 38A is a simplified diagram illustrating a first cross-sectional view of an acoustic resonator device with topside dielectric and metal perimeter structure modifications according to an example of the present invention.

FIG. 38A is a simplified diagram illustrating a first cross-sectional view of an acoustic resonator device with topside dielectric and metal perimeter structure modifications according to an example of the present invention. FIG. 38A is similar to FIG. 35A except that the topside metal pillar structure 3831-3 does not overlap dielectric pillar structure 3835-1, which overlaps a portion of the topside metal electrode 3830. The reference numerals for any remaining undiscussed elements shown in FIG. 38A-38D match those elements shown in FIGS. 35A-35D except that the FIG. 38 numerals start with the prefix "38" as opposed to the FIG. 35 numerals, which start with the prefix "35."

Figure 38B:
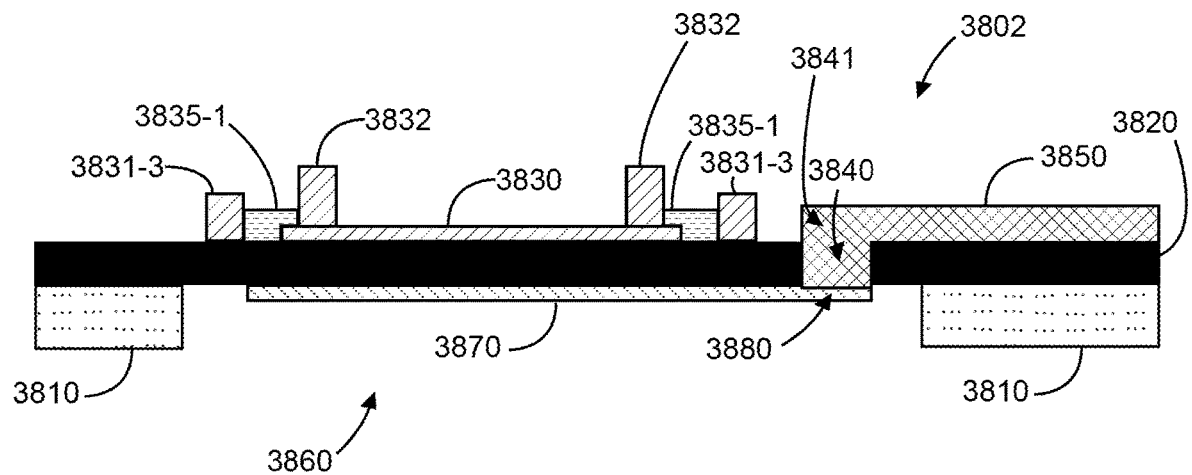
FIG. 38B is a simplified diagram illustrating a second cross-sectional view of the acoustic resonator device shown in FIG. 38A.

FIG. 38B is a simplified diagram illustrating a second cross-sectional view of the acoustic resonator device shown in FIG. 38A. FIG. 38B is similar to FIG. 35B except topside metal pillar structure 3831-3 does not overlap dielectric pillar structure 3835-1, which overlaps a portion of the topside metal electrode 3830.

Figure 38C:
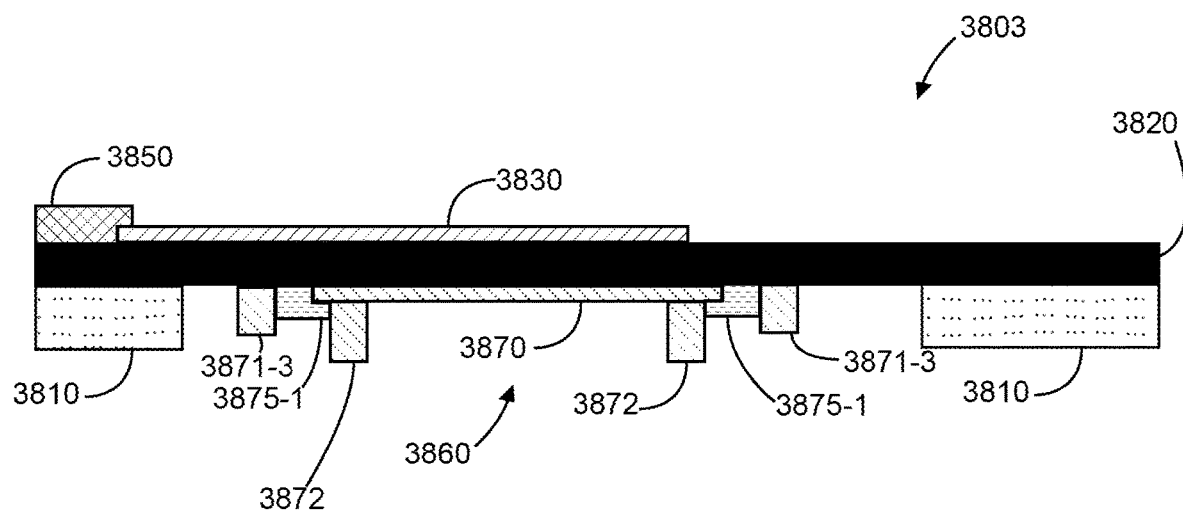
FIG. 38C is a simplified diagram illustrating a first cross-sectional view of an acoustic resonator device with backside dielectric and metal perimeter structure modifications according to an example of the present invention.

FIG. 38C is a simplified diagram illustrating a first cross-sectional view of an acoustic resonator device with backside dielectric and metal perimeter structure modifications according to an example of the present invention. As shown, device 3803 is the backside configuration of device 3802 in FIG. 38B.

Figure 38D:
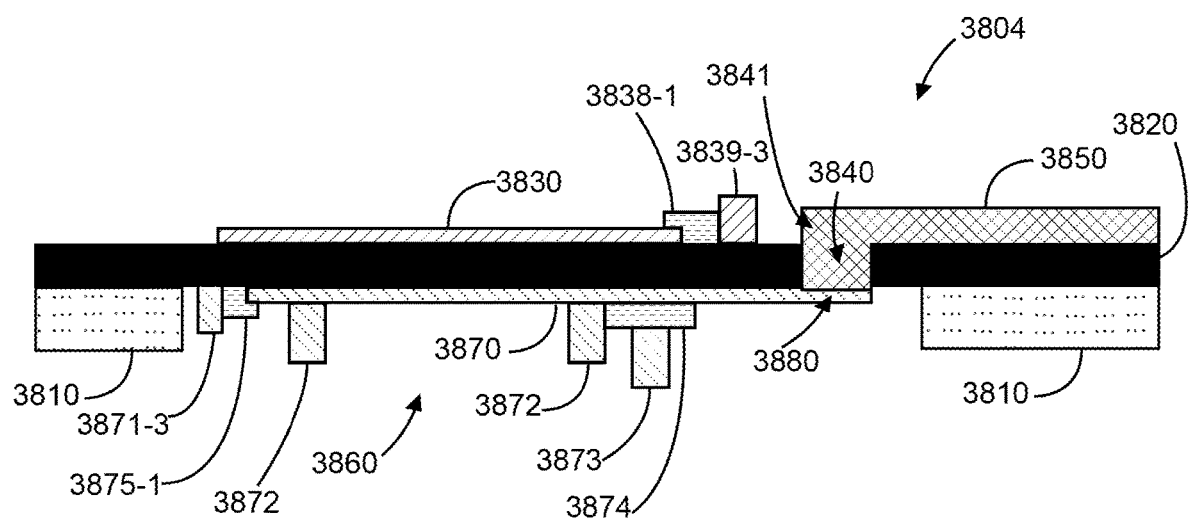
FIG. 38D is a simplified diagram illustrating a second cross-sectional view of the acoustic resonator device shown in FIG. 38C.

FIG. 38D is a simplified diagram illustrating a second cross-sectional view of the acoustic resonator device shown in FIG. 38C. As shown, device 3804 is the backside configuration of device 3801 in FIG. 38A. The device elements, methods, and techniques described above can be combined with any device elements, methods, and techniques described in the following figures. Those of ordinary skill in the art will recognize other variations, modifications, and alternatives.

Figure 39A:
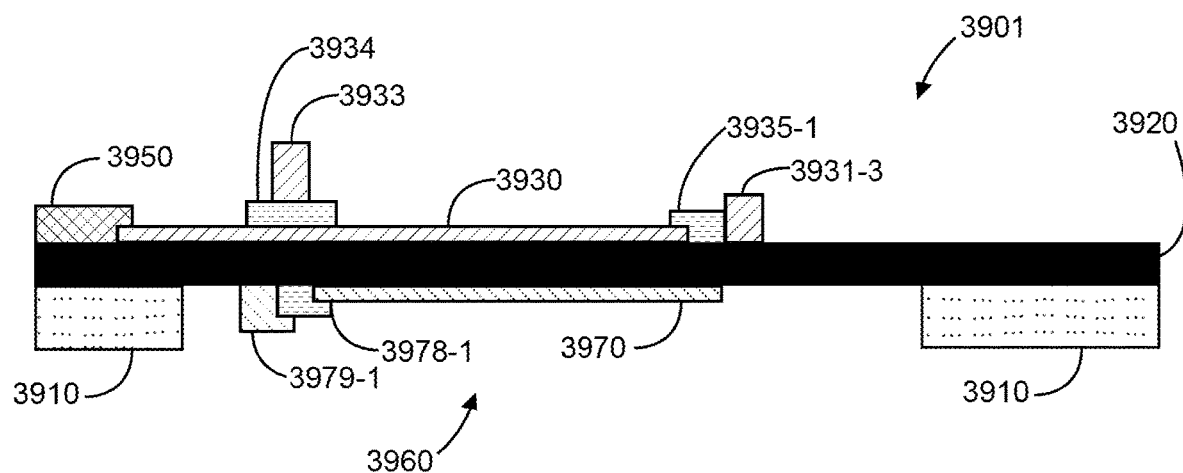
FIG. 39A is a simplified diagram illustrating a first cross-sectional view of an acoustic resonator device with topside dielectric and metal perimeter structure modifications according to an example of the present invention.

FIG. 39A is a simplified diagram illustrating a first cross-sectional view of an acoustic resonator device with topside dielectric and metal perimeter structure modifications according to an example of the present invention. FIG. 39A is similar to FIG. 38A except the topside electrode pillar structure is omitted. The reference numerals for any elements shown in FIG. 39A-39D match those elements shown in FIGS. 38A-38D except that the FIG. 39 numerals start with the prefix "39" as opposed to the FIG. 38 numerals, which start with the prefix "38."

Figure 39B:
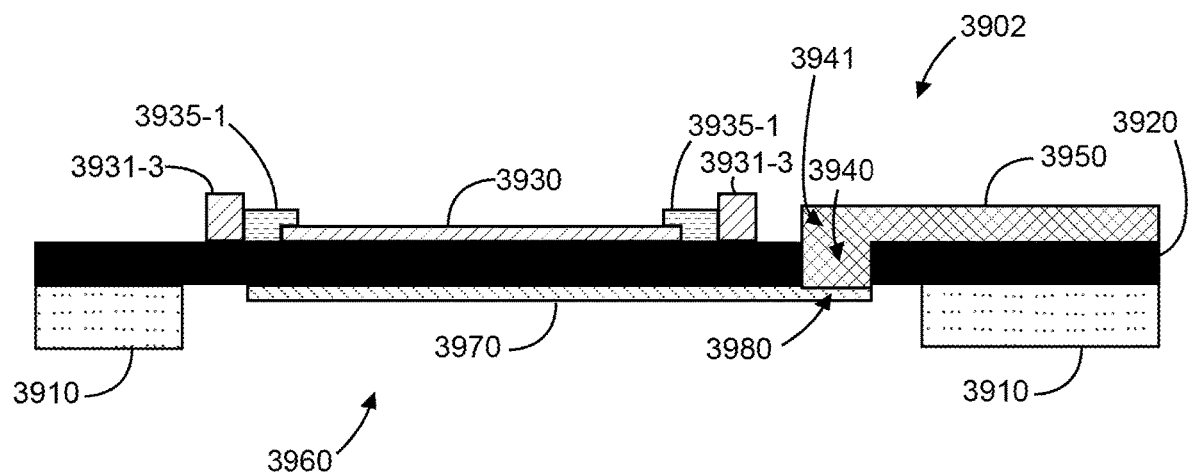
FIG. 39B is a simplified diagram illustrating a second cross-sectional view of the acoustic resonator device shown in FIG. 39A.

FIG. 39B is a simplified diagram illustrating a second cross-sectional view of the acoustic resonator device shown in FIG. 39A. FIG. 39B is similar to FIG. 38B except the topside electrode pillar structure is omitted.

Figure 39C:
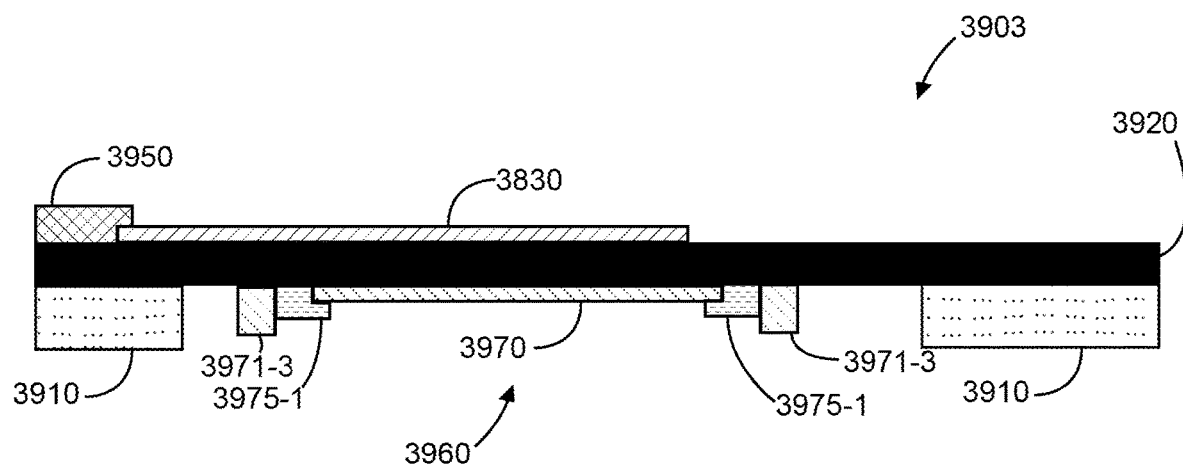
FIG. 39C is a simplified diagram illustrating a first cross-sectional view of an acoustic resonator device with backside dielectric and metal perimeter structure modifications according to an example of the present invention.

FIG. 39C is a simplified diagram illustrating a first cross-sectional view of an acoustic resonator device with backside dielectric and metal perimeter structure modifications according to an example of the present invention. FIG. 39C is similar to FIG. 38C except the backside electrode pillar structure is omitted.

Figure 39D:
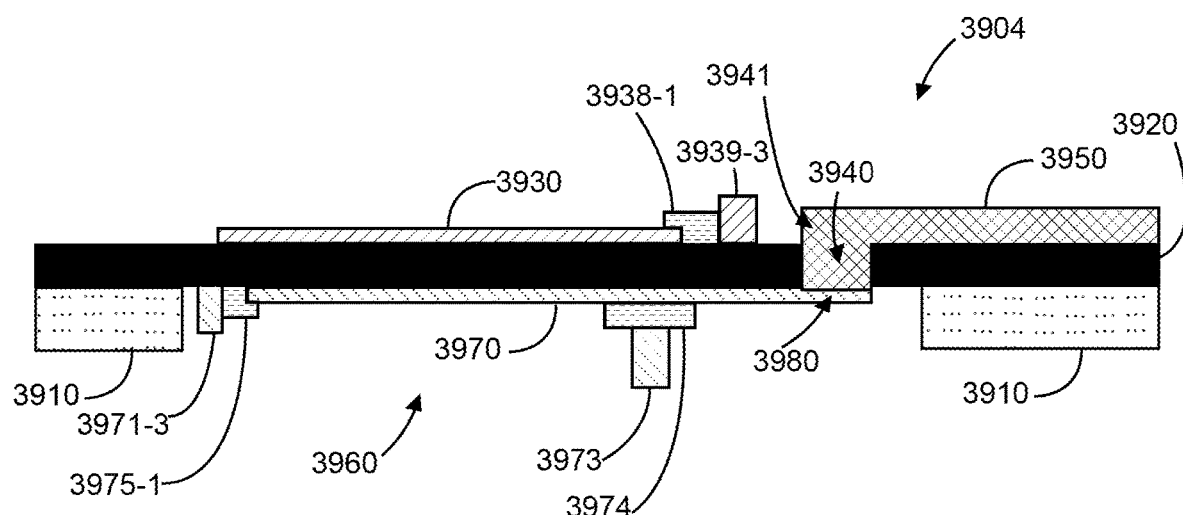
FIG. 39D is a simplified diagram illustrating a second cross-sectional view of the acoustic resonator device shown in FIG. 39C.

FIG. 39D is a simplified diagram illustrating a second cross-sectional view of the acoustic resonator device shown in FIG. 39C. FIG. 39D is similar to FIG. 39D except the backside electrode pillar structure is omitted. The device elements, methods, and techniques described above can be combined with any device elements, methods, and techniques described in the following figures. Those of ordinary skill in the art will recognize other variations, modifications, and alternatives.

Figure 40A:
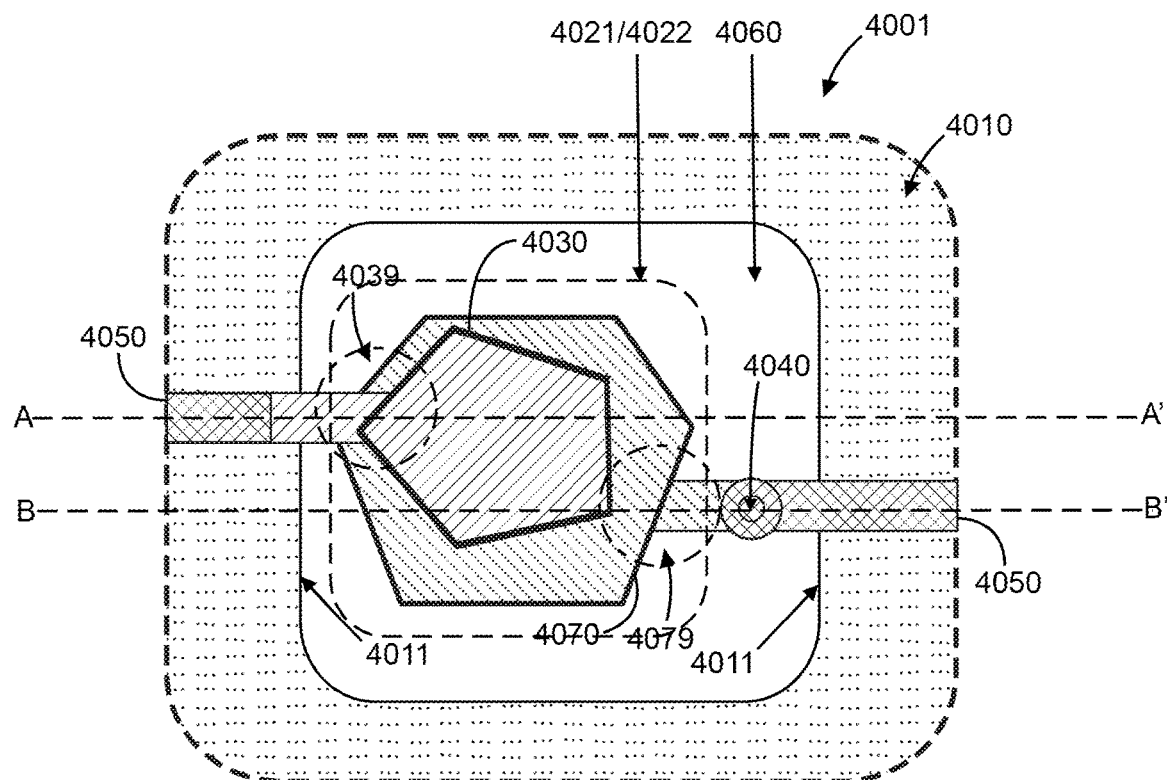
FIG. 40A is a simplified diagram illustrating a top view of an acoustic resonator device with subsurface modifications according to an example of the present invention.

FIG. 40A is a simplified diagram illustrating a top view of an acoustic resonator device with subsurface modifications according to an example of the present invention. FIG. 40A is similar to FIG. 30A except that the piezoelectric layer 4020 has grooves formed on the topside and backside. The topside metal electrode 4030 is formed partially within the topside piezoelectric groove, while the backside metal electrode 4070 is formed partially without the backside piezoelectric groove. The grooves are shown by the dotted line region 4021/4022.

Figure 40B:
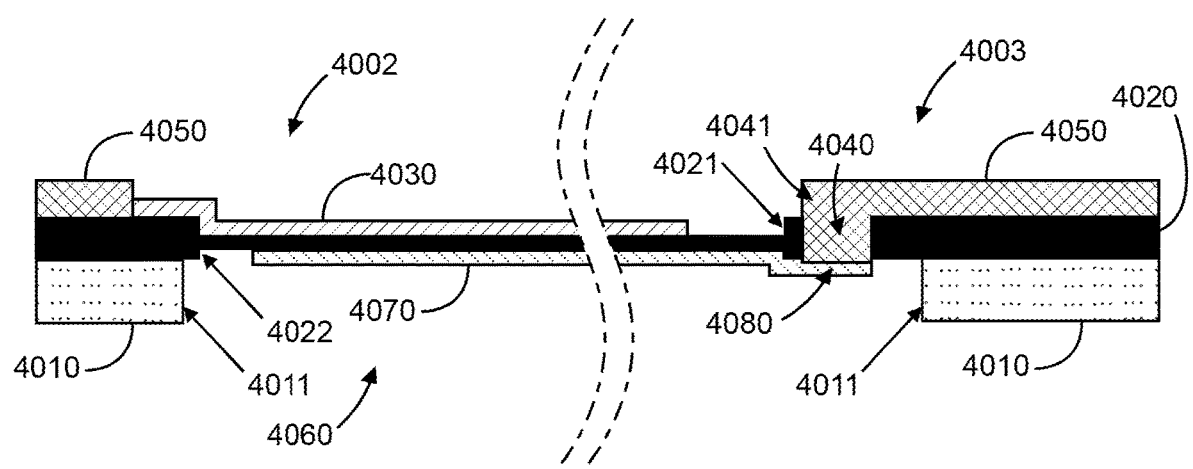
FIG. 40B is a simplified diagram illustrating a cross-sectional view of the acoustic resonator device shown in FIG. 40A.

FIG. 40B is a simplified diagram illustrating a cross-sectional view of the acoustic resonator device shown in FIG. 40A. The piezoelectric grooves described previously can be seen clearly here, marked by region 4021 and 4022. The device elements, methods, and techniques described above can be combined with any device elements, methods, and techniques described in the following figures. Those of ordinary skill in the art will recognize other variations, modifications, and alternatives.

Figure 41A:
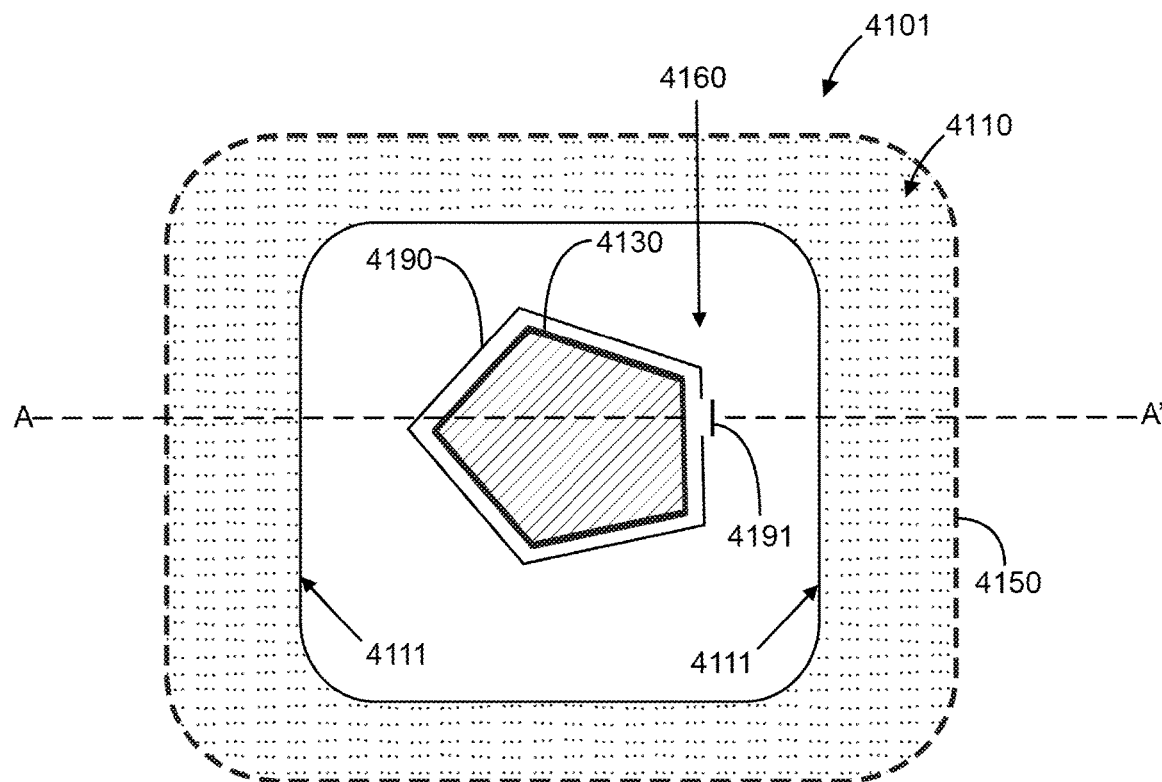
FIG. 41A is a simplified diagram illustrating a top view of an acoustic resonator device with perimeter structure modifications according to an example of the present invention.

FIG. 41A is a simplified diagram illustrating a top view of an acoustic resonator device with perimeter structure modifications according to an example of the present invention. As shown, device 4101 includes a topside energy confinement structure 4190 formed around or adjacent to the topside metal electrode 4130. This energy confinement structure 4190 includes at least one portion removed to form a structure break region. Although one break region is shown here, the energy confinement structure 4190 can have multiple break regions. This device 4101 also includes a topside sandbar structure 4191 overlying the top piezoelectric surface region within a vicinity of the topside structure break region. Here, the sandbar structure 4191 is offset outside of the perimeter of the energy confinement structure 4190. In a specific example, the topside sandbar structure can be spatially configured with a gap distance of about 0.1 um to about 100 um to the topside metal electrode 4130. In each of the following examples, the modifications can be implemented on the topside of the piezoelectric layer, the backside of the piezoelectric layer, or both.

Figure 41B:
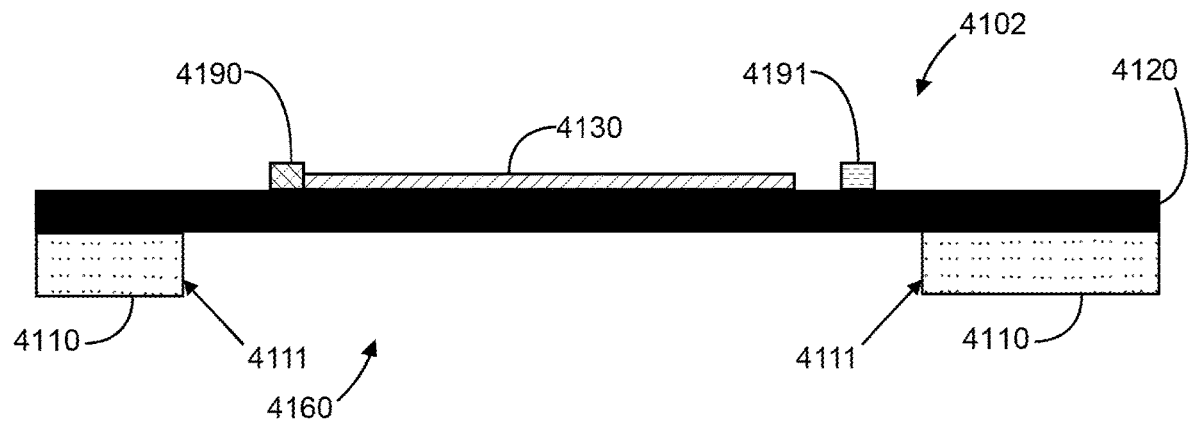
FIG. 41B is a simplified diagram illustrating a cross-sectional view of the acoustic resonator device shown in FIG. 41A.

FIG. 41B is a simplified diagram illustrating a cross-sectional view of the acoustic resonator device shown in FIG. 41A. Device 4102 shows the offset of the sandbar structure 4191 from the energy confinement structure 4190. As shown in FIGS. 41A and 41B, the topside electrode 4130, the topside energy confinement structure 4190, and the sandbar structure 4191 are formed overlying a piezoelectric layer 4120, which is formed overlying a substrate 4110. Further, the substrate 4110 includes a backside cavity 4160, which defines the cavity sidewalls or backside trench edges 4111 of substrate 4110. The device elements, methods, and techniques described above can be combined with any device elements, methods, and techniques described in the following figures. Those of ordinary skill in the art will recognize other variations, modifications, and alternatives.

Figure 42:
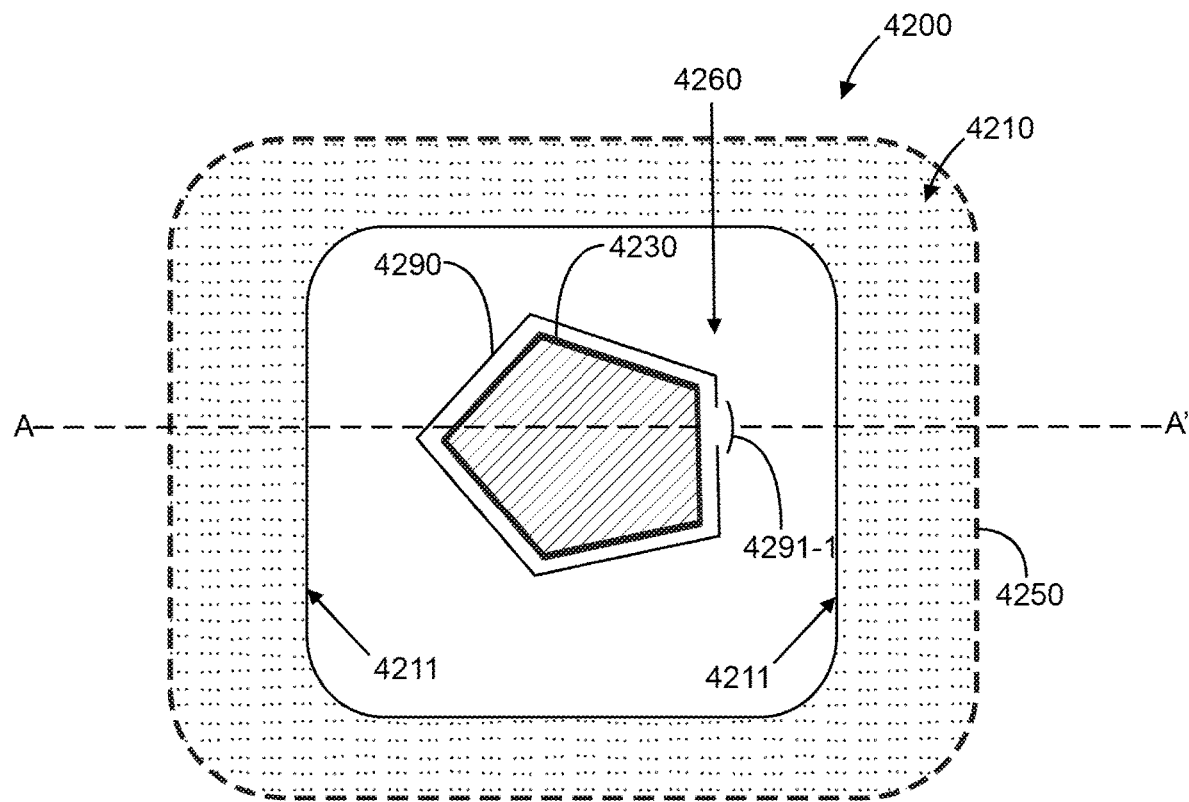
FIG. 42 is a simplified diagram illustrating a top view of an acoustic resonator device with perimeter structure modifications according to an example of the present invention.

FIG. 42 is a simplified diagram illustrating a top view of an acoustic resonator device with perimeter structure modifications according to an example of the present invention. FIG. 42 is similar to FIG. 41A except that the sandbar structure 4291-1 is curved. Other shapes can also be used, including an oppositely curved structure, an angled structure, or others.

Figure 43:
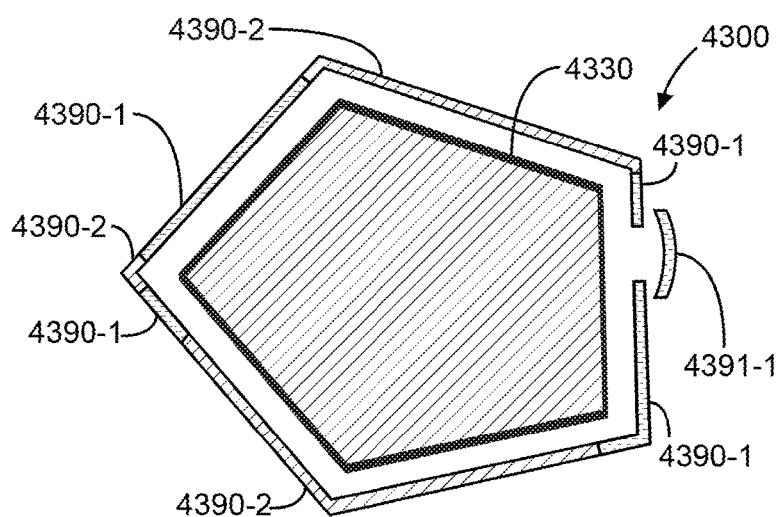
FIG. 43 is a simplified diagram illustrating a top view of an acoustic resonator device with perimeter structure modifications according to an example of the present invention.

FIG. 43 is a simplified diagram illustrating a top view of an acoustic resonator device with perimeter structure modifications according to an example of the present invention. As shown, device 4300 includes an energy confinement structure 4390 with a combination of materials. The energy confinement structure 4390 can comprise dielectric materials, metal materials, or combinations thereof. Here, the dielectric portions are marked as item 4390-1 and the metal portions are marked as item 4390-2.

Figure 44A:
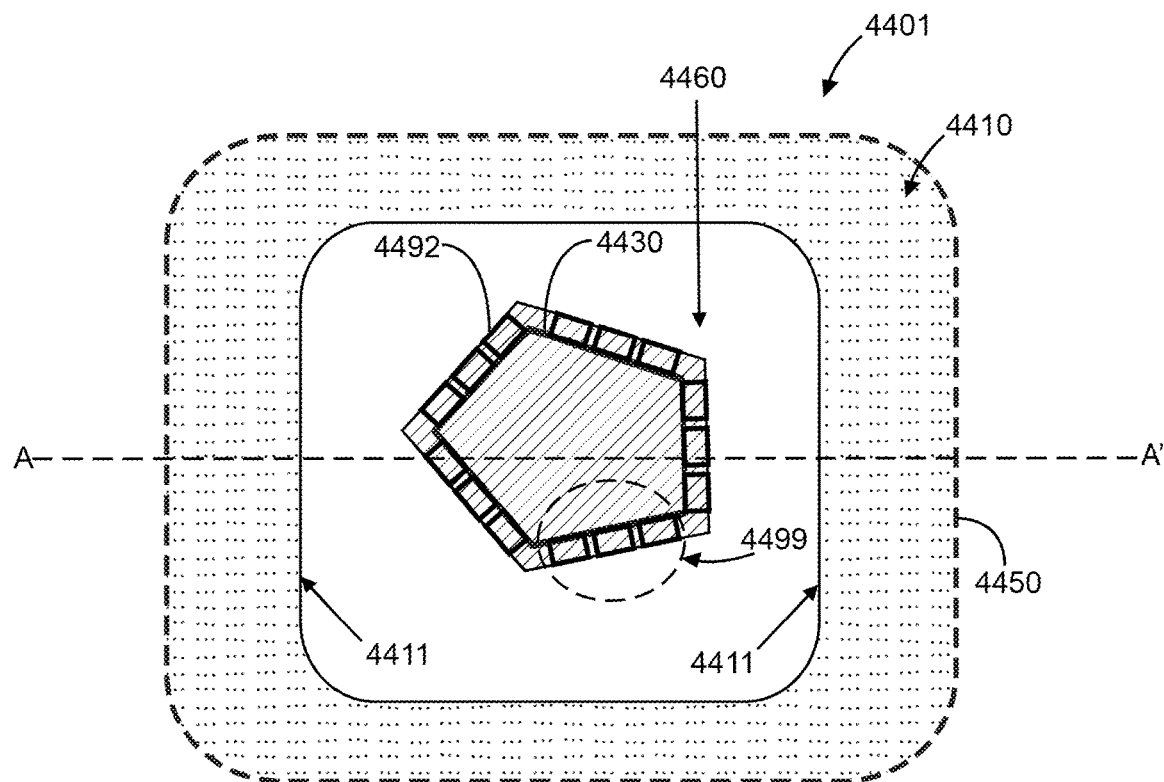
FIG. 44A is a simplified diagram illustrating a top view of an acoustic resonator device with perimeter structure modifications according to an example of the present invention.

FIG. 44A is a simplified diagram illustrating a top view of an acoustic resonator device with perimeter structure modifications according to an example of the present invention. As shown, device 4401 includes an energy confinement structure configured with a castellation pattern 4492 characterized with repeated castellation shape. This castellation shape can include a square, triangle, a polygonal shape, a non-polygonal shape, or other shape.

Figure 44B:
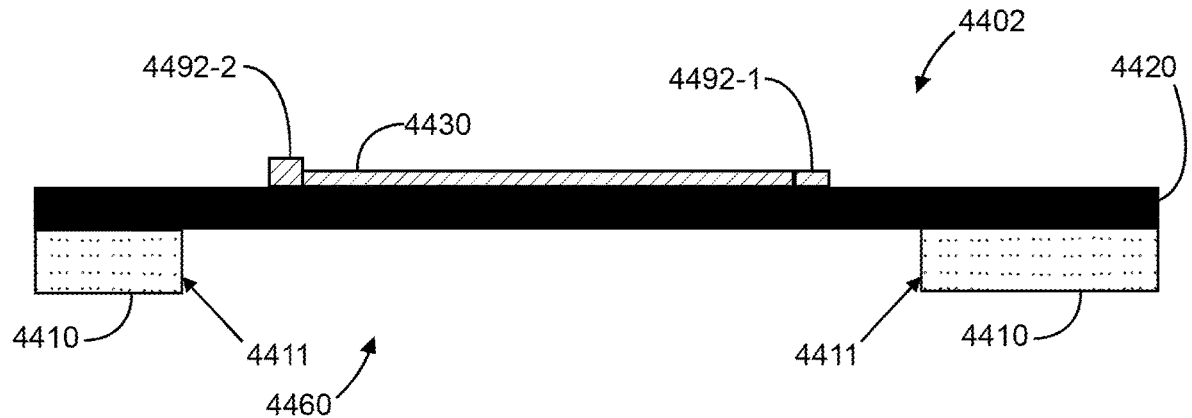
FIG. 44B is a simplified diagram illustrating a cross-sectional view of the acoustic resonator device shown in FIG. 44A.

FIG. 44B is a simplified diagram illustrating a cross-sectional view of the acoustic resonator device shown in FIG. 44A. As shown, device 4402 includes the castellation-patterned energy confinement structure a shorter castellation pattern 4492-1 and a taller castellation pattern 4492-2. The height of the repeating castellation pattern can vary across different examples.

Figure 44C:
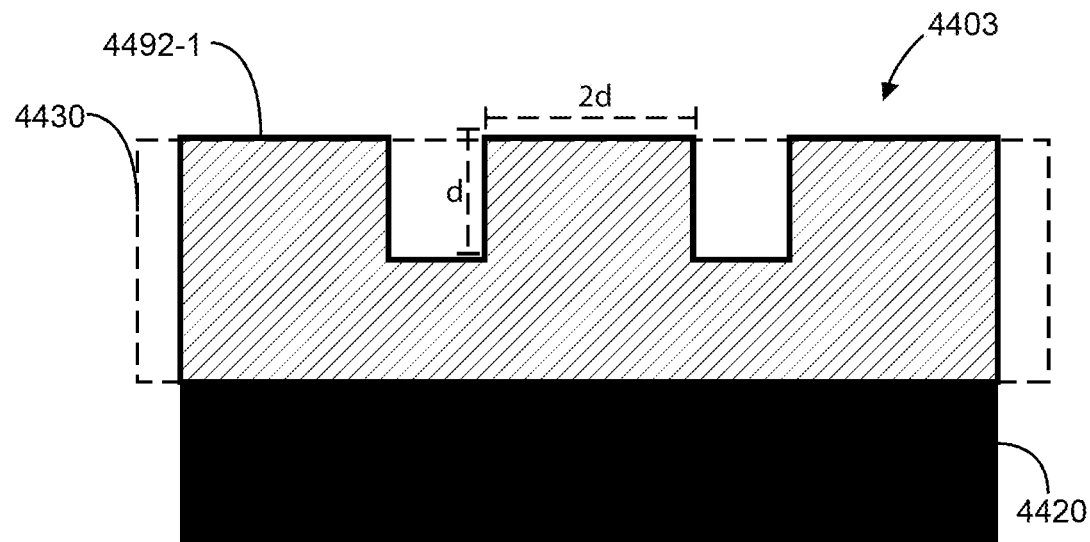
FIG. 44C is a simplified diagram illustrating a cross-sectional view of a portion of the acoustic resonator device shown in FIGS. 44A and 44B.

FIG. 44C is a simplified diagram illustrating a cross-sectional view of a portion of the acoustic resonator device shown in FIGS. 44A and 44B. Device 4403 shows an example castellation pattern in which the horizontal portion is twice the distance of the vertical portion, denoted by 'd.' The length and height ratios of the repeating castellation patterns can vary across different examples. This figure also shows the relative height of the castellation pattern 4492-1 to the topside metal electrode 4430, shown in dotted lines.

Figure 44D:
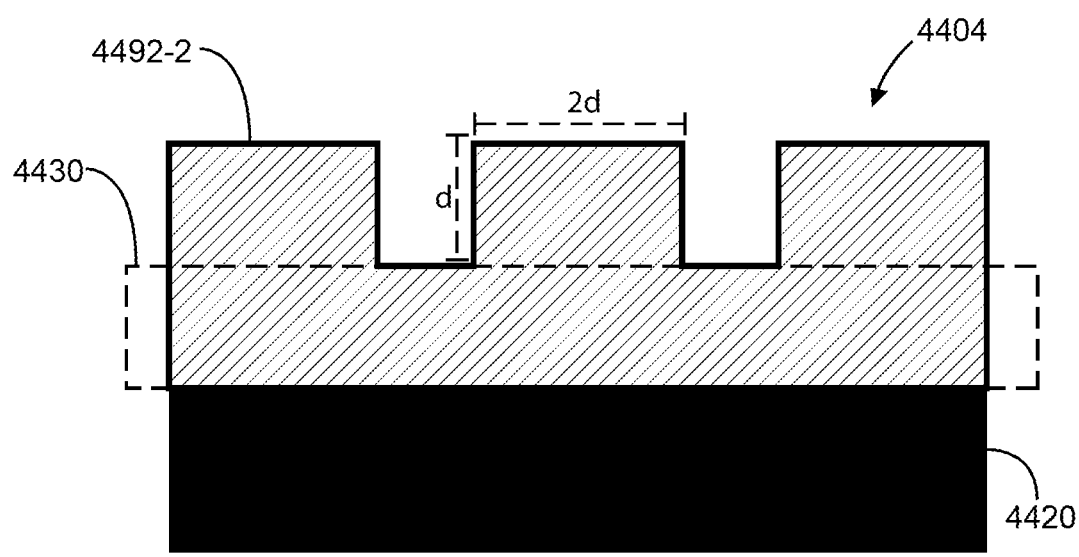
FIG. 44D is a simplified diagram illustrating a cross-sectional view of a portion of the acoustic resonator device shown in FIGS. 44A and 44B.

FIG. 44D is a simplified diagram illustrating a cross-sectional view of a portion of the acoustic resonator device shown in FIGS. 44A and 44B. This figure shows the relative height of the castellation pattern 4492-2 to the topside metal electrode 4430, shown in dotted lines. The device elements, methods, and techniques described above can be combined with any device elements, methods, and techniques described in the following figures. Those of ordinary skill in the art will recognize other variations, modifications, and alternatives.

According to an example, the present invention provides a structure and a method of fabricating an acoustic resonator or filter device. The method can include providing a substrate having a substrate surface region; forming a single crystal piezoelectric layer overlying the substrate surface region, the piezoelectric layer having a top piezoelectric surface region and a bottom piezoelectric surface region; forming a topside metal electrode overlying the top piezoelectric surface region, the topside metal electrode being characterized by a topside electrode geometric area; forming a topside micro-trench within a portion of the single crystal piezoelectric layer; forming a topside metal having a topside metal plug within the topside micro-trench; forming a backside trench within the substrate exposing the bottom piezoelectric surface region, the backside trench underlying the topside metal electrode and the topside micro-trench, the backside trench being characterized by a cavity geometric area and having one or more backside trench edges; forming a backside metal electrode underlying or in proximity of the bottom piezoelectric surface region within the backside trench, the backside metal electrode being electrically coupled to the topside metal, the backside metal electrode being characterized by a backside electrode geometric area; forming at least two metal pads for electrical connections, wherein at least one metal pad is electrically coupled to the topside metal electrode, and at least one metal pad is electrically coupled to the backside metal electrode; forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via; and wherein an area ratio between the topside electrode geometric area and the backside electrode geometric area is between about 0.1 to about 10.

In an example, each of the topside electrode geometric area, the backside electrode geometric area, and the cavity geometric area includes a polygonal shape having n sides, where n is greater than or equal to three. In an example, each of the topside electrode geometric area, the backside electrode geometric area, and the cavity geometric area includes a skewed or regular polygonal shape having parallel or non-parallel edges. In an example, each of the topside electrode geometric area, the backside electrode geometric area, and the cavity geometric area includes a circle, an ellipses, skew non-polygonal shapes, or irregular shapes; wherein the topside electrode geometric area, the backside electrode geometric area, and the cavity geometric area can be characterized by geometric areas having similar or dissimilar shapes. In an example, the topside electrode geometric area, the backside electrode geometric area, and the cavity geometry are spatially configured such that the distance between either the topside metal electrode or the backside metal electrode and any of the one or more backside trench edges is between about 0.1 microns and about 500 microns. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming a topside metal electrode overlying the top piezoelectric surface region, the topside metal electrode having one or more topside metal electrode edges being characterized by a topside electrode edge geometric shape; forming a topside micro-trench within a portion of the single crystal piezoelectric layer; forming a topside metal having a topside metal plug within the topside micro-trench; forming a backside trench within the substrate exposing the bottom piezoelectric surface region, the backside trench underlying the topside metal electrode and the topside micro-trench; forming a backside metal electrode underlying or in proximity of the bottom piezoelectric surface region within the backside trench, the backside metal electrode being electrically coupled to the topside metal, the backside metal electrode having one or more backside metal electrode edges being characterized by a backside electrode edge geometric shape; forming at least two metal pads for electrical connections, wherein at least one metal pad is electrically coupled to the topside metal electrode, and at least one metal pad is electrically coupled to the backside metal electrode; and forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via.

In an example, forming the topside metal electrode and the backside metal electrode includes an edge profile fabrication process to form the one or more topside metal electrode edges, wherein the edge profile fabrication process can be selected from the following: a patterned sputtering process, a patterned evaporation and lift-off process, an evaporation and patterned etching process, a trimming process, a laser ablation process, and an ion beam milling process. In an example, the topside electrode edge geometric shape includes one of the following shapes: a down slope edge, an up slope edge, an up and down slope edge, an up-flat-down slope edge, a stair steps edge, and a circular edge. In an example, forming the topside metal electrode includes forming the topside metal electrode such that topside electrode edge geometric shape is spatially configured above or within the top piezoelectric surface region. In an example, the topside metal electrode includes a groove formed within the topside metal electrode within a vicinity of the one or more topside electrode edges. In an example, the backside electrode edge geometric shape includes one of the following shapes: a down slope edge, an up slope edge, an up and down slope edge, an up-flat-down slope edge, a stair steps edge, and a circular edge. In an example, the backside metal electrode includes a groove formed within the backside metal electrode within a vicinity of the one or more backside electrode edges. In an example, forming the backside metal electrode includes forming the backside metal electrode such that backside electrode edge geometric shape is spatially configured within or below the bottom piezoelectric surface region.

In an example, each of the topside electrode edge geometric shape and the backside electrode edge shape includes one of the following shapes: a down slope edge, an up slope edge, an up and down slope edge, an up-flat-down slope edge, a stair steps edge, and a circular edge; wherein the topside metal electrode includes a groove formed within the topside metal electrode within a vicinity of the one or more topside electrode edges; and wherein the backside metal electrode includes a groove formed within the backside metal electrode within a vicinity of the one or more backside electrode edges. In an example, the method further includes removing a portion of the piezoelectric layer to form a first topside groove on the top piezoelectric surface region. In an example, the first topside groove is spatially configured overlying the backside trench. In an example, the method further includes removing a portion of the piezoelectric layer to form a second topside groove on the top piezoelectric surface region; wherein the second topside groove is spatially configured within the vicinity of an edge of the topside metal electrode and the first groove. In an example, the first topside groove is spatially configured overlying a portion of the backside trench and the second topside groove is spatially configured overlying a portion of the substrate. In an example, the method further includes removing a portion of the piezoelectric layer to form a first backside groove on the bottom piezoelectric surface region. In an example, the first backside groove is spatially configured within the backside trench. In an example, the method further includes removing a portion of the piezoelectric layer to form a second backside groove on the bottom piezoelectric surface region; wherein the second backside groove is spatially configured within the vicinity of an edge of the backside metal electrode and the first backside groove. In an example, the first backside groove is spatially configured within a portion of the backside trench and the second backside groove is spatially configured within a portion of the backside trench.

In an example, the method further includes removing a portion of the piezoelectric layer to form a first topside groove on the top piezoelectric surface region; and removing a portion of the piezoelectric layer to form a first backside groove on the bottom piezoelectric surface region. In an example, the method further includes removing a portion of the single crystal piezoelectric layer to form a topside groove on the top piezoelectric surface region; and wherein forming the topside metal electrode includes forming the topside metal electrode overlying the top piezoelectric surface region within the topside groove. In an example, the present method further includes removing a portion of the single crystal piezoelectric layer to form a backside groove on the bottom piezoelectric surface region; and wherein forming the backside metal electrode includes forming the backside metal electrode underlying the bottom piezoelectric surface region within the backside groove. In an example, the method further includes removing a portion of the single crystal piezoelectric layer to form a topside groove on the top piezoelectric surface region; wherein forming the topside metal electrode includes forming the topside metal electrode overlying the top piezoelectric surface region within the topside groove; removing a portion of the single crystal piezoelectric layer to form a backside groove on the bottom piezoelectric surface region; and wherein forming the backside metal electrode includes forming the backside metal electrode underlying the bottom piezoelectric surface region within the backside groove.

In an example, the method further includes forming a topside edge border material overlying and physically coupled to a portion of the top piezoelectric surface region and physically coupled to a portion of the topside metal electrode. In an example, the topside edge border material includes a metal material or a dielectric material. In an example, forming the topside edge border material includes forming the topside edge border material overlying a portion of the topside metal electrode. In an example, the method further includes removing a portion of the topside metal electrode within a vicinity of the topside edge border material to form a topside electrode groove. In an example, the method further includes forming a backside edge border material underlying and physically coupled to a portion of the bottom piezoelectric surface region and physically coupled to a portion of the backside metal electrode. In an example, the backside edge border material includes a metal material or a dielectric material. In an example, forming the backside edge border material includes forming the backside edge border material overlying a portion of the backside metal electrode. In an example, the method further includes removing a portion of the backside metal electrode within a vicinity of the backside edge border material to form a backside electrode groove. In an example, the method further includes forming an topside edge border material overlying and physically coupled to a portion of the top piezoelectric surface region and physically coupled to a portion of the topside metal electrode; and forming an backside edge border material underlying and physically coupled to a portion of the bottom piezoelectric surface region and physically coupled to a portion of the backside metal electrode. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming topside metal electrode overlying the top piezoelectric surface region; forming a topside micro-trench within a portion of the single crystal piezoelectric layer; forming a topside metal having a topside metal plug within the topside micro-trench; forming a backside trench within the substrate exposing the bottom piezoelectric surface region, the backside trench underlying the topside metal electrode and the topside micro-trench; forming a backside metal electrode underlying or in proximity of the bottom piezoelectric surface region within the backside trench, the backside metal electrode being electrically coupled to the topside metal; forming at least two metal pads for electrical connections, wherein at least one metal pad is electrically coupled to the topside metal electrode, and at least one metal pad is electrically coupled to the backside metal electrode; forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via; and subjecting the acoustic resonator device to a masked ion implantation process; wherein the topside metal electrode, the single crystal piezoelectric layer, and the backside metal electrode form a central resonator area.

In an example, the acoustic resonator device is subjected to the ion implantation process during one of the following stages: before the forming of the topside metal electrode, before the forming of the backside metal electrode, after the forming of the topside metal electrode, and after the forming of the backside metal electrode. In an example, the masked ion implantation process is bounded to a zone characterized by 500 um outside the central resonator area, wherein the zone extends from and includes the central resonator area. In an example, the masked ion implantation process uses one or more of the following species: H, He, B, C, O, Fe, Mo, Ta, W, or other transition metal. In an example, the ion implantation process is characterized by a dosage between 1E+14 and 1E+20 ions per cubic centimeter. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming topside metal electrode overlying the top piezoelectric surface region; forming a topside micro-trench within a portion of the single crystal piezoelectric layer; forming a topside metal having a topside metal plug within the topside micro-trench; forming a backside trench within the substrate exposing the bottom piezoelectric surface region and forming a substrate sidewall, the backside trench underlying the topside metal electrode and the topside micro-trench; forming a backside metal electrode underlying or in proximity of the bottom piezoelectric surface region within the backside trench, the backside metal electrode being electrically coupled to the topside metal; forming at least two metal pads for electrical connections, wherein at least one metal pad is electrically coupled to the topside metal electrode, and at least one metal pad is electrically coupled to the backside metal electrode; and forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via; wherein the backside metal electrode is spatially configured such that the distance between the backside metal electrode and the substrate sidewall ranges from about 0.1 um to about 500 um.

In an example, the topside metal electrode includes a topside electrode surface area and the backside metal electrode includes a backside electrode surface area; wherein the backside electrode surface area is greater than the topside electrode surface area such that a lateral distance between an edge of the backside electrode surface area and an edge of the topside electrode surface area ranges from about 0.1 um to about 500 um. In an example, the topside metal electrode includes a topside electrode surface area and the backside metal electrode includes a backside electrode surface area; wherein the topside electrode surface area is greater than the backside electrode surface area such that a lateral distance between an edge of the topside electrode surface area and an edge the backside electrode surface area ranges from about 0.1 um to about 500 um. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming topside metal electrode overlying the top piezoelectric surface region; forming a topside micro-trench within a portion of the single crystal piezoelectric layer; forming a topside metal having a topside metal plug within the topside micro-trench; forming a backside trench within the substrate exposing the bottom piezoelectric surface region, the backside trench underlying the topside metal electrode and the topside micro-trench; forming a backside metal electrode underlying or in proximity of the bottom piezoelectric surface region within the backside trench, the backside metal electrode being electrically coupled to the topside metal; forming one or more frequency offset structure layers within a vicinity of the single crystal piezoelectric layer; forming at least two metal pads for electrical connections, wherein at least one metal pad is electrically coupled to the topside metal electrode, and at least one metal pad is electrically coupled to the backside metal electrode; and forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via.

In an example, forming one or more frequency offset structure layers includes forming a frequency offset structure layer overlying the topside metal electrode. In an example, forming the one or more frequency offset structure layers includes one of the following: a patterned sputtering process, a patterned evaporation and lift-off process, an evaporation and patterned etching process, a trimming process, a laser ablation process, and an ion beam milling process. In an example, forming one or more frequency offset structure layers includes forming a frequency offset structure layer underlying or in proximity of the backside metal electrode. In an example, the frequency offset structure layer can include Mo, Al, W, Ru, AlN, SiN, or SiO$_2$. In an example, forming one or more frequency offset structure layers includes forming a topside frequency offset structure layer overlying the topside metal electrode and forming a backside frequency offset structure layer underlying or in proximity of the backside metal electrode. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming a first topside metal electrode overlying a first portion of the top piezoelectric surface region; forming a second topside metal electrode overlying a second portion of the top piezoelectric surface region; forming a third topside metal electrode overlying a third portion of the top piezoelectric surface region; forming a backside trench within the substrate exposing the bottom piezoelectric surface region and forming a substrate sidewall, the backside trench underlying the first, second, and third topside metal electrodes; forming a backside metal plug underlying the bottom piezoelectric surface region within the backside trench; forming a first backside metal electrode underlying or in proximity of the bottom piezoelectric surface region and the first topside metal electrode within the backside trench, the first backside metal electrode being electrically coupled to the backside metal plug; forming a second backside metal electrode underlying or in proximity of the bottom piezoelectric surface region and the second topside metal electrode within the backside trench, the second backside metal electrode being electrically coupled to the backside metal plug; forming a third backside metal electrode underlying or in proximity of the bottom piezoelectric surface region and the third topside metal electrode within the backside trench, the third backside metal electrode being electrically coupled to the backside metal plug; forming at least three metal pads for electrical connections, wherein at least one metal pad is electrically coupled to the first topside metal electrode, wherein at least one metal pad is electrically coupled to the second topside metal electrode, and wherein at least one metal par is electrically coupled to the third topside metal electrode; and subjecting the multiple acoustic resonator device to a masked ion implantation process; wherein the first topside metal electrode, the second topside metal electrode, the third topside metal electrode, the single crystal piezoelectric layer, the first backside metal electrode, the second backside metal electrode, and the third backside metal electrode form a central resonator area.

In an example, subjecting the multiple acoustic resonator device to a masked ion implantation process includes subjecting the multiple acoustic resonator device to the masked ion implantation process during one of the following stages: before the forming of the topside metal electrode, before the forming of the backside metal electrode, after the forming of the topside metal electrode, and after the forming of the backside metal electrode. In an example, the masked ion implantation process is bounded to a zone characterized by 500 um outside the central resonator area, wherein the zone extends from and includes the central resonator area. In an example, the masked ion implantation process uses one or more of the following species: H, He, B, C, O, Fe, Mo, Ta, W, or other transition metal. In an example, the ion implantation process is characterized by a dosage between 1E+14 and 1E+20 ions per cubic centimeter. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming topside metal electrode overlying a portion of the top piezoelectric surface region, the topside metal electrode having a topside electrode surface region, a topside electrode perimeter, and one or more topside electrode edges; forming a topside pillar structure overlying a portion of the top piezoelectric surface region within a vicinity of the topside metal electrode and outside of the topside metal electrode perimeter; forming a topside micro-trench within a portion of the single crystal piezoelectric layer; forming a topside metal having a topside metal plug within the topside micro-trench; forming a backside trench within the substrate exposing the bottom piezoelectric surface region and forming a substrate sidewall, the backside trench underlying the topside metal electrode and the topside micro-trench; forming a backside metal electrode underlying or in proximity of the bottom piezoelectric surface region within the backside trench, the backside metal electrode being electrically coupled to the topside metal, the backside metal electrode having a backside electrode surface region, a backside electrode perimeter, and one or more backside electrode edges; forming at least two metal pads for electrical connections, wherein at least one metal pad is electrically coupled to the topside metal electrode, and at least one metal pad is electrically coupled to the backside metal electrode; and forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via.

In an example, the topside pillar structure comprises a metal material, a dielectric material, or a combination thereof. In an example, the topside pillar structure is spatially configured substantially around the topside electrode perimeter. In an example, the topside pillar structure comprises a continuous pillar structure or one or more non-continuous pillars. In an example, the topside metal electrode comprises a topside electrode connection region; wherein forming the topside pillar structure comprises forming the topside pillar structure such that the topside pillar structure includes a topside pillar gap region within a vicinity of the topside electrode connection region. In an example, the method further includes forming one or more backside pillars underlying a portion of the topside pillar structure and a portion of the bottom piezoelectric surface region, wherein the one or more backside pillars comprise a metal material, a dielectric material, or a combination thereof. In an example, the method further includes forming one or more combination topside electrode pillars overlying a portion of the topside electrode surface region; wherein the one or more combination topside electrode pillars comprises a metal pillar formed overlying a dielectric pillar. In an example, the method further includes forming one or more topside dielectric electrode pillars overlying a portion of the topside electrode surface region. In an example, the one or more topside dielectric pillars are spatially configured at a distance of about 0.1 um to about 100 um to the topside electrode perimeter. In an example, the method further includes forming a topside electrode pillar structure overlying a portion of the topside electrode surface region and within the topside metal electrode perimeter. In an example, the topside electrode pillar structure comprises a metal material, a dielectric material, or a combination thereof. In an example, the topside electrode pillar structure is spatially configured substantially along the topside electrode perimeter. In an example, the topside electrode pillar structure comprises a continuous pillar structure or one or more non-continuous pillars. In an example, forming the topside electrode pillar structure comprises forming the topside electrode pillar structure such that the topside electrode pillar structure includes a topside electrode pillar gap region within a vicinity of the topside electrode connection region.

In an example, the method further includes forming one or more topside dielectric electrode pillars overlying a portion of the topside electrode surface region; wherein at least one topside dielectric electrode pillar physically contacts the topside electrode pillar structure. The method further includes wherein the topside electrode pillar structure is spatially configured at a distance of about 0.1 um to about 100 um to the topside electrode perimeter. In an example, forming the topside pillar structure comprises forming a topside dielectric pillar structure and a topside metal pillar structure; wherein the topside dielectric pillar structure is formed adjacent to the topside metal electrode and the topside metal pillar structure is formed adjacent to the topside dielectric pillar structure. In an example, the topside dielectric pillar structure comprises one or more overlapping portions overlying one or more portions of the topside electrode surface region. In an example, the topside metal pillar structure comprises one or more overlapping portions overlying one or more portions of the topside dielectric pillar structure.

In an example, the method further includes forming one or more backside dielectric pillars underlying a portion of the topside pillar structure and one or more portions of the bottom piezoelectric surface region; and forming one or more backside metal pillars underlying a portion of the topside pillar structure and one or more portions of the bottom piezoelectric surface region; wherein the one or more backside dielectric pillars are formed adjacent to the backside metal electrode and the one or more backside metal pillars are formed adjacent to the one or more backside dielectric pillars. In an example, at least one backside dielectric pillar comprises an underlapping portion underlying a portion of the bottom metal electrode. In an example, at least one backside dielectric pillar comprises an underlapping portion underlying a portion of the bottom metal electrode. In an example, forming the topside pillar structure comprises forming a topside dielectric pillar structure and a topside metal pillar structure; wherein the topside dielectric pillar structure is formed adjacent to the topside metal electrode and the topside metal pillar structure is formed overlying the topside dielectric pillar structure. In an example, the topside dielectric pillar structure comprises one or more overlapping portions overlying one or more portions of the topside electrode surface region. In an example, the method further includes removing a portion of the single crystal piezoelectric layer to form a topside piezo cavity; wherein forming the topside metal electrode comprises forming the topside metal electrode such that at least a portion of the topside metal electrode is spatially configured within the topside piezo cavity. In an example, forming the topside pillar structure comprises forming the topside pillar structure within the topside piezo cavity. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming topside metal electrode overlying a portion of the top piezoelectric surface region, the topside metal electrode having a topside electrode surface region, a topside electrode perimeter, and one or more topside electrode edges; forming a topside micro-trench within a portion of the single crystal piezoelectric layer; forming a topside metal having a topside metal plug within the topside micro-trench; forming a backside trench within the substrate exposing the bottom piezoelectric surface region and forming a substrate sidewall, the backside trench underlying the topside metal electrode and the topside micro-trench; forming a backside metal electrode underlying or in proximity of the bottom piezoelectric surface region within the backside trench, the backside metal electrode being electrically coupled to the topside metal, the backside metal electrode having a backside electrode surface region, a backside electrode perimeter, and one or more backside electrode edges; forming a backside pillar structure underlying a portion of the bottom piezoelectric surface region within a vicinity of the backside metal electrode and outside of the backside metal electrode perimeter; forming at least two metal pads for electrical connections, wherein at least one metal pad is electrically coupled to the topside metal electrode, and at least one metal pad is electrically coupled to the backside metal electrode; and forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via.

In an example, the backside pillar structure comprises a metal material, a dielectric material, or a combination thereof. In an example, the backside pillar structure is spatially configured substantially around the backside electrode perimeter. In an example, the backside pillar structure comprises a continuous pillar structure or one or more non-continuous pillars. In an example, the backside metal electrode comprises a backside electrode connection region; wherein forming the backside pillar structure comprises forming the backside pillar structure such that the backside pillar structure includes a backside pillar gap region within a vicinity of the backside electrode connection region. In an example, the method further includes forming one or more topside pillars overlying a portion of the topside pillar structure and a portion of the top piezoelectric surface region, wherein the one or more topside pillars comprise a metal material, a dielectric material, or a combination thereof. In an example, forming one or more insulated backside electrode pillars underlying a portion of the backside electrode surface region; wherein the one or more insulated backside electrode pillars comprises a metal pillar formed underlying a dielectric pillar. In an example, the method further includes forming one or more backside dielectric electrode pillars underlying a portion of the backside electrode surface region. In an example, the one or more backside dielectric pillars are spatially configured at a distance of about 0.1 um to about 100 um to the backside electrode perimeter.

In an example, the method further includes forming a backside electrode pillar structure underlying a portion of the backside electrode surface region and within the backside metal electrode perimeter. In an example, the backside electrode pillar structure comprises a metal material, a dielectric material, or a combination thereof. In an example, the backside electrode pillar structure is spatially configured substantially along the backside electrode perimeter. In an example, the backside electrode pillar structure comprises a continuous pillar structure or one or more non-continuous pillars. In an example, forming the backside electrode pillar structure comprises forming the backside electrode pillar structure such that the backside electrode pillar structure includes a backside electrode pillar gap region within a vicinity of the backside electrode connection region. In an example, the method further includes forming one or more backside dielectric electrode pillar underlying a portion of the backside electrode surface region; wherein at least one backside dielectric electrode pillar physically contacts the backside electrode pillar structure. In an example, the backside electrode pillar structure is spatially configured at a distance of about 0.1 um to about 100 um to the backside electrode perimeter. In an example, forming the backside pillar structure comprises forming a backside dielectric pillar structure and a backside metal pillar structure; wherein the backside dielectric pillar structure is formed adjacent to the backside metal electrode and the backside metal pillar structure is formed adjacent to the backside dielectric pillar structure. In an example, the backside dielectric pillar structure comprises one or more underlapping portions underlying one or more portions of the backside electrode surface region. In an example, the backside metal pillar structure comprises one or more underlapping portions underlying one or more portions of the backside dielectric pillar structure.

In an example, the method further includes forming one or more topside dielectric pillars overlying a portion of the backside pillar structure and one or more portions of the top piezoelectric surface region; and forming one or more topside metal pillars overlying a portion of the backside pillar structure and one or more portions of the top piezoelectric surface region; wherein the one or more topside dielectric pillars are formed adjacent to the topside metal electrode and the one or more topside metal pillars are formed adjacent to the one or more topside dielectric pillars. In an example, at least one topside dielectric pillar comprises an overlapping portion overlying a portion of the topside metal electrode. In an example, at least one topside metal pillar comprises an overlapping portion overlying at least one topside dielectric pillar. In an example, forming the backside pillar structure comprises forming a backside dielectric pillar structure and a backside metal pillar structure; wherein the backside dielectric pillar structure is formed adjacent to the backside metal electrode and the backside metal pillar structure is formed underlying the backside dielectric pillar structure. In an example, the backside dielectric pillar structure comprises one or more underlapping portions underlying one or more portions of the backside electrode surface region.

In an example, the method further includes removing a portion of the single crystal piezoelectric layer to form a backside piezo cavity; wherein forming the backside metal electrode comprises forming the backside metal electrode such that at least a portion of the backside metal electrode is spatially configured within the backside piezo cavity. In an example, forming the backside pillar structure comprises forming the backside pillar structure within the backside piezo cavity. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the single crystal piezoelectric layer having a top piezoelectric surface region and a bottom piezoelectric surface region; forming topside metal electrode overlying a portion of the top piezoelectric surface region, the topside metal electrode having a topside electrode surface region, a topside electrode perimeter, and one or more topside electrode edges; forming a topside pillar structure overlying a portion of the top piezoelectric surface region within a vicinity of the topside metal electrode and outside of the topside metal electrode perimeter; forming a topside electrode pillar structure overlying a portion of the topside electrode surface region and within the topside metal electrode perimeter; forming a topside micro-trench within a portion of the single crystal piezoelectric layer; forming a topside metal having a topside metal plug within the topside micro-trench; forming a backside trench within the substrate exposing the bottom piezoelectric surface region and forming a substrate sidewall, the backside trench underlying the topside metal electrode and the topside micro-trench; forming a backside metal electrode underlying or in proximity of the bottom piezoelectric surface region within the backside trench, the backside metal electrode being electrically coupled to the topside metal, the backside metal electrode having a backside electrode surface region, a backside electrode perimeter, and one or more backside electrode edges; forming a backside pillar structure underlying a portion of the bottom piezoelectric surface region within a vicinity of the backside metal electrode and outside of the backside metal electrode perimeter; forming a backside electrode pillar structure underlying a portion of the backside electrode surface region and within the backside metal electrode perimeter; forming at least two metal pads for electrical connections, wherein at least one metal pad is electrically coupled to the topside metal electrode, and at least one metal pad is electrically coupled to the backside metal electrode; and forming a backside metal plug underlying the bottom piezoelectric surface region within the backside trench, the backside metal plug being electrically coupled to the topside metal plug and the backside metal electrode, wherein the topside micro-trench, the topside metal plug, and the backside metal plug form a micro-via. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the piezoelectric layer having a top piezoelectric surface region and a bottom piezoelectric surface region; forming a topside energy confinement structure overlying the top piezoelectric surface region, the topside energy confinement structure being characterized by a topside structure geometric area and a topside structure perimeter, the topside energy confinement structure having at least one portion removed forming a topside structure break region; forming a topside metal electrode overlying the top piezoelectric surface region and within the topside energy confinement structure, the topside metal electrode being characterized by a topside electrode geometric area; and forming a backside trench within the substrate exposing the bottom piezoelectric surface region, the backside trench underlying the topside metal electrode, the backside trench being characterized by a cavity geometric area.

In an example, wherein the topside metal electrode is formed adjacent to the topside energy confinement structure. In an example, forming a topside sandbar structure overlying the top piezoelectric surface region within a vicinity of the topside structure break region; wherein the topside sandbar structure is spatially configured outside the topside structure perimeter of the topside energy confinement structure. In an example, the topside sandbar structure is spatially configured with a gap having a distance of about 0.1 um to about 100 um to the topside metal electrode. In an example, the topside energy confinement structure comprises a dielectric material, a metal material, or a combination of dielectric and metal materials. In an example, the topside energy confinement structure comprises a castellation pattern characterized by a repeated castellation shape, wherein the castellation shape includes a square, a triangle, a polygonal shape, or a non-polygonal shape. In an example, the topside sandbar structure comprises a dielectric material, a metal material, or a combination of dielectric and metal materials. In an example, the topside sandbar structure comprises a straight sandbar structure, a curved sandbar structure, or an angled sandbar structure. In an example, each of the topside electrode geometric area, the topside structure geometric area, and the cavity geometric area includes a circle, an ellipses, skew non-polygonal shapes, irregular shapes, or a polygonal shape having n sides, where n is greater than or equal to three; wherein the topside electrode geometric area, the topside structure geometric area, and the cavity geometric area can be characterized by geometric areas having similar or dissimilar shapes. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the piezoelectric layer having a top piezoelectric surface region and a bottom piezoelectric surface region; forming a backside trench within the substrate exposing the bottom piezoelectric surface region, the backside trench being characterized by a cavity geometric area; forming a backside energy confinement structure underlying the bottom piezoelectric surface region, the backside energy confinement structure being characterized by a backside structure geometric area and a backside structure perimeter, the backside energy confinement structure having at least one portion removed forming a backside structure break region; and forming a backside metal electrode underlying the bottom piezoelectric surface region and within the backside energy confinement structure, the backside metal electrode being characterized by a backside electrode geometric area.

In an example, wherein the backside metal electrode is formed adjacent to the backside energy confinement structure. In an example, the method further includes forming a backside sandbar structure underlying the bottom piezoelectric surface region within a vicinity of the backside structure break region; wherein the backside sandbar structure is spatially configured outside the backside structure perimeter of the backside energy confinement structure. In an example, the backside sandbar structure is spatially configured with a gap having a distance of about 0.1 um to about 100 um to the backside metal electrode. In an example, the backside energy confinement structure comprises a dielectric material, a metal material, or a combination of dielectric and metal materials. In an example, the backside energy confinement structure comprises a castellation pattern characterized by a repeated castellation shape, wherein the castellation shape includes a square, a triangle, a polygonal shape, or a non-polygonal shape. In an example, the backside sandbar structure comprises a dielectric material, a metal material, or a combination of dielectric and metal materials. In an example, the backside sandbar structure comprises a straight sandbar structure, a curved sandbar structure, or an angled sandbar structure. In an example, each of the backside electrode geometric area, the backside structure geometric area, and the cavity geometric area includes a circle, an ellipses, skew non-polygonal shapes, irregular shapes, or a polygonal shape having n sides, where n is greater than or equal to three; wherein the backside electrode geometric area, the backside perimeter structure geometric area, and the cavity geometric area can be characterized by geometric areas having similar or dissimilar shapes. According to an example, the present invention can provide the device structure resulting from the method described previously.

According to an example, the present invention provides a structure and a method of fabricating an acoustic resonator or filter device. The method can include providing a substrate having a substrate surface region; forming a single crystal piezoelectric layer overlying the substrate surface region, the piezoelectric layer having a top piezoelectric surface region and a bottom piezoelectric surface region; forming a topside energy confinement structure overlying the top piezoelectric surface region, the topside energy confinement structure being characterized by a topside structure geometric area and a topside structure perimeter, the topside energy confinement structure having at least one portion removed forming a topside structure break region; forming a topside metal electrode overlying the top piezoelectric surface region and within the topside energy confinement structure, the topside metal electrode being characterized by a topside electrode geometric area; forming a topside sandbar structure overlying the top piezoelectric surface region within a vicinity of the topside structure break region; forming a backside trench within the substrate exposing the bottom piezoelectric surface region, the backside trench underlying the topside metal electrode and the topside micro-trench, the backside trench being characterized by a cavity geometric area; forming a backside energy confinement structure underlying the bottom piezoelectric surface region, the backside energy confinement structure being characterized by a backside structure geometric area, the backside energy confinement structure having at least one portion removed forming a backside structure break region; forming a backside metal electrode underlying the bottom piezoelectric surface region and within the backside energy confinement structure, the backside metal electrode being characterized by a backside electrode geometric area; and forming a backside sandbar structure underlying the bottom piezoelectric surface region within a vicinity of the backside structure break region. According to an example, the present invention can provide the device structure resulting from the method described previously.

According to an example, the present invention can provide a method for fabricating a single crystal III-Nitride based, surface acoustic wave resonator or filter device through lithographically placing interdigitated features on the top or bottom surface of the single crystal material. This acoustic resonator or filter device can be combined with any of the features described previously. According to an example, the present invention can provide the device structure resulting from the method described previously.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like. Therefore, the above description and illustrations should not be taken as limiting the scope of the present invention which is defined by the appended claims.

What is claimed is:

1. A method for fabricating an acoustic resonator device, the method comprising:
   providing a substrate having a substrate surface region and a substrate backside cavity region characterized by a cavity geometric area;
   forming a piezoelectric layer overlying the substrate surface region, the piezoelectric layer having a top piezoelectric surface region and a bottom piezoelectric surface region;
   forming a topside energy confinement structure overlying the top piezoelectric surface region, the topside energy confinement structure being characterized by a topside structure geometric area and a topside structure perimeter, the topside energy confinement structure having at least one portion removed forming a topside structure break region;
   forming a topside metal electrode overlying the top piezoelectric surface region and within the topside energy confinement structure, the topside metal electrode being characterized by a topside electrode geometric area; and
   forming a topside sandbar structure overlying the top piezoelectric surface region within a vicinity of the topside structure break region; wherein the topside sandbar structure is spatially configured outside the topside structure perimeter of the topside energy confinement structure.

2. The method of claim 1 wherein the piezoelectric layer comprises an essentially single crystal material or a polycrystalline material.

3. The method of claim 1 wherein the topside metal electrode is formed adjacent to the topside energy confinement structure.

4. A method for fabricating an acoustic resonator device, the method comprising:
   providing a substrate having a substrate surface region and a substrate backside cavity region characterized by a cavity geometric area;

forming a piezoelectric layer overlying the substrate surface region, the piezoelectric layer having a top piezoelectric surface region and a bottom piezoelectric surface region;

forming a topside energy confinement structure overlying the top piezoelectric surface region, the topside energy confinement structure being characterized by a topside structure geometric area and a topside structure perimeter, the topside energy confinement structure having at least one portion removed forming a topside structure break region;

forming a topside metal electrode overlying the top piezoelectric surface region and within the topside energy confinement structure, the topside metal electrode being characterized by a topside electrode geometric area; and forming a topside sandbar structure overlying the top piezoelectric surface region and spatially configured outside the topside structure perimeter of the topside energy confinement structure;

wherein the topside sandbar structure is spatially configured with a gap having a distance of about 0.1 um to about 100 um to the topside metal electrode.

5. The method of claim 4 wherein the piezoelectric layer comprises an essentially single crystal material or a polycrystalline material.

6. A method for fabricating an acoustic resonator device, the method comprising:
providing a substrate having a substrate surface region and a substrate backside cavity region characterized by a cavity geometric area;

forming a piezoelectric layer overlying the substrate surface region, the piezoelectric layer having a top piezoelectric surface region and a bottom piezoelectric surface region;

forming a topside energy confinement structure overlying the top piezoelectric surface region, the topside energy confinement structure being characterized by a topside structure geometric area and a topside structure perimeter, the topside energy confinement structure having at least one portion removed forming a topside structure break region;

forming a topside metal electrode overlying the top piezoelectric surface region and within the topside energy confinement structure, the topside metal electrode being characterized by a topside electrode geometric area; and wherein the topside energy confinement structure comprises a dielectric material, a metal material, or a combination of dielectric and metal materials.

7. The method of claim 6 wherein the piezoelectric layer comprises an essentially single crystal material or a polycrystalline material.

8. The method of claim 6 wherein the topside energy confinement structure comprises a castellation pattern characterized by a repeated castellation shape, wherein the castellation shape includes a square, a triangle, a polygonal shape, or a non-polygonal shape.

9. The method of claim 6 further comprising forming a topside sandbar structure overlying the top piezoelectric surface region and spatially configured outside the topside structure perimeter of the topside energy confinement structure.

10. The method of claim 9 wherein the topside sandbar structure comprises a straight sandbar structure, a curved sandbar structure, or an angled sandbar structure.

11. The method of claim 6 wherein each of the topside electrode geometric area, the topside structure geometric area, and the cavity geometric area includes a circle, an ellipses, skew non-polygonal shapes, irregular shapes, or a polygonal shape having n sides, where n is greater than or equal to three; wherein the topside electrode geometric area, the topside structure geometric area, and the cavity geometric area can be characterized by geometric areas having similar or dissimilar shapes.

* * * * *